US012813134B2

(12) United States Patent
Park

(10) Patent No.: US 12,813,134 B2
(45) Date of Patent: Nov. 24, 2026

(54) DISPLAY PANEL HAVING HEATING ELECTRODE AND METHOD OF MANUFACTURING DISPLAY PANEL HAVING HEATING ELECTRODE

(71) Applicant: SAMSUNG DISPLAY CO., LTD., Yongin-si (KR)

(72) Inventor: Junhyeong Park, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 561 days.

(21) Appl. No.: 18/197,417

(22) Filed: May 15, 2023

(65) Prior Publication Data

US 2023/0371345 A1 Nov. 16, 2023

(30) Foreign Application Priority Data

May 16, 2022 (KR) ........................ 10-2022-0059833
Jul. 25, 2022 (KR) ........................ 10-2022-0092059

(51) Int. Cl.
*H10K 59/80* (2023.01)
*H10K 71/00* (2023.01)

(52) U.S. Cl.
CPC ........... *H10K 59/873* (2023.02); *H10K 71/00* (2023.02)

(58) Field of Classification Search
CPC .. H10K 59/873; H10K 71/00; H10K 59/8794; H10K 59/1201; H10N 70/8613; H10N 70/066; H10N 70/231; H10N 70/826; H10N 70/841; H10N 70/8828
See application file for complete search history.

(56) References Cited

U.S. PATENT DOCUMENTS 6,271,084 B1 * 8/2001 Tu .......................... H10D 1/692 257/E21.59
8,187,946 B2 * 5/2012 Karpov ................ H10N 70/231 257/3
8,305,800 B2 * 11/2012 Tu ........................ H10N 70/826 257/3
8,962,384 B2 * 2/2015 Redaelli ............... H10N 70/231 438/102
9,349,784 B2 5/2016 Lee et al.
(Continued)

FOREIGN PATENT DOCUMENTS

KR 1020160017327 A 2/2016
KR 1020160030596 A 3/2016
(Continued)

*Primary Examiner* — Caleb E Henry
(74) *Attorney, Agent, or Firm* — CANTOR COLBURN LLP

(57) ABSTRACT

A display panel includes a substrate including a corner area including a central area and an extended corner area extending in a direction away from the central area, an inorganic insulating layer disposed on the substrate, an insulating layer disposed on the inorganic insulating layer, where a first groove exposing a portion of the inorganic insulating layer is defined in the insulating layer along a perimeter of the extended corner area, an intermediate layer disposed over the insulating layer, an encapsulation layer disposed on the intermediate layer and including an inorganic encapsulation layer, and a heating electrode overlapping the first groove and arranged along the perimeter of the extended corner area in a plan view.

18 Claims, 38 Drawing Sheets

(56) References Cited

U.S. PATENT DOCUMENTS 9,548,266 B2 * 1/2017 Ajuria ................. H01L 23/3114
9,659,998 B1 * 5/2017 Lung .................... H10N 70/021
9,799,710 B2 10/2017 Lee et al.
9,899,372 B1 * 2/2018 Bi ....................... H01L 21/3086
9,905,630 B2 * 2/2018 Lee ...................... H10K 59/131
10,395,984 B2 * 8/2019 Backes ............. H01L 21/76846
10,505,111 B1 * 12/2019 Ok ...................... H01L 21/7682
10,510,951 B1 * 12/2019 Yu ........................ H10N 70/801
11,387,288 B2 7/2022 Lee et al.
2007/0215852 A1 * 9/2007 Lung .................. H10N 70/8413 257/4
2007/0232015 A1 * 10/2007 Liu ...................... H10N 70/011 257/E21.589
2008/0061282 A1 * 3/2008 Sato ..................... H10N 70/011 438/102
2008/0116437 A1 * 5/2008 Oh ..................... H10N 70/8828 257/E47.001
2008/0197335 A1 * 8/2008 Yu ...................... H10N 70/8265 438/102
2008/0280390 A1 * 11/2008 Kim ....................... H10B 63/30 438/95
2008/0303014 A1 * 12/2008 Goux ................... H10N 70/043 438/102
2011/0155993 A1 * 6/2011 Chen .................. H10N 70/8828 438/102
2012/0119177 A1 * 5/2012 Erbetta .............. H10N 70/8828 257/E21.52
2012/0305872 A1 * 12/2012 Yoon .................... H10N 70/231 257/532
2014/0138604 A1 * 5/2014 Liu ...................... H10N 70/826 257/4
2017/0062714 A1 * 3/2017 Kau ................... H10N 70/8616
2019/0189688 A1 * 6/2019 Lille .................... H10N 70/826
2020/0067017 A1 * 2/2020 Seo ........................ H10K 77/10
2020/0152870 A1 * 5/2020 Lin ...................... H10N 70/826
2020/0161582 A1 * 5/2020 Choi .................... H10K 59/121
2020/0194670 A1 * 6/2020 Allegra ................ H10N 70/841
2020/0219933 A1 * 7/2020 Cheng .................. H10N 70/841
2020/0312933 A1 * 10/2020 Lee .................... H10K 59/1201
2021/0066650 A1 * 3/2021 Yu ........................ H10K 50/844
2021/0098532 A1 * 4/2021 Wu ...................... H10N 70/826
2021/0384465 A1 12/2021 Park et al.
2022/0045301 A1 * 2/2022 Jang ..................... H10K 59/122
2022/0216276 A1 * 7/2022 Lee ...................... H10K 50/844
2023/0006174 A1 * 1/2023 Park ...................... G06F 3/0412

FOREIGN PATENT DOCUMENTS

KR 1020210046114 A 4/2021
KR 1020210151634 A 12/2021

* cited by examiner

DISPLAY PANEL HAVING HEATING ELECTRODE AND METHOD OF MANUFACTURING DISPLAY PANEL HAVING HEATING ELECTRODE

This application claims priority to Korean Patent Application No. 10-2022-0059833, filed on May 16, 2022, and Korean Patent Application No. 10-2022-0092059, filed on Jul. 25, 2022, and all the benefits accruing therefrom, the contents of which in their entireties are herein incorporated by reference.

BACKGROUND

1. Field

The disclosure relates to a display panel and a method of manufacturing a display panel.

2. Description of the Related Art

Recently, electronic devices are widely used. Electronic devices are used in various ways, for example as mobile electronic devices and stationary electronic devices. Electronic devices include display apparatuses capable of providing users with visual information, such as images or videos, to support various functions.

Recently, as other components for driving a display apparatus are miniaturized, the proportion of the display apparatus in electronic devices is gradually increasing, and a structure that is bent to have a certain angle in a flat state or folded with respect to an axis is being developed.

SUMMARY

One or more embodiments include a display panel having improved reliability by minimizing penetration of oxygen or moisture from an outside, and a method of manufacturing a display panel.

According to one or more embodiments, a display panel includes a substrate including a corner area including a central area and an extended corner area extending in a direction away from the central area, an inorganic insulating layer disposed on the substrate, an insulating layer disposed on the inorganic insulating layer, where a first groove exposing a portion of the inorganic insulating layer is defined in the insulating layer along a perimeter of the extended corner area, an intermediate layer disposed over the insulating layer, an encapsulation layer disposed on the intermediate layer and including an inorganic encapsulation layer, and a heating electrode overlapping the first groove and arranged along the perimeter of the extended corner area in a plan view.

In an embodiment, the inorganic insulating layer may include an interlayer insulating layer covering the heating electrode, and an upper surface of the interlayer insulating layer may be exposed by the first groove and may be in direct contact with the at least one inorganic encapsulation layer.

In an embodiment, the insulating layer may include a first insulating layer and a second insulating layer disposed over the first insulating layer, the first groove may be defined by a first opening defined in the first insulating layer and exposing the portion of the inorganic insulating layer and a second opening defined in the second insulating layer and exposing a portion of the first insulating layer, and a width of the first opening may be smaller than a width of the second opening.

In an embodiment, a width of the heating electrode may be greater than or equal to the width of the first opening and smaller than the width of the second opening.

In an embodiment, the intermediate layer may be arranged to be in direct contact with an upper portion of the first insulating layer exposed by the second opening in the first groove.

In an embodiment, the intermediate layer, a low-adhesion layer, a capping layer, and the encapsulation layer may be sequentially disposed to be in contact with each other on an upper portion of the first insulating layer exposed by the second opening in the first groove.

In an embodiment, the display panel may further include an upper electrode of a storage capacitor, where the upper electrode may be covered by the interlayer insulating layer, and the upper electrode and the heating electrode may be disposed in a same layer as each other.

In an embodiment, the upper electrode and the heating electrode may include a same material as each other.

In an embodiment, the inorganic insulating layer may further include an upper gate insulating layer on which the heating electrode is disposed, and a thermal conductivity of the interlayer insulating layer may be greater than a thermal conductivity of the upper gate insulating layer.

In an embodiment, the heating electrode may be disposed on the portion of the inorganic insulating layer exposed by the first groove.

In an embodiment, the heating electrode may be in direct contact with the inorganic encapsulation layer in the first groove.

In an embodiment, the display panel may further include a pixel electrode arranged between the intermediate layer and the insulating layer, and the heating electrode and the pixel electrode may include a same material as each other.

In an embodiment, the display panel may further include a first semiconductor layer disposed on the substrate, a second semiconductor layer disposed above the first semiconductor layer, and a gate electrode arranged to overlap the second semiconductor layer, and the inorganic insulating layer may include an upper interlayer insulating layer covering the gate electrode and the heating electrode.

In an embodiment, an upper surface of the upper interlayer insulating layer may be exposed by the first groove and may be in direct contact with the at least one inorganic encapsulation layer.

In an embodiment, the first semiconductor layer may include a silicon semiconductor, and the second semiconductor layer may include an oxide semiconductor.

In an embodiment, the gate electrode and the heating electrode may be disposed in a same layer as each other.

In an embodiment, the gate electrode and the heating electrode may include a same material as each other.

In an embodiment, the inorganic insulating layer may further include a middle insulating layer on which the heating electrode is disposed, and a thermal conductivity of the upper interlayer insulating layer may be greater than a thermal conductivity of the middle insulating layer.

According to one or more embodiments, a method of manufacturing a display panel includes preparing a substrate including a corner area including a central area and an extended corner area extending in a direction away from the central area, providing a heating electrode on the substrate along a perimeter of the extended corner area, providing an insulating layer to cover the heating electrode and forming a first groove in the insulating layer along the perimeter of the extended corner area to overlap the heating electrode in a plan view, providing an intermediate layer to cover the first groove and the insulating layer, and removing a portion of the intermediate layer overlapping the heating electrode in the first groove by generation of heat by the heating electrode.

In an embodiment, the method may further include providing a low-adhesion layer on the first groove and removing a portion of the low-adhesion layer overlapping the heating electrode in the first groove by generation of heat by the heating electrode.

In an embodiment, the method may further include providing a capping layer on the low-adhesion layer in the first groove and removing a portion of the capping layer overlapping the heating electrode in the first groove by generation of heat by the heating electrode.

In an embodiment, the method may further include providing an upper electrode of a storage capacitor over the substrate, where the heating electrode and the upper electrode may be formed in a same process.

In an embodiment, the heating electrode and the upper electrode may include a same material as each other.

In an embodiment, the method may further include providing an inorganic insulating layer to cover the heating electrode and the upper electrode and providing an encapsulation layer to cover the intermediate layer, where the inorganic insulating layer may be exposed by the first groove, and the inorganic insulating layer may be in direct contact with the encapsulation layer in the first groove.

In an embodiment, the method may further include providing a pixel electrode over the insulating layer, where the heating electrode and the pixel electrode are formed in a same process.

In an embodiment, the heating electrode and the pixel electrode may include a same material as each other.

In an embodiment, the providing the heating electrode may further include providing the heating electrode on a portion of an inorganic insulating layer exposed by the first groove, the method may further include providing an encapsulation layer to cover the intermediate layer, and the heating electrode may be in direct contact with the encapsulation layer in the first groove.

In an embodiment, the method may further include providing a first semiconductor layer between the substrate and the insulating layer and a second semiconductor layer above the first semiconductor layer and providing a gate electrode between the second semiconductor layer and the insulating layer to overlap the second semiconductor layer, wherein the heating electrode and the gate electrode may be formed in a same process.

In an embodiment, the heating electrode and the gate electrode may include a same material as each other.

In an embodiment, the first semiconductor layer may include a silicon semiconductor, and the second semiconductor layer may include an oxide semiconductor.

Features of embodiments other than those described above will become apparent from the following drawings, claims, and detailed descriptions to embody the disclosure below.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
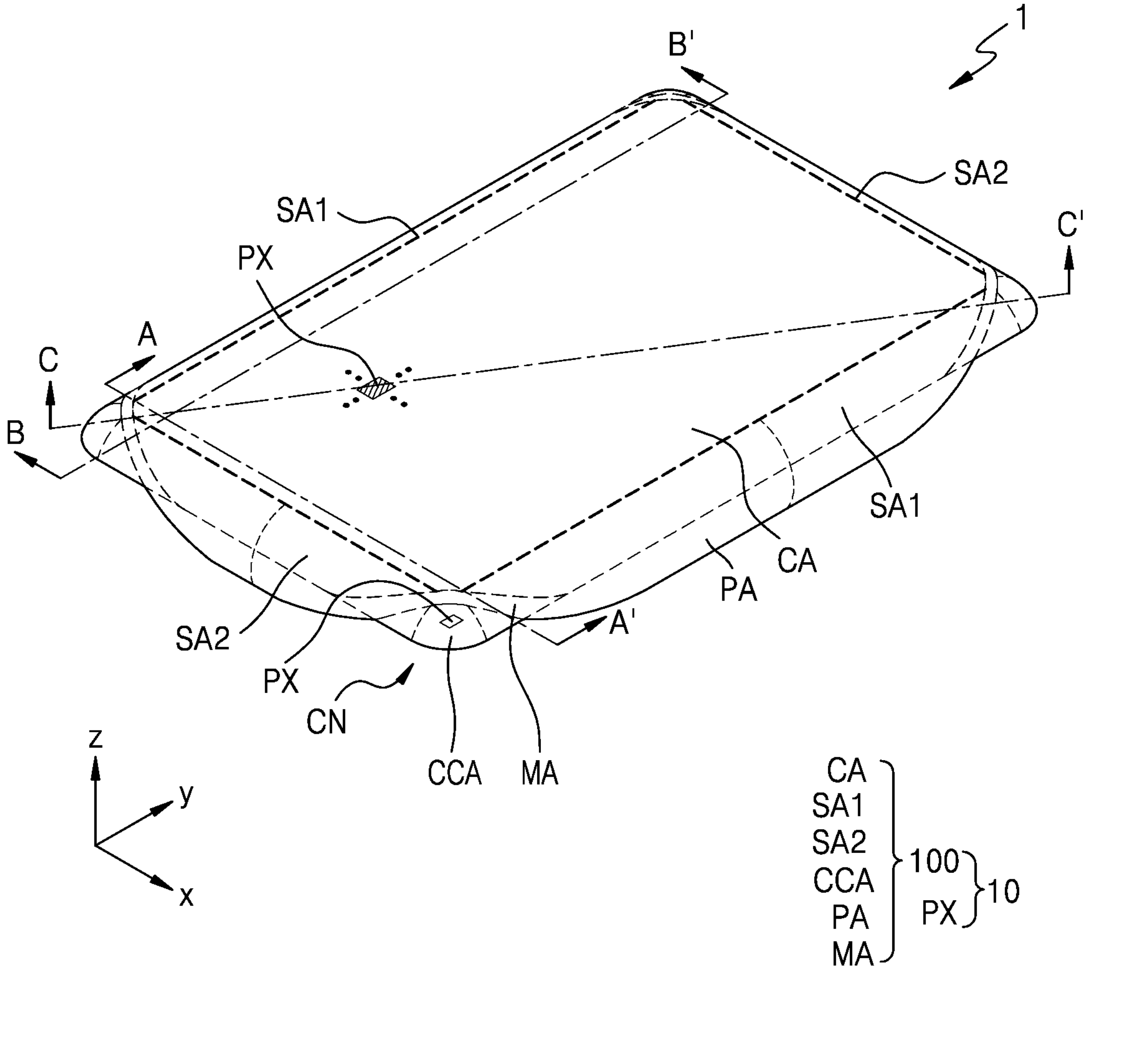
FIG. 1 is a schematic perspective view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Various modifications may be applied to the present embodiments, and particular embodiments of the disclosure will be illustrated in the drawings and described in the detailed description section. The effect and features of the present embodiments, and a method to achieve the same, will be clearer referring to the detailed descriptions below with the drawings. However, the disclosure may be implemented in various forms, not by being limited to the embodiments presented below.

In the following embodiment, it will be understood that although the terms "first," "second," etc. may be used herein to describe various components, these components should not be limited by these terms. These terms are only used to distinguish one component from another.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or variations thereof. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the following embodiment, it will be understood that when a layer, region, or component is referred to as being "on" another layer, region, or component, it can be directly or indirectly on the other layer, region, or component. That is, for example, intervening layers, regions, or components may be present. In contrast, when an element is referred to as being "directly on" another element, there are no intervening elements present.

Sizes of components in the drawings may be exaggerated or reduced for convenience of explanation. In other words, since sizes and thicknesses of components in the drawings are arbitrarily illustrated for convenience of explanation, the following embodiments are not limited thereto.

In the following embodiment, the x-axis, the y-axis, and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

In the present specification, a display apparatus may be used as display screens of various products such as televisions, laptops, monitors, billboards, or Internet of Things (IoTs) as well as portable electronic devices such as mobile phones, smart phones, tablet personal computers (tablet PCs), mobile communication terminals, electronic notebooks, e-books, portable multimedia players (PMPs), navigation devices, or ultra-mobile PCs (UMPCs). In addition, a display apparatus according to an embodiment may be used in wearable devices, such as smart watches, watch phones, glasses-type displays, head mounted displays (HMDs), and the like. Furthermore, a display apparatus according to an embodiment may be used as a display for an instrument panel for vehicles, a center information display (CID) arranged on the center fascia or dashboard of vehicles, a room mirror display in lieu of a side-view mirror of vehicles, or a display arranged at the rear side of a front seat as an entertainment for a rear seat of vehicles.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Sizes of components in the drawings may be exaggerated or reduced for convenience of explanation. In other words, since sizes and thicknesses of components in the drawings are arbitrarily illustrated for convenience of explanation, the following embodiments are not limited thereto.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings, and in the description with reference to the drawings, the same or corresponding components are indicated by the same reference numerals and any repetitive detailed descriptions thereof may be omitted.

Figure 2A:
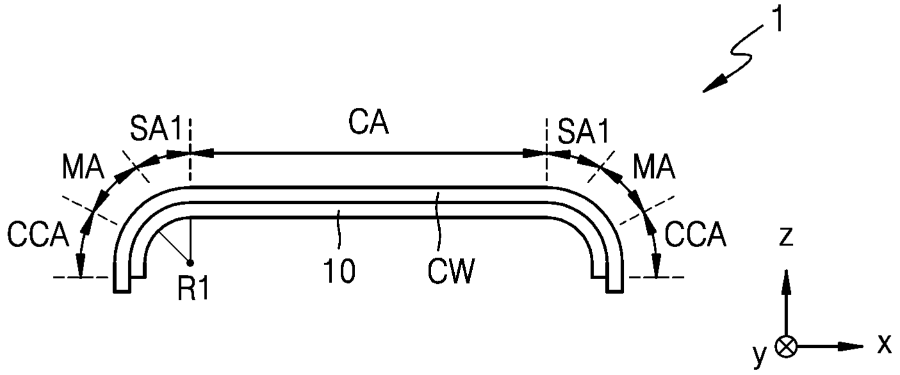
FIG. 2A is a cross-sectional view of the display apparatus of FIG. 1 taken along line A-A' of FIG. 1.
Figure 2B:
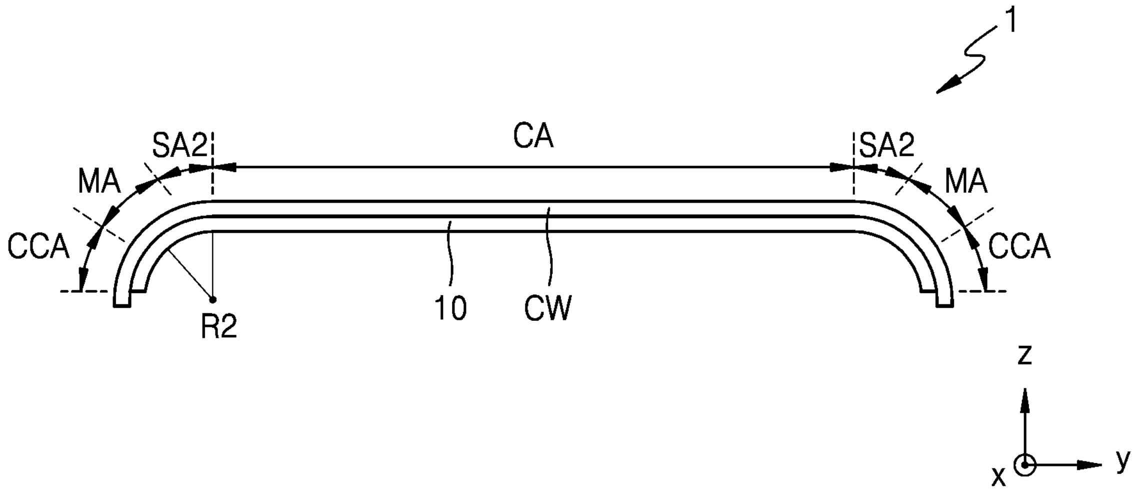
FIG. 2B is a cross-sectional view of the display apparatus of FIG. 1 taken along line B-B' of FIG. 1.
Figure 2C:
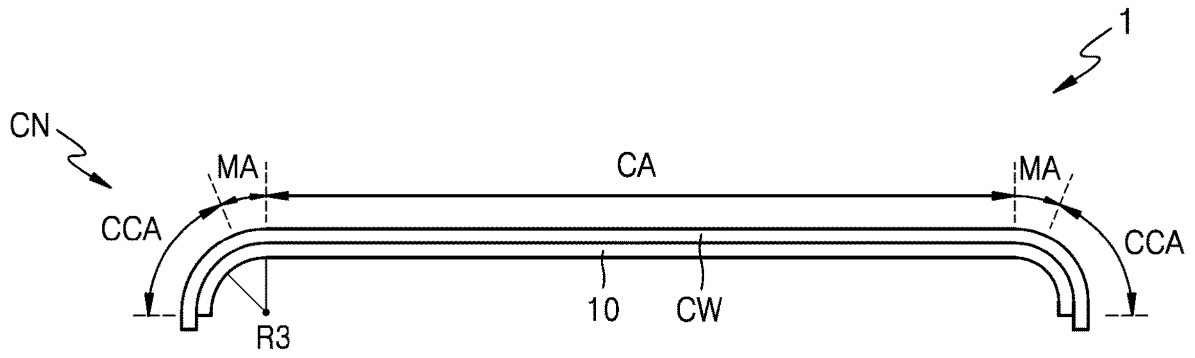
FIG. 2C is a cross-sectional view of the display apparatus of FIG. 1 taken along line C-C' of FIG. 1.

FIG. 1 is a schematic cross-sectional view of a display apparatus 1 according to an embodiment, FIG. 2A is a cross-sectional view of the display apparatus 1 of FIG. 1 taken along line A-A' of FIG. 1, FIG. 2B is a cross-sectional view of the display apparatus 1 of FIG. 1 taken along line B-B' of FIG. 1, and FIG. 2C is a cross-sectional view of the display apparatus 1 of FIG. 1 taken along line C-C' of FIG. 1.

Referring to FIGS. 1 and 2A to 2C, the display apparatus 1 may display an image. The display apparatus 1 may have an edge in a first direction and an edge in a second direction. Here, the first direction and the second direction may intersect each other. In an embodiment, for example, the first direction and the second direction may form an acute angle. In an alternative embodiment, for example, the first direction and the second direction may form an obtuse angle or may be perpendicular to each other. Hereinafter, a case where the first direction and the second direction are perpendicular to each other is described in detail. For example, the first direction may be an x direction or a −x direction, and the second direction may be a y direction or a −y direction.

In an embodiment, a corner CN where the edge in the first direction (for example, an x direction or −x direction in FIG. 1) and the edge in the second direction (for example, a y direction or −y direction in FIG. 1) meet may have a certain curvature.

The display apparatus 1 may include a cover window CW and a display panel 10. The cover window CW may protect the display panel 10. In an embodiment, the cover window CW may be disposed on the display panel 10. In an embodiment, the cover window CW may be a flexible window. The cover window CW may be easily bent according to an external force without occurrence of cracks and the like to protect the display panel 10. The cover window CW may include glass, sapphire, or plastic. The cover window CW may be, for example, ultra-thin glass or colorless polyimide (CPI). In an embodiment, the cover window CW may have a structure in which a flexible polymer layer is disposed on one surface of a glass substrate, or may include only a polymer layer.

The display panel 10 may be disposed under the cover window CW. Although not shown, the display panel 10 may be attached to the cover window CW by a transparent adhesive member such as an optically clear adhesive (OCA) film.

The display panel 10 may display an image. The display panel 10 may include a substrate 100 and a pixel PX. The substrate 100 may include a central area CA, a first side area SA1, a second side area SA2, a corner area CNA, a middle area MA, and a peripheral area PA. In an embodiment, a shape of the substrate 100 may define a shape of the display apparatus 1.

The central area CA may be flat. In an embodiment, the display apparatus 1 may provide most of the image in the central area CA.

The first side area SA1 may be adjacent to the central area CA in the first direction (for example, the x direction or −x direction in FIG. 1) and may be bent. The first side area SA1 may be defined as an area bent from the central area CA in a cross-section (for example, an xz cross-section) in the first direction (for example, the x direction or the −x direction). The first side area SA1 may extend in the second direction (for example, the y direction or the −y direction). In other words, the first side area SA1 may not be bent in a cross-section (for example, an yz cross-section) in the second direction (for example, the y direction or the −y direction). The first side area SA1 may extend from the central area CA in the first direction (for example, the x direction or the −x direction). FIG. 2A illustrates an embodiment where the first side area SA1 extending from the central area CA in the x direction and bent and the first side area SA1 extending from the central area CA in the −x direction and bent have a same curvature as each other, but in some embodiments, the first side area SA1 extending from the central area CA in the x direction and bent and the first side area SA1 extending from the central area CA in the −x direction and bent may have different curvatures.

The second side area SA2 may be adjacent to the central area CA in the second direction (for example, the y direction or the −y direction) and may be bent. The second side area SA2 may be defined as an area bent from the central area CA in a cross-section (for example, the yz cross-section) in the second direction (for example, the y direction or the −y direction). The second side area SA2 may extend in the first direction (for example, the x direction or the −x direction). The second side area SA2 may not be bent in a cross-section (for example, the xz cross-section) perpendicular to the first direction (for example, the x direction or the −x direction). FIG. 2B illustrates an embodiment where the second side area SA2 extending from the central area CA in the y direction and bent and the second side area SA2 extending from the central area CA in the −y direction and bent have a same curvature as each other, but in some embodiments, the second side area SA2 extending from the central area CA in the y direction and bent and the second side area SA2 extending from the central area CA in the −y direction and bent may have different curvatures.

The corner area CNA may be arranged at the corner CN. In an embodiment, the corner area CNA may be an area where the edge of the display apparatus 1 in the first direction (for example, the x direction or the −x direction) and the edge thereof in the second direction (for example, the y direction or the −y direction) meet each other. In an embodiment, the corner area CNA may at least partially surround the central area CA, the first side area SA1, and the second side area SA2. Alternatively, the corner area CNA may at least partially surround the central area CA, the first side area SA1, the second side area SA2, and the middle area MA. In an embodiment where the first side area SA1 extends in the first direction (for example, the x direction or the −x direction) and is bent, and the second side area SA2 extends in the second direction (for example, the y direction or the −y direction) and is bent, at least a portion of the corner area CNA may extend in the first direction (for example, the x direction or the −x direction) and is bent, and at the same time, may extend in the second direction (for example, the y direction or the −y direction) and is bent. In such an embodiment, at least a portion of the corner area CNA may be a double-curved area in which a plurality of curvatures in a plurality of directions overlap. In an embodiment, the corner area CNA may include a plurality of corner areas CNA.

The middle area MA may be arranged between the central area CA and the corner area CNA. In an embodiment, the middle area MA may extend between the first side area SA1 and the corner area CNA. In an embodiment, the middle area MA may extend between the second side area SA2 and the corner area CNA. In an embodiment, the middle area MA may be bent. A driving circuit for providing an electrical signal to the pixel PX and/or a power line for providing power to the pixel PX may be arranged in the middle area MA. In such an embodiment, the pixel PX arranged in the middle area MA may overlap the driving circuit and/or the power line. In some embodiments, the driving circuit and/or the power line arranged in the middle area MA may be omitted.

The peripheral area PA may be arranged outside the central area CA. In an embodiment, the peripheral area PA may be arranged outside the first side area SA1. The peripheral area PA may extend from the first side area SA1. In an embodiment, the peripheral area PA may be arranged outside the second side area SA2. The peripheral area PA may extend from the second side area SA2. The pixel PX may not be arranged in the peripheral area PA. Therefore, the peripheral area PA may be a non-display area in which an image is not displayed. A driving circuit for providing an electrical signal to the pixel PX and/or a power line for providing power to the pixel PX may be arranged in the peripheral area PA.

Referring to FIG. 2A, a portion of each of the first side area SA1, the middle area MA, and the corner area CNA may be bent while having a first curvature radius R1. Referring to FIG. 2B, another portion of each of the second side area SA2, the middle area MA, and the corner area CNA may be bent while having a second curvature radius R2. Referring to FIG. 2C, another portion of each of the middle area MA and the corner area CNA may be bent while having a third curvature radius R3.

The pixel PX may be disposed on the substrate 100. In an embodiment, the pixel PX may include a plurality of pixels PX, and the plurality of pixels PX may emit light to display an image. In an embodiment, each of the plurality of pixels PX may include a red sub-pixel, a green sub-pixel, and a blue sub-pixel. Alternatively, each of the plurality of pixels PX may include a red sub-pixel, a green sub-pixel, a blue sub-pixel, and a white sub-pixel.

The pixel PX may be arranged in at least one of the central area CA, the first side area SA1, the second side area SA2, and the corner area CNA. In an embodiment, the plurality of pixels PX may be arranged in the central area CA, the first side area SA1, the second side area SA2, the corner area CNA, and the middle area MA. In such an embodiment, the display apparatus 1 may display an image in the central area CA, the first side area SA1, the second side area SA2, the corner area CNA, and the middle area MA. In an embodiment, the plurality of pixels PX arranged in the central area CA, the first side area SA1, the second side area SA2, the corner area CNA, and the middle area MA may each provide an independent image. In an alternative embodiment, the plurality of pixels PX arranged in the central area CA, the first side area SA1, the second side area SA2, the corner area CNA, and the middle area MA may each provide portions of any one image.

The display apparatus 1 may display an image even in the first side area SA1, the second side area SA2, the middle area MA, and the corner area CNA as well as in central area CA. Therefore, the proportion of a display area of the display apparatus 1, in which an image is displayed, may increase. In addition, the display apparatus 1 may display an image while being bent at the corner CN, and thus, aesthetic appeal may be improved.

Figure 3:
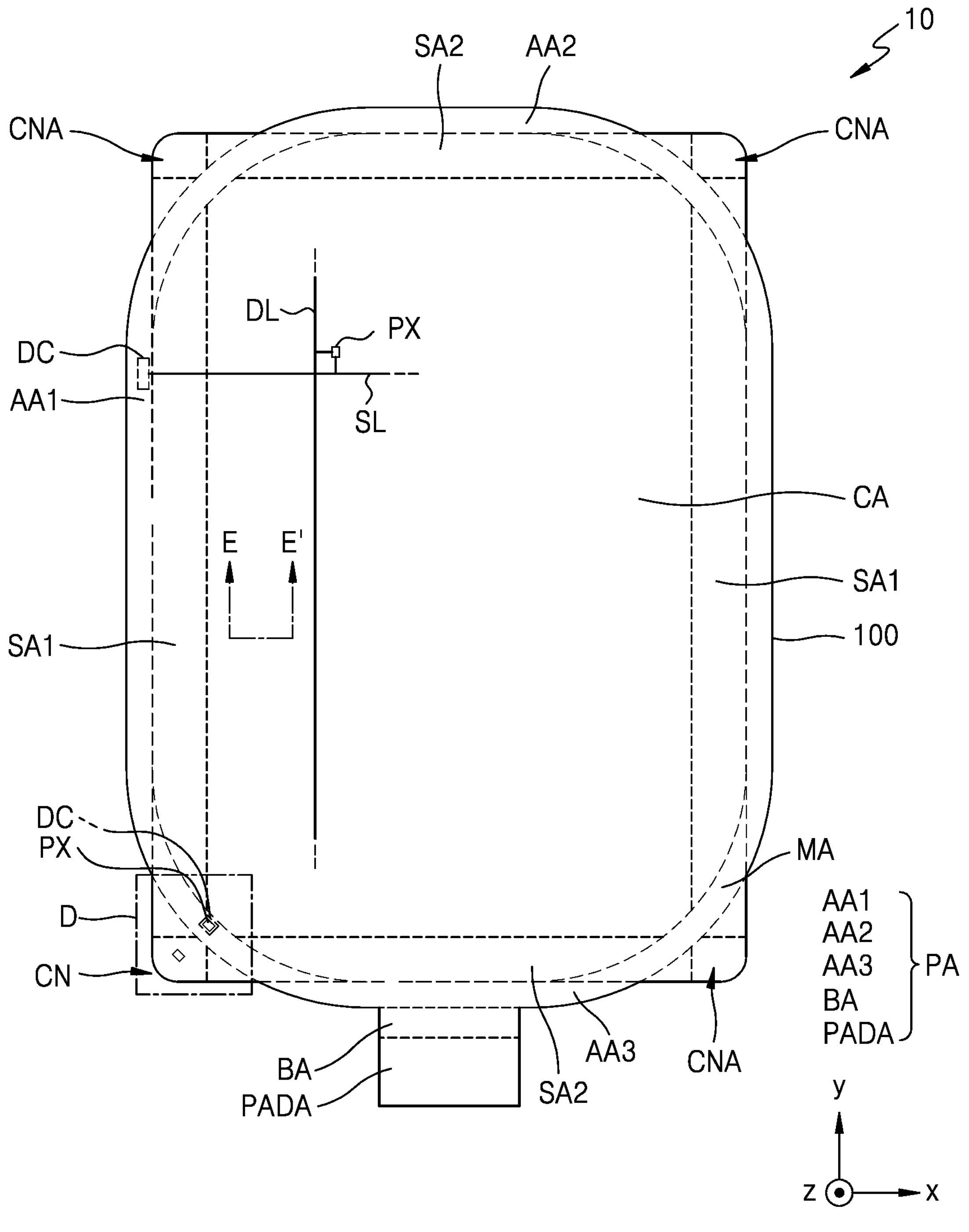
FIG. 3 is a schematic plan view of a display panel according to an embodiment.

FIG. 3 is a schematic plan view of a display panel according to an embodiment.

Referring to FIG. 3, the display panel 10 may display an image. The display panel 10 may include the substrate 100, the pixel PX, and a driving circuit DC. The substrate 100 may include the central area CA, the first side area SA1, the second side area SA2, the corner area CNA, the middle area MA, and the peripheral area PA. The central area CA may be flat. In an embodiment, the display panel 10 may provide most of the image in the central area CA.

The first side area SA1 may be adjacent to the central area CA in the first direction (for example, the x direction or the −x direction). In an embodiment, the first side area SA1 may be arranged between the central area CA and the peripheral area PA. The first side area SA1 may extend from the central area CA in the first direction (for example, the x direction or the −x direction).

The second side area SA2 may be adjacent to the central area CA in the second direction (for example, the y direction or the −y direction). In an embodiment, the second side area SA2 may be arranged between the central area CA and the peripheral area PA. The second side area SA2 may extend from the central area CA in the second direction (for example, the y direction or the −y direction).

The corner area CNA may be arranged at the corner CN of the display panel 10. In an embodiment, the corner area CNA may be an area where an edge of the display panel 10 in the first direction (for example, the x direction or the −x direction) and an edge thereof in the second direction (for example, the y direction or the −y direction) meet each other. In an embodiment, the corner area CNA may at least partially surround the central area CA, the first side area SA1, and the second side area SA2. The corner area CNA may at least partially surround the central area CA, the first side area SA1, the second side area SA2, and the middle area MA.

The middle area MA may be arranged between the central area CA and the corner area CNA. In an embodiment, the middle area MA may extend between the first side area SA1 and the corner area CNA. In an embodiment, the middle area MA may extend between the second side area SA2 and the corner area CNA. The driving circuit DC for providing an electrical signal to the pixel PX and/or a power line for providing power to the pixel PX may be arranged in the middle area MA. In such an embodiment, the pixel PX arranged in the middle area MA may overlap the driving circuit DC and/or the power line. In some embodiments, the driving circuit DC and/or the power line arranged in the middle area MA may be omitted.

The peripheral area PA may be arranged outside the central area CA. The pixel PX may not be arranged in the peripheral area PA. Therefore, the peripheral area PA may be a non-display area in which an image is not displayed. The driving circuit DC for providing an electrical signal to the pixel PX and/or a power line for providing power to the pixel PX may be arranged in the peripheral area PA. The peripheral area PA may include a first adjacent area AA1, a second adjacent area AA2, a third adjacent area AA3, a bending area BA, a pad area PADA.

The first adjacent area AA1 may be arranged outside the first side area SA1. In other words, the first side area SA1 may be arranged between the first adjacent area AA1 and the central area CA. The first adjacent area AA1 may extend from the first side area SA1. In an embodiment, the first adjacent area AA1 may extend from the first side area SA1 in the first direction (for example, the x direction or the −x direction). In an embodiment, the driving circuit DC may be arranged in the first adjacent area AA1.

The second adjacent area AA2 and the third adjacent area AA3 may be arranged outside the second side area SA2. In such an embodiment, the second side area SA2 may be arranged between the second adjacent area AA2 and the central area CA. In addition, the second side area SA2 may be arranged between the third adjacent area AA3 and the central area CA. The second adjacent area AA2 and the third adjacent area AA3 may extend from the second side area SA2. In an embodiment, the second adjacent area AA2 and the third adjacent area AA3 may extend in the second direction (for example, the y direction or the −y direction).

The central area CA may be arranged between the second adjacent area AA2 and the third adjacent area AA3.

The bending area BA may be arranged outside the third adjacent area AA3. In such an embodiment, the third adjacent area AA3 may be arranged between the bending area BA and the second side area SA2. The display panel 10 may be bent in the bending area BA. In such an embodiment, the pad area PADA may face a rear surface of the display panel 10 opposite to an upper surface thereof on which an image is displayed. Therefore, the area of the peripheral area PA visible to a user may be reduced.

The pad area PADA may be arranged outside the bending area BA. such an embodiment, the bending area BA may be arranged between the third adjacent area AA3 and the pad area PADA. A pad (not shown) may be arranged in the pad area PADA. The display panel 10 may receive an electrical signal and/or a power voltage via the pad.

At least one selected from the first side area SA1, the second side area SA2, the corner area CNA, and the middle area MA may be bent. In an embodiment, for example, a portion of each of the first side area SA1 and the corner area CNA may be bent in a cross-section (for example, the xz cross-section) in the first direction (for example, the x direction or the −x direction). Another portion of each of the second side area SA2 and the corner area CNA may be bent in a cross-section (for example, the yz cross-section) in the second direction (for example, the y direction or the −y direction). Another portion of the corner area CNA may be bent in a cross-section (for example, the xz cross-section) in the first direction (for example, the x direction or the −x direction), and may be bent in a cross-section (for example, the yz cross-section) in the second direction (for example, the y direction or the −y direction).

In an embodiment where the corner area CNA is bent, a compressive strain may be greater than a tensile strain in the corner area CNA. In such an embodiment, it is desired to provide at least a portion of the corner area CAN as the contractible substrate 100 with a multilayer structure thereon. In an embodiment, a structure of the display panel 10 in the corner area CNA and a structure of the display panel 10 in the central area CA may be different from each other.

The pixel PX and the driving circuit DC may be disposed on the substrate 100. The pixel PX may be arranged in at least one of the central area CA, the first side area SA1, the second side area SA2, the corner area CNA, and the middle area MA. In an embodiment, the pixel PX may include a plurality of pixels PX. The pixel PX may include a display element. In an embodiment, the display element may be an organic light-emitting diode (OLED) including an organic emission layer. Alternatively, the display element may be a light-emitting diode (LED) including an inorganic emission layer. The size of the LED may be micro scale or nano scale. In an embodiment, for example, the LED may be a micro LED. Alternatively, the LED may be a nanorod LED. The nanorod LED may include gallium nitride (GaN). In an embodiment, a color conversion layer may be disposed on the nanorod LED. The color conversion layer may include quantum dots. Alternatively, the display element may be a quantum dot LED including a quantum dot emission layer.

The pixel PX may include a plurality of sub-pixels, and each of the plurality of sub-pixels may emit light of a certain color by using the display element. Here, a sub-pixel is a minimum unit for realizing an image and refers to an emission area. in an embodiment, where an organic LED is employed as the display element, the emission area may be defined by an opening of a pixel-defining layer, which is described in the following description.

The driving circuit DC may be a scan driving circuit configured to provide a scan signal to each pixel PX via a scan line SL. Alternatively, the driving circuit DC may be a data driving circuit configured to provide a data signal to each pixel PX via a data line DL. In an embodiment, the data driving circuit may be arranged in the third adjacent area AA3 or the pad area PADA. Alternatively, the data driving circuit may be disposed on a display circuit board connected thereto via the pad.

Figure 4:
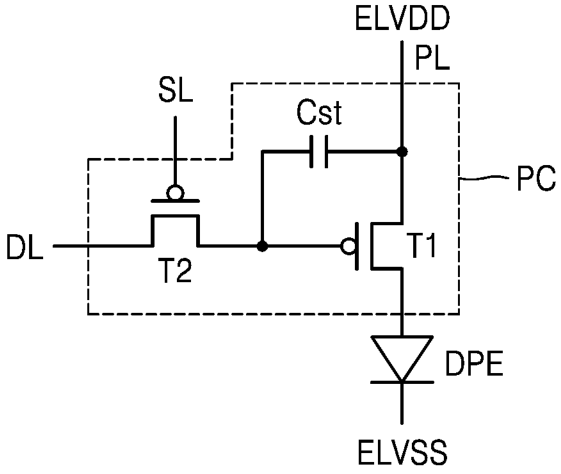
FIG. 4 is a schematic equivalent circuit diagram of an embodiment of a pixel circuit of a display panel.

FIG. 4 is a schematic equivalent circuit diagram of an embodiment of a pixel circuit of a display panel.

Referring to FIG. 4, a pixel circuit PC may be electrically connected to a display element DPE. The pixel circuit PC may include a first thin-film transistor T1, a second thin-film transistor T2, and a storage capacitor Cst. In an embodiment, the display element DPE may emit red light, green light, or blue light, or may emit red light, green light, blue light, or white light.

The second thin-film transistor T2 may be connected to the scan line SL and the data line DL, and may be configured to transmit a data signal or data voltage input from the data line DL to the first thin-film transistor T1, based on a scan signal or switching voltage input from the scan line SL.

The storage capacitor Cst may be connected to the second thin-film transistor T2 and a driving voltage line PL, and may store a voltage corresponding to a difference between a voltage received from the second thin-film transistor T2 and a first power voltage ELVDD supplied to the driving voltage line PL.

The first thin-film transistor T1 may be connected to the driving voltage line PL and the storage capacitor Cst, and may be configured to control a driving current flowing from the driving voltage line PL to an OLED, based on a voltage value stored in the storage capacitor Cst. The display element DPE may emit light having a certain luminance according to the driving current. An opposite electrode of the display element DPE may receive a second power voltage ELVSS.

FIG. 4 illustrates an embodiment where the pixel circuit PC includes two thin-film transistors and one storage capacitor, but the pixel circuit PC may include at least two thin-film transistors and/or at least one storage capacitor.

Figure 5:
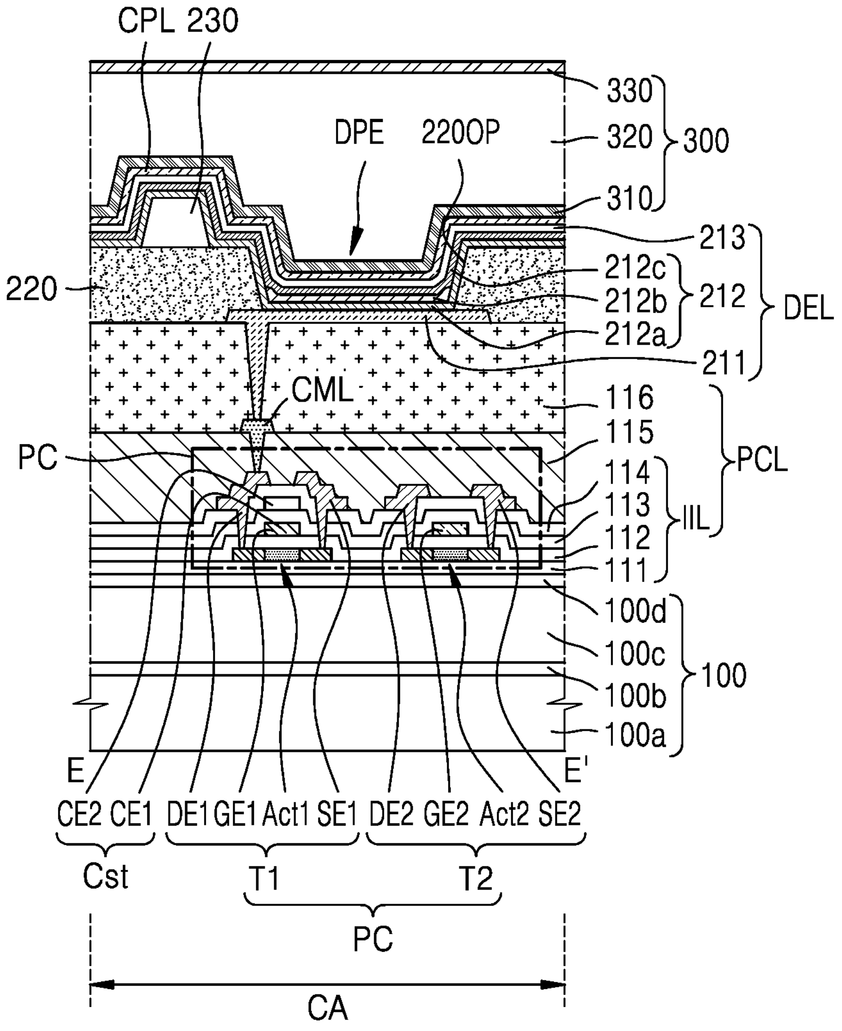
FIG. 5 is a schematic cross-sectional view of the display panel according to an embodiment taken along line E-E' of FIG. 3.

FIG. 5 is a schematic cross-sectional view of the display panel 10 according to an embodiment taken along line E-E' of FIG. 3.

Referring to FIG. 5, an embodiment of the display panel 10 may include the substrate 100, a pixel circuit layer PCL, a display element layer DEL, and an encapsulation layer 300.

The substrate 100 may include at least one selected from various materials, such as glass, a metal, or an organic material. In an embodiment, the substrate 100 may include a flexible material. In an embodiment, for example, the substrate 100 may include ultra-thin flexible glass (for example, a thickness of a few tens of micrometers (μm) to a few hundred micrometers) or a polymer resin. In an embodiment where the substrate 100 includes a polymer resin, the substrate 100 may include polyimide. Alternatively, the substrate 100 may include polyethersulfone, polyarylate, polyetherimide, polyethyelenene napthalate, polyethyeleneterepthalate, polyphenylene sulfide, polycarbonate, cellulose triacetate (TAC), or/and cellulose acetate propionate.

In an embodiment, the substrate 100 may include a first base layer 100*a*, a first barrier layer 100*b*, a second base layer 100*c*, and a second barrier layer 100*d*. In an embodiment, the first base layer 100*a*, the first barrier layer 100*b*, the second base layer 100*c*, and the second barrier layer 100*d* may be sequentially stacked one on another. Alternatively, the substrate 100 may include glass.

At least one selected from the first base layer 100*a* and the second base layer 100*c* may include a polymer resin such as polyethersulfone, polyarylate, polyetherimide, polyethyelenene napthalate, polyethyeleneterepthalate, polyphenylene sulfide, polyimide, polycarbonate, TAC, and cellulose acetate propionate.

The first barrier layer 100*b* and the second barrier layer 100*d* are barrier layers that prevent penetration of foreign substances, and may be a single layer or multilayer including an inorganic material such as such as silicon nitride ($SiN_x$), silicon oxide ($SiO_2$), and/or silicon oxynitride (SiON).

The pixel circuit layer PCL may be disposed on the substrate 100. The pixel circuit layer PCL may include the pixel circuit PC. The pixel circuit PC may be disposed on the central area CA. In an embodiment, the pixel circuit PC may include at least one thin-film transistor. The pixel circuit PC may include the first thin-film transistor T1, the second thin-film transistor T2, and the storage capacitor Cst.

The pixel circuit layer PCL may further include an inorganic insulating layer IIL, a first insulating layer 115, and a second insulating layer 116 disposed under or above components of the first thin-film transistor T1. The inorganic insulating layer IIL may include a buffer layer 111, a lower gate insulating layer 112, an upper gate insulating layer 113, and an interlayer insulating layer 114. The first thin-film transistor T1 may include a first semiconductor layer Act1, a first gate electrode GE1, a first source electrode SE1, and a first drain electrode DE1.

The buffer layer 111 may be disposed on the substrate 100. The buffer layer 111 may include an inorganic insulating material such as $SiN_x$, SiON, and $SiO_2$, and may be a single layer or multilayer including the inorganic insulating material.

The first semiconductor layer Act1 may be disposed on the buffer layer 111. The first semiconductor layer Act1 may include polysilicon. Alternatively, the first semiconductor layer Act1 may include amorphous silicon, an oxide semiconductor, or an organic semiconductor. The first semiconductor layer Act1 may include a channel region, and a drain region and a source region respectively at opposing sides of the channel region.

The first gate electrode GE1 may overlap the channel region. The first gate electrode GE1 may include a low-resistance metal material. The first gate electrode GE1 may include a conductive material including molybdenum (Mo), aluminum (Al), copper (Cu), titanium (Ti), and the like, and may be a multilayer or single layer including the above material.

The lower gate insulating layer 112 between the first semiconductor layer Act1 and the first gate electrode GE1 may include an inorganic insulating material such as $SiO_2$, $SiN_x$, SiON, aluminum oxide ($Al_2O_3$), titanium oxide ($TiO_2$), tantalum oxide ($Ta_2O_5$), halfnium oxide ($HfO_2$), and/or zinc oxide ($ZnO_x$). In an embodiment, $ZnO_x$ may include zinc oxide (ZnO) and/or zinc peroxide ($ZnO_2$).

The upper gate insulating layer 113 may cover the first gate electrode GE1. Similar to the lower gate insulating layer 112, the upper gate insulating layer 113 may include an inorganic insulating material such as $SiO_2$, $SiN_x$, SiON, $Al_2O_3$, $TiO_2$, $Ta_2O_5$, $HfO_2$, and/or $ZnO_x$.

An upper electrode CE2 of the storage capacitor Cst may be disposed over the upper gate insulating layer 113. The upper electrode CE2 may overlap the first gate electrode GE1 thereunder. In an embodiment, the first gate electrode GE1 of the first thin-film transistor T1 and the upper electrode CE2, which overlap each other with the upper gate insulating layer 113 therebetween, may form or collectively define the storage capacitor Cst. In such an embodiment, the first gate electrode GE1 of the first thin-film transistor T1 may function as a lower electrode CE1 of the storage capacitor Cst. In such an embodiment, the storage capacitor Cst and the first thin-film transistor T1 may overlap each other. In some embodiments, the storage capacitor Cst may not overlap the first thin-film transistor T1. The upper electrode CE2 may include Al, platinum (Pt), palladium (Pd), silver (Ag), magnesium (Mg), gold (Au), nickel (Ni), neodymium (Nd), iridium (Ir), chromium (Cr), calcium (Ca), Mo, Ti, tungsten (W), and/or Cu, and may be a single layer or multilayer, each layer including at least one selected from the above-described materials.

The interlayer insulating layer 114 may cover the upper electrode CE2. The interlayer insulating layer 114 may include $SiO_2$, $SiN_x$, SiON, $Al_2O_3$, $TiO_2$, $Ta_2O_5$, $HfO_2$, or $ZnO_x$. The interlayer insulating layer 114 may be a single layer or multilayer, each layer including at least one selected from the above-described inorganic insulating materials.

Each of the first drain electrode DE1 and the first source electrode SE1 may be disposed on the interlayer insulating layer 114. The first drain electrode DE1 and the first source electrode SE1 may include a material exhibiting high conductivity. The first drain electrode DE1 and the first source electrode SE1 may include a conductive material including Mo, Al, Cu, Ti, or the like, and may be a multilayer or single layer, each layer including at least one selected from the above materials. In an embodiment, the first drain electrode DE1 and the first source electrode SE1 may have a multilayer structure of Ti/Al/Ti.

The second thin-film transistor T2 may include a second semiconductor layer Act2, a second gate electrode GE2, a second drain electrode DE2, and a second source electrode SE2. The second semiconductor layer Act2, the second gate electrode GE2, the second drain electrode DE2, and the second source electrode SE2 are similar to the first semiconductor layer Act1, the first gate electrode GE1, the first drain electrode DE1, and the first source electrode SE1, respectively, and thus, any repetitive detailed descriptions thereof will be omitted.

The first insulating layer 115 may be disposed on at least one thin-film transistor. In an embodiment, the first insulating layer 115 may cover and be disposed on the first drain electrode DE1 and the first source electrode SE1. The first insulating layer 115 may include an organic material. In an embodiment, for example, the first insulating layer 115 may include an organic insulating material, such as a general purpose polymer, such as polymethylmethacrylate (PMMA) or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or a blend thereof.

A connection electrode CML may be disposed on the first insulating layer 115. In such an embodiment, the connection electrode CML may be connected to the first drain electrode DE1 or the first source electrode SE1 through a contact hole of the first insulating layer 115. The connection electrode CML may include a material exhibiting high conductivity. The connection electrode CML may include a conductive material including Mo, Al, Cu, Ti, or the like, and may be a multilayer or single layer, each layer including at least one selected from the above materials. In an embodiment, the connection electrode CML and a connection line CL may have a multilayer structure of Ti/Al/Ti.

The second insulating layer 116 may cover and be disposed on the connection electrode CML and the first insulating layer 115. The second insulating layer 116 may include an organic material. The second insulating layer 116 may include an organic insulating material, such as a general purpose, polymer such as PMMA or PS, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or a blend thereof.

The display element layer DEL may be disposed on the pixel circuit layer PCL. The display element layer DEL may include the display element DPE, a pixel-defining layer 220, and a spacer 230. The display element DPE may include an OLED. The display element DPE may be electrically connected to the connection electrode CML via a contact hole of the second insulating layer 116. The display element DPE may include a pixel electrode 211, an intermediate layer 212, and an opposite electrode 213. In an embodiment, the display element DPE arranged in the central area CA may overlap the pixel circuit PC arranged in the central area CA.

The pixel electrode 211 may be disposed on the second insulating layer 116. The pixel electrode 211 may be electrically connected to the connection electrode CML via a contact hole of the second insulating layer 116. The pixel electrode 211 may include a conductive oxide, such as an indium tin oxide (ITO), an indium zinc oxide (IZO), ZnO, an indium oxide ($In_2O_3$), an indium gallium oxide (IGO), or an aluminum zinc oxide (AZO). In an alternative embodiment, the pixel electrode 211 may include a reflective film including Ag, Mg, Al, Pt, Pd, Au, Ni, Nd, Ir, Cr, or a compound thereof. In another alternative embodiment, the pixel electrode 211 may further include a film including ITO, IZO, ZnO, or $In_2O_3$ over/under the above-described reflective film.

The pixel-defining layer 220 with an opening 2200P exposing a center portion of the pixel electrode 211 may be disposed on the pixel electrode 211. The opening 2200P of the pixel-defining layer 220 may define an emission area of light emitted from the OLED (hereinafter, referred to as an emission area). In an embodiment, for example, the width of the opening 2200P of the pixel-defining layer 220 may correspond to the width of the emission area. In addition, the width of the opening 2200P of the pixel-defining layer 220 may correspond to the width of a sub-pixel.

In an embodiment, the pixel-defining layer 220 may include an organic insulating material. In an alternative embodiment, the pixel-defining layer 220 may include an inorganic insulating material, such as $SiN_x$, SiON, or $SiO_2$. In another alternative embodiment, the pixel-defining layer 220 may include an organic insulating material and an inorganic insulating material. In some embodiments, the pixel-defining layer 220 may include a light-blocking material, and may be black. The light-blocking material may include resin or paste including carbon black, carbon nanotubes, or black dye, metal particles such as Ni, Al, Mo, and alloys thereof, metal oxide particles (for example, chromium oxide), or metal nitride particles (for example, chromium nitride). In an embodiment where the pixel-defining layer 220 includes the light-blocking material, reflection of external light by metal structures disposed under the pixel-defining layer 220 may be reduced.

The spacer 230 may be disposed on the pixel-defining layer 220. The spacer 230 may be used to prevent damage to the substrate 100 and/or a multilayer film on the substrate 100 in a method of manufacturing a display apparatus. In a method of manufacturing a display panel, a mask sheet may be used, and at this time, the mask sheet may enter the opening 2200P of the pixel-defining layer 220 or may be in close contact with the pixel-defining layer 220. The spacer 230 may prevent or reduce defects in which the substrate 100 and a portion of the multilayer film are damaged or broken by the mask sheet when a deposition material is deposited on the substrate 100.

The spacer 230 may include an organic material such as polyimide. Alternatively, the spacer 230 may include an inorganic insulating material such as $SiN_x$ or $SiO_2$, or may include an organic insulating material and an inorganic insulating material. In an embodiment, the spacer 230 may include a material different from that of the pixel-defining layer 220. Alternatively, the spacer 230 may include a material identical to that of the pixel-defining layer 220, and in this case, the pixel-defining layer 220 and the spacer 230 may be formed together in a mask process using a halftone mask or the like.

The intermediate layer 212 may be disposed on the pixel-defining layer 220. The intermediate layer 212 may include an emission layer **212*b* arranged in correspondence with the opening 2200P of the pixel-defining layer 220. The emission layer 212*b*** may include a polymer or low molecular weight organic material for emitting light of a certain color.

The intermediate layer 212 may include at least one selected from a first functional layer **212*a* between the pixel electrode 211 and the emission layer 212*b*, and a second functional layer 212*c* between the emission layer 212*b* and the opposite electrode 213. In an embodiment, the first functional layer 212*a* and the second functional layer 212*c* may be disposed under and over the emission layer 212*b*, respectively. The first functional layer 212*a* may include, for example, a hole transport layer (HTL), or a HTL and a hole injection layer (HIL). The second functional layer 212*c* may include an electron transport layer (ETL) and/or an electron injection layer (EIL). The first functional layer 212*a* and/or the second functional layer 212*c* may be a common layer that entirely covers the substrate 100, like the opposite electrode 213** described below.

The opposite electrode 213 may be disposed on the intermediate layer 212. The opposite electrode 213 may include a conductive material having a low work function. In an embodiment, for example, the opposite electrode 213 may include a (semi-)transparent layer including Ag, Mg, Al, Pt, Pd, Au, Ni, Nd, Ir, Cr, lithium (Li), Ca, or an alloy thereof. Alternatively, the opposite electrode 213 may further include a layer including ITO, IZO, ZnO or $In_2O_3$ on the (semi-)transparent layer including the above-described material.

In some embodiments, a capping layer CPL for improving a light extraction rate of light emitted from the display element DPE may be further disposed on the opposite electrode 213. The capping layer CPL may include an inorganic insulating material such as $SiN_x$, and/or an organic insulating material. In an embodiment where the capping layer CPL includes an organic insulating material, the capping layer CPL may include an organic insulating material such as a triamine derivative, a carbazole biphenyl derivative, an arylenediamine derivative, an aluminum quinoline composite ($Alq_3$), acryl, polyimide, or polyamide. Hereinafter, an embodiment where the capping layer CPL includes an organic insulating material will be mainly described.

The encapsulation layer 300 may be disposed on the opposite electrode 213. In addition, when the capping layer CPL is arranged, the encapsulation layer 300 may be disposed on the capping layer CPL. In an embodiment, the encapsulation layer 300 may include at least one inorganic encapsulation layer and at least one organic encapsulation layer. In an embodiment, the encapsulation layer 300 may include a first inorganic encapsulation layer 310, an organic encapsulation layer 320, and a second inorganic encapsulation layer 330, which are sequentially stacked one on another.

The first inorganic encapsulation layer 310 and the second inorganic encapsulation layer 330 may include at least one inorganic material selected from $Al_2O_3$, $TiO_2$, $Ta_2O_5$, $HfO_2$, $ZnO_x$, $SiO_2$, $SiN_x$, and SiON. The organic encapsulation layer 320 may include a polymer-based material. The polymer-based material may include acrylic resin, epoxy-based resin, polyimide, polyethylene, or the like. In an embodiment, the organic encapsulation layer 320 may include acrylate.

Although not shown, a touch sensor layer may be disposed on the encapsulation layer 300. The touch sensor layer may obtain coordinate information according to an external input, for example, a touch event. The touch sensor layer may include a sensing electrode (or touch electrode) and trace lines connected to the sensing electrode. The touch sensor layer may detect an external input by using a mutual capacitance method or/and a self-capacitance method.

Although not shown, a reflection prevention layer may be disposed on the touch sensor layer. The reflection prevention layer may reduce reflectance of light incident toward the display panel 10. In an embodiment, the reflection prevention layer may include a retarder and/or a polarizer. The retarder may be of a film type or a liquid crystal coating type, and may include a λ/2 retarder and/or a λ/4 retarder. The polarizer may also be of a film type or a liquid crystal coating type. The film type may include a stretchable synthetic resin film, and the liquid crystal coating type may include liquid crystals arranged in a certain array. The retarder and the polarizer may further include a protective film.

Alternatively, the reflection prevention layer may include a black matrix and color filters. The color filters may be arranged in consideration of color of light emitted from each of a plurality of display elements DPE. Each of the color filters may include a red, green, or blue pigment or a red, green, or blue dye. Alternatively, each of the color filters may further include quantum dots, in addition to the above-described pigment or dye. Alternatively, some of the color filters may not include the above-described pigment or dye, and may include scattering particles such as $TiO_2$.

Alternatively, the reflection prevention layer may include a destructive interference structure. The destructive interference structure may include a first reflective layer and a second reflective layer, which are disposed on different layers. A first reflected ray and a second reflected ray respectively reflected from the first reflective layer and the second reflective layer may be destructively interfered, and accordingly, external light reflectance may be reduced.

Figure 6:
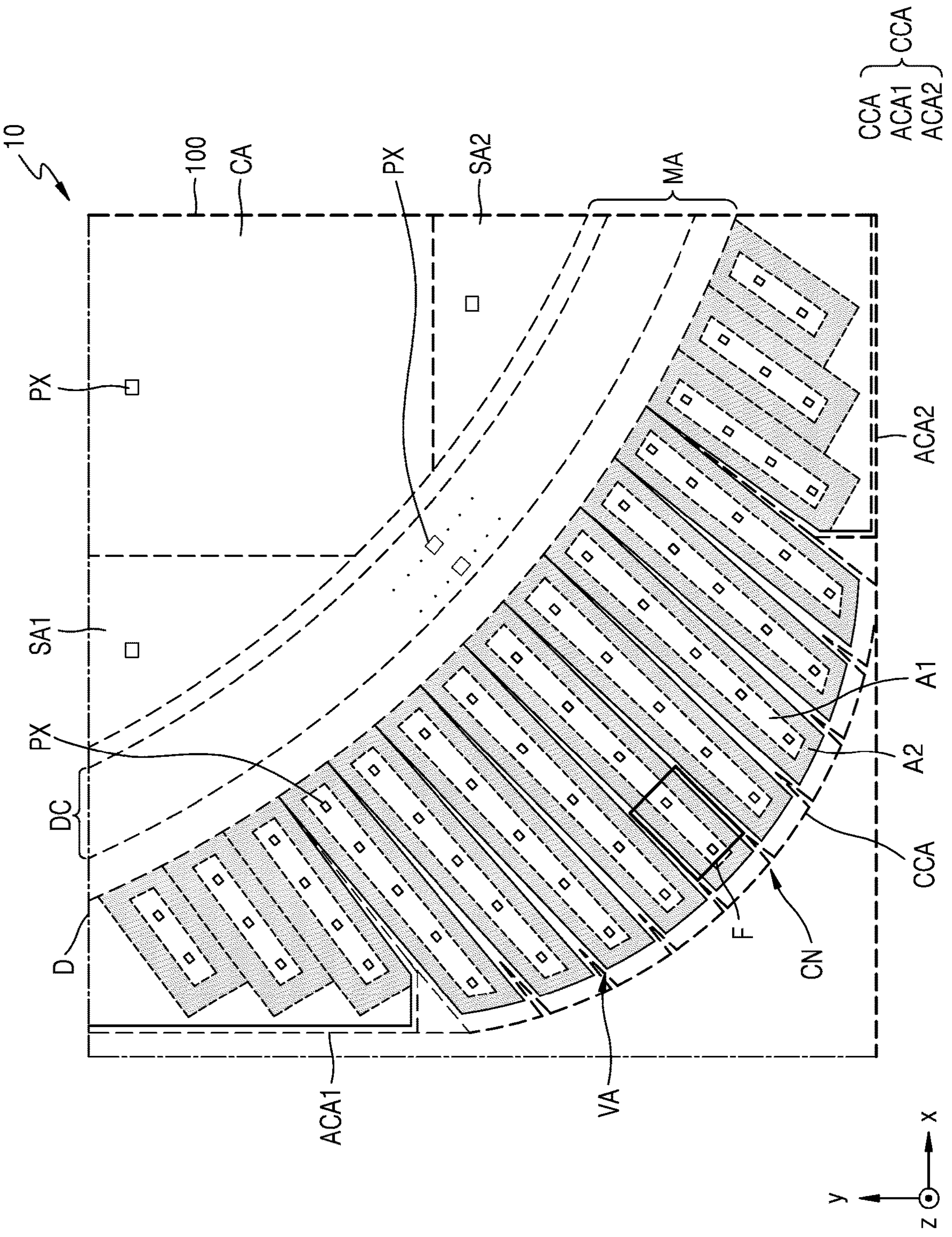
FIG. 6 is an enlarged view of portion D of the display panel of FIG. 3.

FIG. 6 is an enlarged view of portion D of the display panel 10 of FIG. 3.

Referring to FIG. 6, the substrate 100 may include the central area CA, the first side area SA1, the second side area SA2, and the corner area CNA.

The first side area SA1 may be adjacent to the central area CA in the first direction (for example, the x direction or the −x direction). The first side area SA1 may extend from the central area CA in the first direction (for example, the x direction or the −x direction). The second side area SA2 may be adjacent to the central area CA in the second direction (for example, the y direction or the −y direction). The second side area SA2 may extend from the central area CA in the second direction (for example, the y direction or the −y direction).

The corner area CNA may be arranged at the corner CN of the display panel 10. In an embodiment, the corner area CNA may be an area where an edge of the display panel 10 in the first direction (for example, the x direction or the −x direction) and an edge thereof in the second direction (for example, the y direction or the −y direction) meet each other. In an embodiment, the corner area CNA may at least partially surround the central area CA, the first side area SA1, and the second side area SA2. The corner area CNA may at least partially surround the central area CA, the first side area SA1, the second side area SA2, and the middle area MA. The corner area CNA may include an extended corner area CCA, a first adjacent corner area ACA1, and a second adjacent corner area ACA2.

The extended corner area CCA may extend in a direction away from the central area CA. In an embodiment, the extended corner area CCA may include a plurality of extended corner areas CCA, and each of the extended corner areas CCA may extend in a direction away from the central area CA. The extended corner area CCA may include a first area A1 and a second area A2. In an embodiment, a plurality of extended corner areas CCA may include a plurality of first areas A1. Each of the plurality of first areas A1 may extend in a direction away from the central area CA. In an embodiment, the plurality of first areas A1 may extend in a direction crossing the first direction (for example, the x direction or the −x direction) and the second direction (for example, the y direction or the −y direction).

The second area A2 may surround the first area A1. The second area A2 may surround the plurality of first areas A1. In an embodiment, a separation area VA may be defined between a portion of the second area A2 arranged between adjacent first areas A1 and another portion of the second area A2 between the adjacent first areas A1.

The separation area VA may be an area where a component of the display panel 10 is not arranged. In an embodiment where the extended corner area CCA is bent at the corner CN, a compressive strain may be greater than a tensile strain in the extended corner area CCA. In an embodiment, the separation area VA is defined between a portion of the second area A2 arranged between adjacent first areas A1 and another portion of the second area A2 arranged between the adjacent first areas A1, and thus, the extended corner area CCA may be contracted. Therefore, the display panel 10 may be bent without being damaged in the extended corner area CCA.

The first adjacent corner area ACA1 may be adjacent to the extended corner area CCA. In an embodiment, at least a portion of the first side area SA1 and the first adjacent corner area ACA1 may be arranged in the first direction (for example, the x direction or the −x direction). An end portion of the adjacent extended corner area CCA and an end portion of the first adjacent corner area ACA1 may be apart from each other. The first adjacent corner area ACA1 may be bent in a cross-section (for example, the xz cross-section) in the first direction (for example, the x direction or the −x direction) and may not be bent in a cross-section (for example, the yz cross-section) in the second direction (for example, the y direction or the −y direction), and the separation area VA may not be defined in the first adjacent corner area ACA1.

The second adjacent corner area ACA2 may be adjacent to the extended corner area CCA. At least a portion of the second side area SA2 may be arranged between the central area CA and the second adjacent corner area ACA2 in the second direction (for example, the y direction or the −y direction). An end portion of the adjacent extended corner area CCA and an end portion of the second adjacent corner area ACA2 may be apart from each other. The second adjacent corner area ACA2 may not be bent in a cross-section (for example, the xz cross-section) in the first direction (for example, the x direction or the −x direction) and may be bent in a cross-section (for example, the yz cross-section) in the second direction (for example, the y direction or the −y direction), and the separation area VA may not be defined in the second adjacent corner area ACA2.

The middle area MA may be arranged between the central area CA and the corner area CNA. The middle area MA may extend between the corner area CNA and the first side area SA1. The middle area MA may extend between the corner area CNA and the second side area SA2. The driving circuit DC for providing an electrical signal to the pixel PX and/or a power line for providing power to the pixel PX may be arranged in the middle area MA. In such an embodiment, the pixel PX arranged in the middle area MA may overlap the driving circuit DC and/or the power line. In some embodiments, the driving circuit DC arranged in the middle area MA may be omitted.

The pixel PX may be arranged in at least one of the central area CA, the first side area SA1, the second side area SA2, the first area A1, and the middle area MA. In an embodiment, the plurality of pixels PX may be arranged in the central area CA, the first side area SA1, the second side area SA2, the first area A1, and the middle area MA. Therefore, the display panel 10 may display an image in the central area CA, the first side area SA1, the second side area SA2, the first area A1, and the middle area MA. The plurality of pixels PX may include a plurality of display elements.

Figure 7:
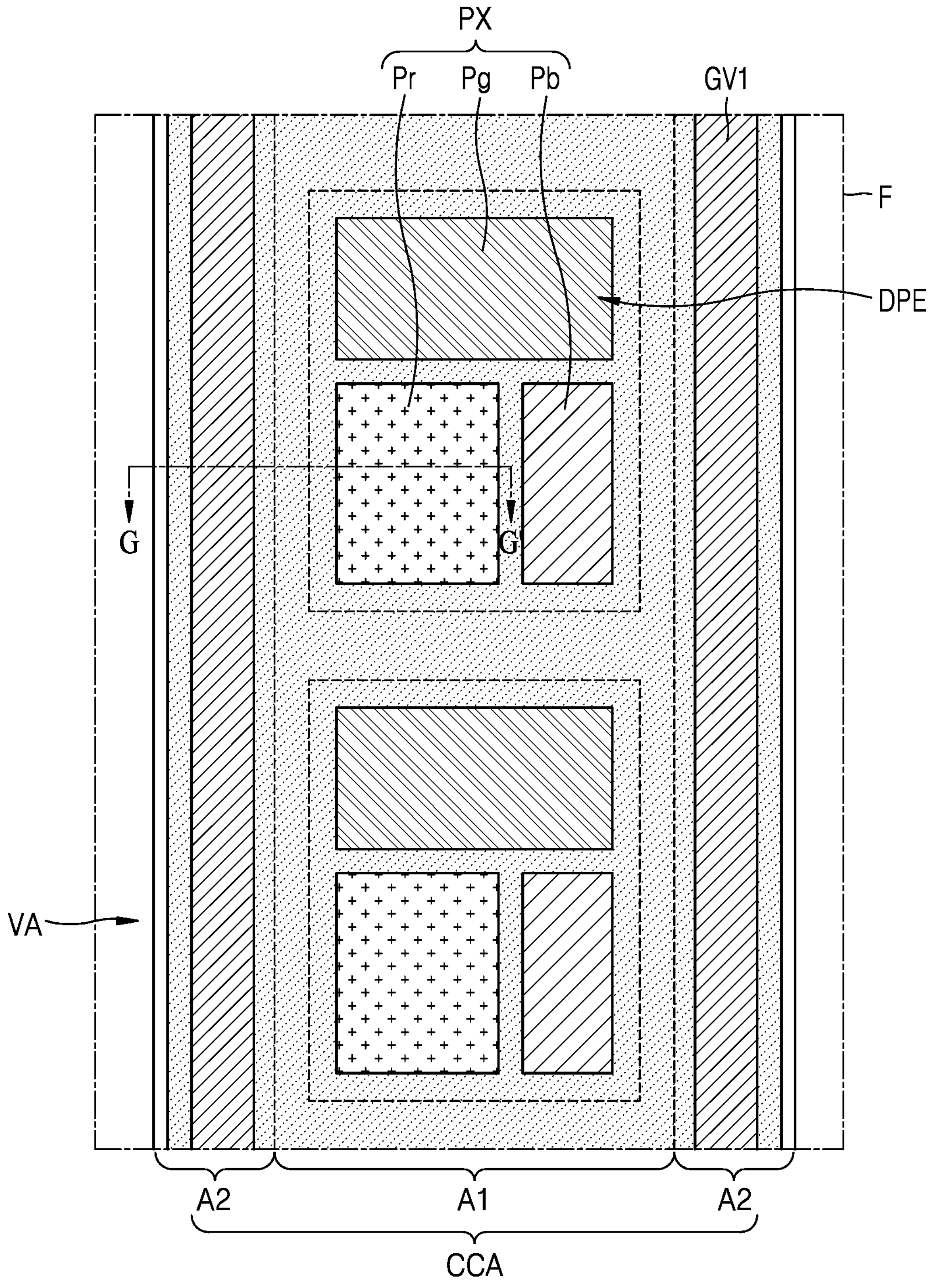
FIG. 7 is an enlarged view of portion F of the display panel of FIG. 6.
Figure 8:
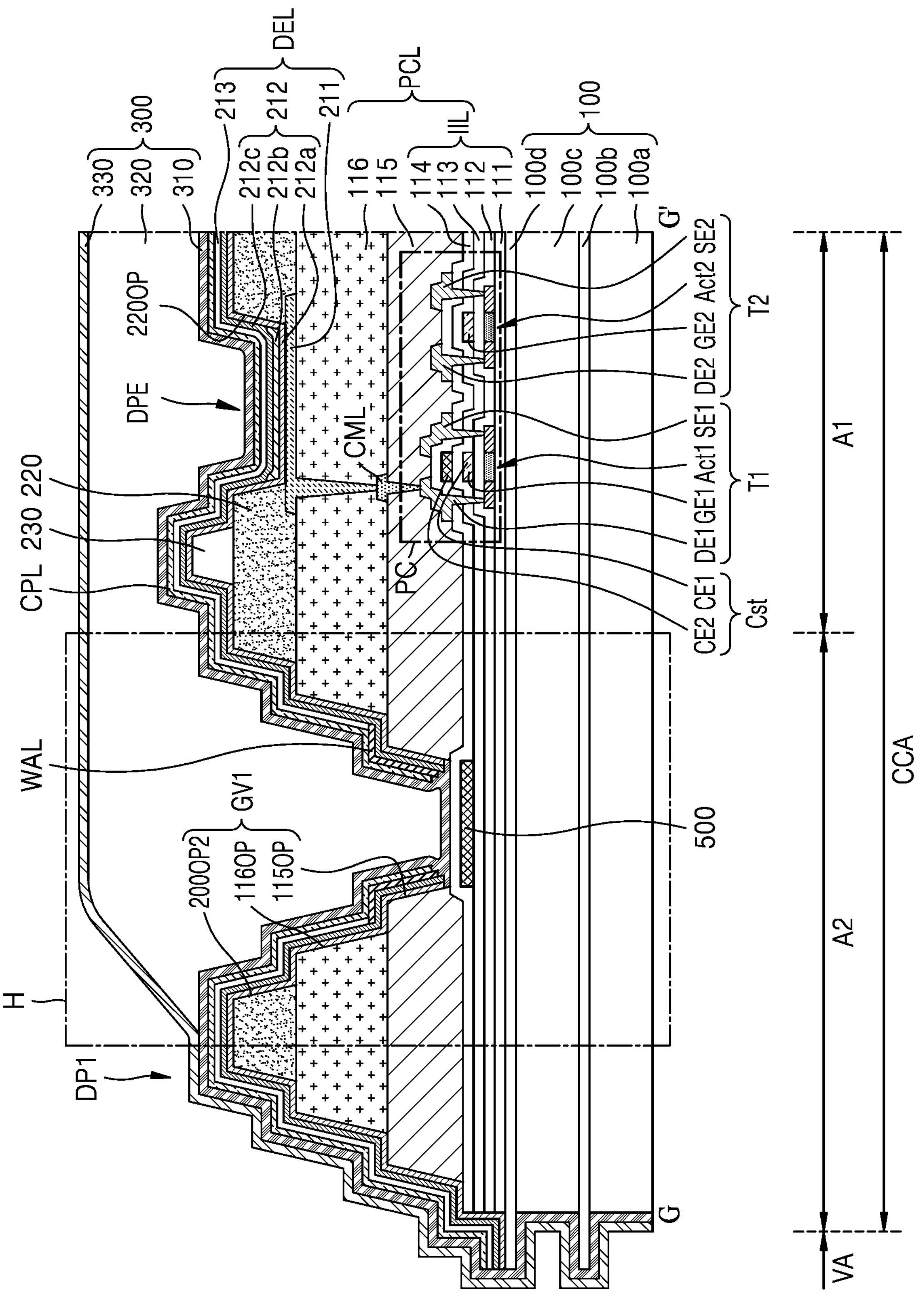
FIG. 8 is a schematic cross-sectional view of the display panel according to an embodiment taken along line G-G' of FIG. 7.
Figure 9:
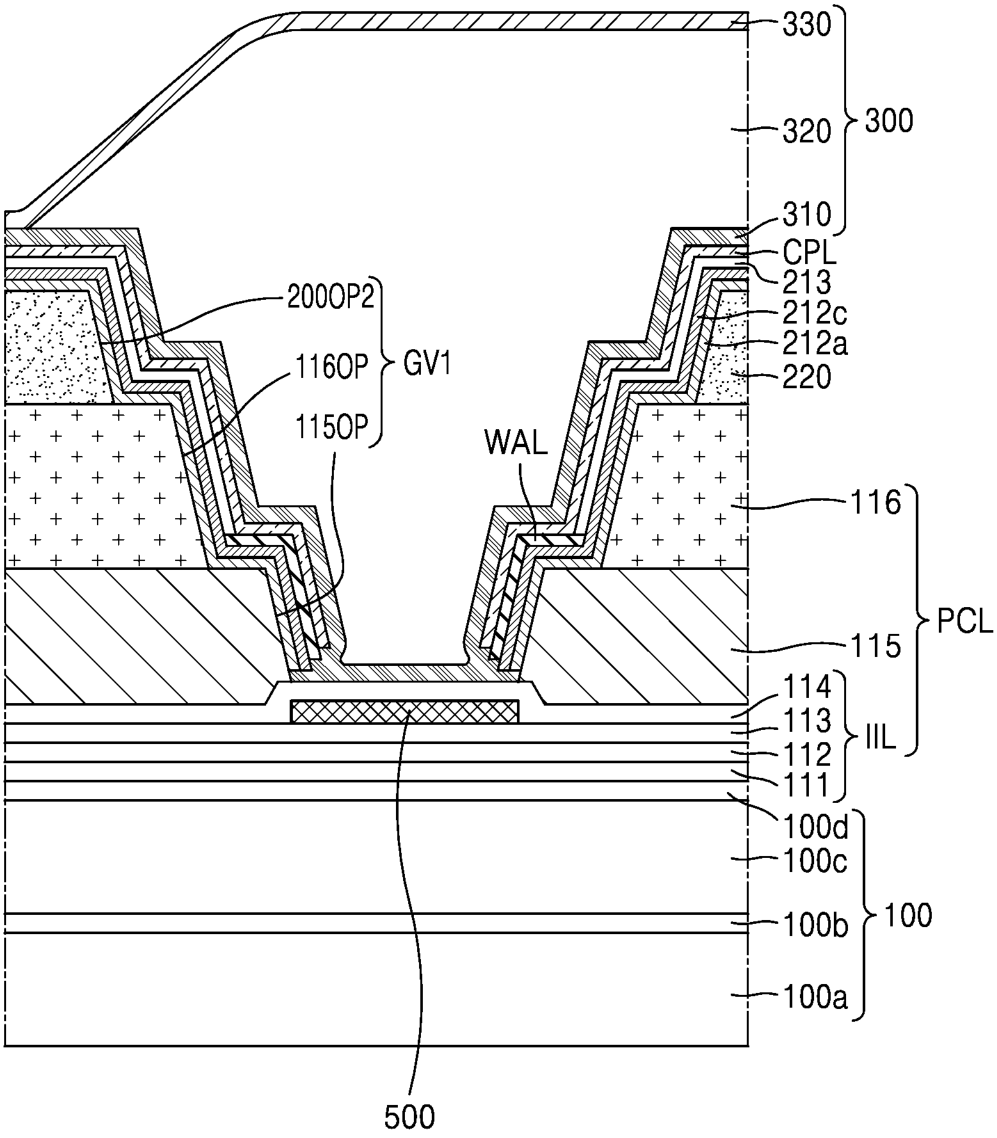
FIG. 9 is an enlarged view of portion H of FIG. 8.

FIG. 7 is an enlarged view of portion F of the display panel of FIG. 6, and FIG. 8 is a schematic cross-sectional view of the display panel according to an embodiment taken along line G-G' of FIG. 7. FIG. 9 is an enlarged view of portion H of FIG. 8.

Referring to FIGS. 7 to 9, the substrate 100 may include the corner area CNA arranged at a corner of the display panel 10, and the corner area CNA may include the first area A1 extending in a direction away from the central area CA (see FIG. 6) and the second area A2 surrounding at least a portion of the first area A1. In an embodiment, for example, the first area A1 may include a plurality of first areas A1, and each of the plurality of first areas A1 may extend in a direction crossing the first direction (for example, the x direction or the −x direction) and the second direction (for example, the y direction or the −y direction). The second area A2 may extend outside the first area A1 and surround at least a portion of the first area A1.

The separation area VA may be an area where a component of the display panel 10 is not arranged. In an embodiment, the separation area VA may be defined by a space between a portion of the second area A2 arranged between adjacent first areas A1 and another portion of the second area A2 between the adjacent first areas A1.

The pixel PX may be arranged in the first area A1. In an embodiment, the pixel PX may include a red sub-pixel Pr, a green sub-pixel Pg, and a blue sub-pixel Pb. The red sub-pixel Pr, the green sub-pixel Pg, and the blue sub-pixel Pb may emit red light, green light, and blue light, respectively.

The red sub-pixel Pr, the green sub-pixel Pg, and the blue sub-pixel Pb may be arranged in an S-stripe structure. In an embodiment, a side of the green sub-pixel Pg may face each of a side of the red sub-pixel Pr and a side of the blue sub-pixel Pb. Alternatively, the red sub-pixel Pr, the green sub-pixel Pg, and the blue sub-pixel Pb may be arranged in parallel, or may be arranged in a pentile type.

A first groove GV1 may be defined in the second area A2. The first groove GV1 may overlap in the second area A2 in a plan view, and thus, may be arranged to surround at least a portion of the first area A1. The first groove GV1 may be concave in a thickness direction of the substrate 100.

A first dam unit DP1 may be arranged in the second area A2. In an embodiment, the first dam unit DP1 may overlap the second area A2 in a plan view and may be arranged outside the first groove GV1 to surround the first groove GV1. The first dam unit DP1 may be apart from the first area A1 with respect to the first groove GV1. The first groove GV1 and the first dam unit DP1 may be arranged along a perimeter of the extended corner area CCA.

Referring to FIG. 8, the display panel 10 may include the pixel circuit layer PCL, the display element layer DEL, and the encapsulation layer 300 on the substrate 100.

The pixel circuit layer PCL may be disposed on the substrate 100. The pixel circuit layer PCL may include an inorganic insulating layer IIL, the first insulating layer 115, the connection electrode CML, and the second insulating layer 116.

The inorganic insulating layer IIL may be disposed on the substrate 100. In an embodiment, the inorganic insulating layer IIL may include the buffer layer 111, the lower gate insulating layer 112, the upper gate insulating layer 113, and the interlayer insulating layer 114.

The first insulating layer 115 may be disposed on the inorganic insulating layer K. In an embodiment, the first insulating layer 115 may be disposed between the substrate 100 and the second insulating layer 116. The first insulating layer 115 may be arranged to overlap the second area A2 and may include a first opening 1150P exposing the inorganic insulating layer IIL, e.g., an upper surface of the interlayer insulating layer 114. The first insulating layer 115 is separated with respect to the first opening 1150P to block a penetration path of oxygen and/or moisture through the first insulating layer 115.

The second insulating layer 116 may be disposed on the first insulating layer 115. A second opening 1160P may be defined in the second insulating layer 116 to overlap the second area A2 and to expose a portion of an upper surface of the first insulating layer 115. In an embodiment, the second opening 1160P may be defined to overlap the first opening 1150P. In an embodiment, the width of the second opening 1160P may be greater than the width of the first opening 1150P. Accordingly, the second opening 1160P may expose an upper surface of a portion of the first insulating layer 115 defining a boundary of the first opening 1150P, and the first opening 1150P and the second opening 1160P may be continuously arranged to form one opening exposing the inorganic insulating layer IIL, e.g., the upper surface of the interlayer insulating layer 114. In such an embodiment, the first opening 1150P and the second opening 1160P may form the first groove GV1.

The pixel-defining layer 220 may be disposed on the second insulating layer 116. The opening 2200P exposing the center portion of the pixel electrode 211 may be defined in the pixel-defining layer 220 in the first area A1. The opening 2200P of the pixel-defining layer 220 may define an emission area of light emitted from the display element DPE. In addition, a third opening 2200P2 defining the first groove GV1 may be defined in the pixel-defining layer 220. In an embodiment, the third opening 2200P2 may overlap the first opening 1150P and the second opening 1160P in a plan view.

In an embodiment, the first dam unit DP1 may be apart from the first area A1 to surround the first groove GV1, and may be arranged in the second area A2. The first dam unit DP1 may be arranged to be adjacent to a boundary between the second area A2 and the separation area VA. In an embodiment, the first dam unit DP1 may include the first insulating layer 115, the second insulating layer 116, and the pixel-defining layer 220. In such an embodiment, the first dam unit DP1 may be defined by the first insulating layer 115, the second insulating layer 116, and the pixel-defining layer 220. In addition, in some embodiments, although not shown in the drawings, the spacer 230 may be further optionally disposed on the pixel-defining layer 220.

In a plan view, a heating electrode 500 may be arranged to overlap the first groove GV1. In an embodiment, the heating electrode 500 may overlap the first opening 1150P and the second opening 1160P. Like the first groove GV1, the heating electrode 500 may be arranged along the perimeter of the extended corner area CCA to surround the first area A1. The heating electrode 500 may be disposed under the interlayer insulating layer 114 to be covered by the inorganic insulating layer IIL, e.g., the interlayer insulating layer 114. In an embodiment, the heating electrode 500 may be disposed between the interlayer insulating layer 114 and the upper gate insulating layer 113.

In an embodiment, the heating electrode 500 may be connected to a heating line, and may generate heat (e.g., by Joule heating or resistive heating) when a current flows therein by a voltage applied through the heating line. The heating electrode 500 may volatilize or decompose organic layers by generating the heat.

In an embodiment, the heating electrode 500 may include a material identical to that of the upper electrode CE2 defining the storage capacitor Cst. In an embodiment, for example, the heating electrode 500 may include at least one selected from Mo, Al, Pt, Pd, Ag, Mg, Au, Ni, Nd, Ir, Cr, Ca, Ti, W, and Cu, for example, Mo, and may be a single layer or multilayer, each layer including at least one selected from the above-described materials. In such an embodiment, the heating electrode 500 and the upper electrode CE2 may be formed in a same layer as each other by a same process. In such an embodiment, the upper electrode CE2 and the heating electrode 500 may be patterned and formed on the upper gate insulating layer 113, and the interlayer insulating layer 114 may be arranged to cover the upper electrode CE2 and the heating electrode 500.

The heating electrode 500 includes a metal of a high resistance and generates more heat as a voltage is applied, and thus, may decompose and remove organic layers around the heating electrode 500, that is, organic layers over the heating electrode 500.

In an embodiment, a heat transfer rate to an upper portion of the heating electrode 500 and a heat transfer rate to a lower portion of the heating electrode 500 may be different from each other. In an embodiment, a heat transfer rate of the upper gate insulating layer 113 disposed under the heating electrode 500 may be less than a heat transfer rate of the interlayer insulating layer 114 disposed over the heating electrode 500. Accordingly, heat generated from the heating electrode 500 is not directed to the lower portion of the heating electrode 500, but may be more efficiently transferred toward the upper portion thereof, and may efficiently remove organic layers disposed over the heating electrode 500.

In an embodiment, the width of the heating electrode 500 may be greater than the width of the first opening 1150P in the first groove GV1. In addition, the width of the heating electrode 500 may be smaller than a width of the second opening 1160P in the first groove GV1. In such an embodiment, the width of the heating electrode 500 may have a value between the width of the first opening 1150P and the width of the second opening 1160P. Accordingly, the heating electrode 500 may remove organic layers arranged in the interlayer insulating layer 114 exposed by the first opening 1150P.

The display element layer DEL may be disposed on the second insulating layer 116. The display element layer DEL may include the display element DPE and the pixel-defining layer 220. The display element DPE may include the pixel electrode 211, the intermediate layer 212 including the emission layer 212*b* arranged to correspond to the pixel electrode 211, and the opposite electrode 213, which are sequentially stacked.

The intermediate layer 212 may further include at least one selected from the first functional layer 212*a* disposed between the pixel electrode 211 and the emission layer 212*b*, and the second functional layer 212*c* disposed between the emission layer 212*b* and the opposite electrode 213. The emission layer 212*b* may be arranged in each pixel in correspondence with the pixel electrode 211, and the first functional layer 212*a*, the second functional layer 212*c*, and the opposite electrode 213 may be integrally formed on an entire surface of the substrate 100 to cover the plurality of pixels PX.

The first functional layer 212*a* and the second functional layer 212*c* may be disconnected or separated from the first groove GV1 of the second area A2. In an embodiment, for example, the first functional layer 212*a* and the second functional layer 212*c* may not be disposed on the upper surface of the interlayer insulating layer 114 exposed by the first opening 1150P. In such an embodiment, the first functional layer 212*a* and the second functional layer 212*c* are continuously arranged from the first area A1, and may be disposed on the pixel-defining layer 220, over the second insulating layer 116, on an inner surface of the second insulating layer 116 defining the second opening 1160P, on an upper portion of the first insulating layer 115 exposed by the second opening 1160P, and on an inner surface of the first insulating layer 115 defining the first opening 1150P. This may be realized by removing the first functional layer 212*a* and the second functional layer 212*c* from the first groove GV1 by Joule heating of the heating electrode 500. Therefore, the first functional layer 212*a* and the second functional layer 212*c* may be disconnected from the first groove GV1, e.g., the upper surface of the interlayer insulating layer 114.

A low-adhesion layer WAL may be disposed on the upper surface of the first insulating layer 115 exposed by the second opening 1160P and on the inner surface of the first insulating layer 115 defining the first opening 1150P in the first groove GV1. In an embodiment, the low-adhesion layer WAL may not be disposed on the upper surface of the interlayer insulating layer 114 exposed by the first opening 1150P. This may be realized by removing the low-adhesion layer WAL including an organic material from the first groove GV1 by Joule heating of the heating electrode 500.

The low-adhesion layer WAL may include a material having weak adhesion to the opposite electrode 213, and the material may have characteristics for allowing the opposite electrode 213 not to be formed on an upper surface of the low-adhesion layer WAL.

In an embodiment, for example, the low-adhesion layer WAL may be formed by using a material, such as [8-quinolinolato lithium] (Liq), N,N-diphenyl-N,N-bis(9-phenyl-9H-carbazol-3-yl)biphenyl-4,4'-diam ine (HT01), N(diphenyl-4-yl)9,9-dimethyl-N-(4(9-phenyl-9H-carbazol-3-yl) phenyl)-9H-fluorene-2-amine (HT211), 2-(4-(9,10-di (naphthalene-2-yl)anthracene-2-yl)phenyl)-1-phenyl-1H-benzo-[D]imidazole (LG201), or the like.

Similar to the first functional layer 212*a* and the second functional layer 212*c*, the opposite electrode 213 may also be disconnected or separated from the first groove GV1 of the second area A2. In an embodiment, for example, the opposite electrode 213 may not be disposed on the upper surface of the interlayer insulating layer 114 exposed by the first opening 1150P. In addition, the opposite electrode 213 may not be disposed on the low-adhesion layer WAL disposed on the upper surface of the first insulating layer 115 exposed by the second opening 1160P and on the inner surface of the first insulating layer 115 defining the first opening 1150P in the first groove GV1. In other words, the opposite electrode 213 may be continuously arranged from the first area A1, and may be disposed on the pixel-defining layer 220, over the second insulating layer 116, and on the inner surface of the second insulating layer 116 defining the second opening 1160P.

The capping layer CPL may be disposed on the opposite electrode 213. Similar to the first functional layer 212*a* and the second functional layer 212*c*, the capping layer CPL may be disconnected or separated from the first groove GV1 of the second area A2. In an embodiment, for example, the capping layer CPL may not be disposed on the upper portion of the interlayer insulating layer 114 exposed by the first opening 1150P. In such an embodiment, similar to the first functional layer 212*a* and the second functional layer 212*c*, the capping layer CPL is continuously arranged from the first area A1, and thus, may be disposed on the pixel-defining layer 220, over the second insulating layer 116, on an inner surface of the second insulating layer 116 defining the second opening 1160P, on the upper portion of the first insulating layer 115 exposed by the second opening 1160P, and on an inner surface of the first insulating layer 115 defining the first opening 1150P. This may be realized by removing the capping layer CPL from the first groove GV1 by Joule heating of the heating electrode 500.

The first functional layer 212*a* and the second functional layer 212*c* may include an organic material, and through at least one selected from the first functional layer 212*a* and the second functional layer 212*c*, external oxygen or moisture may be introduced to the first area A1 through the second area A2. The oxygen or moisture may damage the display element. According to an embodiment, the first functional layer 212*a* and the second functional layer 212*c* may be completely removed from the first groove GV1, e.g., an upper portion of the interlayer insulating layer 114, thereby effectively preventing introduction of external oxygen or moisture and improving reliability of the display panel 10.

The encapsulation layer 300 may be disposed on the capping layer CPL. The encapsulation layer 300 may include at least one inorganic encapsulation layer and at least one organic encapsulation layer. In an embodiment, the encapsulation layer 300 may include the first inorganic encapsulation layer 310, the organic encapsulation layer 320, and the second inorganic encapsulation layer 330, which are sequentially stacked.

Each of the first inorganic encapsulation layer 310 and the second inorganic encapsulation layer 330 may include one or more inorganic insulating materials. The inorganic insulating material may include $Al_2O_3$, $Ta_2O_5$, $HfO_2$, ZnO, $SiO_2$, $SiN_x$, and/or SiON. The organic encapsulation layer 320 may include a polymer-based material. The polymer-based material may include acrylic resin, epoxy-based resin, polyimide, polyethylene, or the like. The acrylic resin may include, for example, PMMA and polyacrylic acid.

At least one inorganic encapsulation layer of the encapsulation layer 300, for example, the first inorganic encapsulation layer 310, may be in direct contact with the interlayer insulating layer 114 in the first groove GV1. In detail, the first inorganic encapsulation layer 310 may be continuously arranged from the first area A1, and may cover an entire surface of the second area A2, for example, the pixel-defining layer 220, an upper portion of the second insulating layer 116, the inner surface of the second insulating layer 116 defining the second opening 1160P, an upper portion of the first insulating layer 115 exposed by the second opening 1160P, the inner surface of the first insulating layer 115 defining the first opening 1150P, and an upper portion of the interlayer insulating layer 114 exposed by the first opening 1150P. Accordingly, an inorganic contact area, in which an inorganic layer and an inorganic layer are in contact with each other to form a seal, may be formed over the first groove GV1, e.g., the interlayer insulating layer 114.

The first inorganic encapsulation layer 310 may continuously extend from the boundary between the separation area VA and the second area A2 to cover side surfaces of the first insulating layer 115 and the second insulating layer 116 and a side surface of the substrate 100.

The organic encapsulation layer 320 may be disposed over the first inorganic encapsulation layer 310. The organic encapsulation layer 320 may be arranged to cover the first area A1 and fill the first groove GV1 of the second area A2. In an embodiment, the organic encapsulation layer 320 may be continuously arranged from the first area A1 to the first dam unit DP1. The organic encapsulation layer 320 may not be arranged beyond an upper portion of the pixel-defining layer 220 of the first dam unit DP1, by the first dam unit DP1. In other words, the organic encapsulation layer 320 may be arranged from the first area A1 to the first dam unit DP1, and may not be arranged at the boundary between the separation area VA and the second area A2.

The second inorganic encapsulation layer 330 may be disposed on the organic encapsulation layer 320. Like the first inorganic encapsulation layer 310, the second inorganic encapsulation layer 330 may continuously extend from the boundary between the separation area VA and the second area A2 to cover the side surfaces of the first insulating layer 115 and the second insulating layer 116 and the side surface of the substrate 100. Therefore, the first inorganic encapsulation layer 310 and the second inorganic encapsulation layer 330 may prevent moisture from flowing in a lateral direction of the display panel 10, for example, through side surfaces of the first functional layer 212*a*, the second functional layer 212*c*, the first insulating layer 115, and the second insulating layer 116.

Although not shown in the drawings, in an embodiment, a second groove (not shown) similar to the first groove GV1 and a second dam unit (not shown) similar to the first dam unit DP1 may be optionally further arranged sequentially on one side of the first dam unit DP1, for example, on a side thereof facing the separation area VA. In such an embodiment, it will be understood that the heating electrode 500 may be disposed on the second groove as described above, and the first functional layer 212*a* and the second functional layer 212*c* may be disconnected or separated from the second groove.

FIGS. 10 to 19 are schematic views showing a method of manufacturing a display panel, according to an embodiment. The method of manufacturing the display panel according to an embodiment may be used for manufacturing an embodiment of the display panel described above, but the disclosure is not limited thereto.

Figure 10:
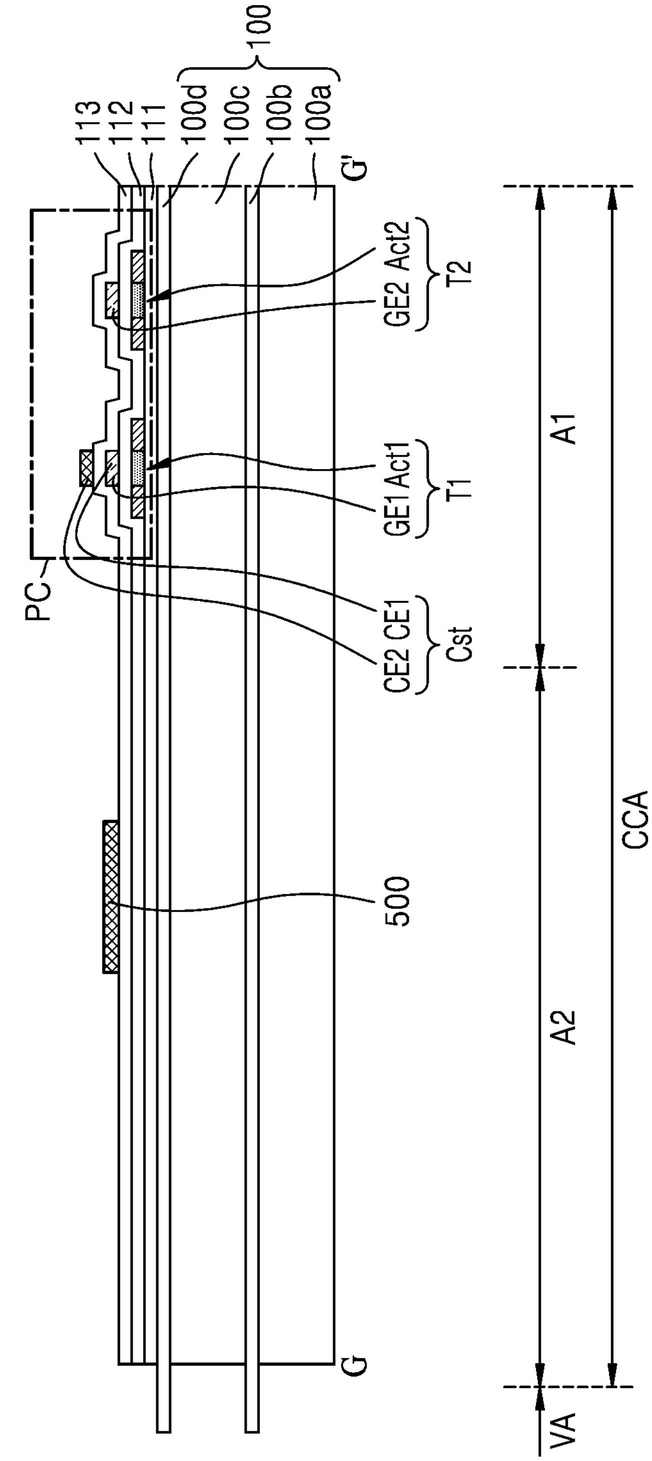
FIGS. 10 to 19 are schematic views showing a method of manufacturing a display panel, according to an embodiment.

Referring to FIG. 10, the upper electrode CE2 and the heating electrode 500 may be provided (e.g., formed or disposed) on the upper gate insulating layer 113. In an embodiment, the heating electrode 500 may include a material identical to that of upper electrode CE2 as described above. In an embodiment, for example, the heating electrode 500 may include at least one selected from Al, Pt, Pd, Ag, Mg, Au, Ni, Nd, Ir, Cr, Ca, Ti, W, and Cu, for example, Mo, and may be a single layer or multilayer, each layer including at least one selected from the above-described materials. As such, the heating electrode 500 may be patterned with a material having a high resistance.

In an embodiment, the heating electrode 500 and the upper electrode CE2 may be provided on a same layer and then patterned in a same process. The heating electrode 500 may be patterned in the second area A2 to surround the first area A1 in which the pixel circuit PC is arranged. In other words, the heating electrode 500 may be patterned along the perimeter of the extended corner area CCA. Accordingly, the heating electrode 500 may be formed to be apart from the upper electrode CE2 in one direction.

Figure 11:
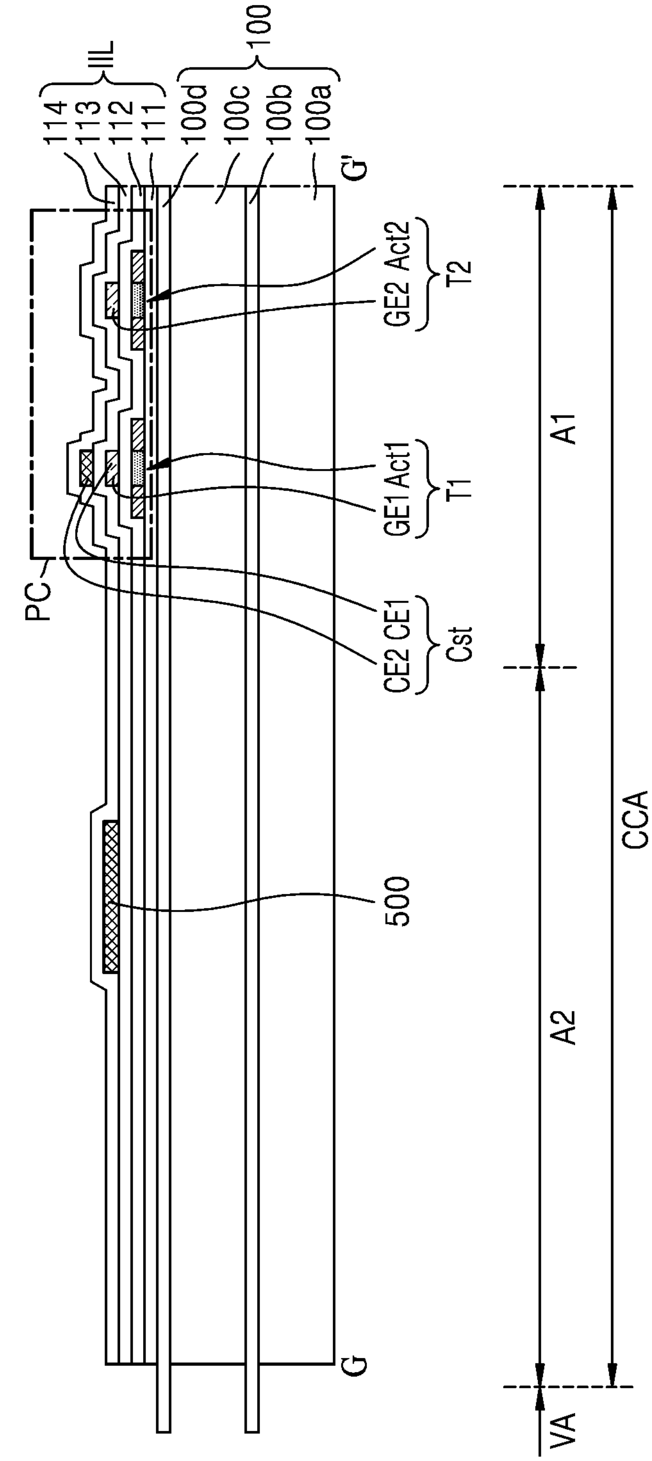

Referring to FIG. 11, the interlayer insulating layer 114 may be provided to cover the upper electrode CE2 and the heating electrode 500. In an embodiment, a thermal conductivity of the interlayer insulating layer 114 may be greater than a thermal conductivity of the upper gate insulating layer 113. Accordingly, when the heating electrode 500 generates heat, the generated heat may be more conducted upward through the interlayer insulating layer 114 having the greater thermal conductivity.

Figure 12:
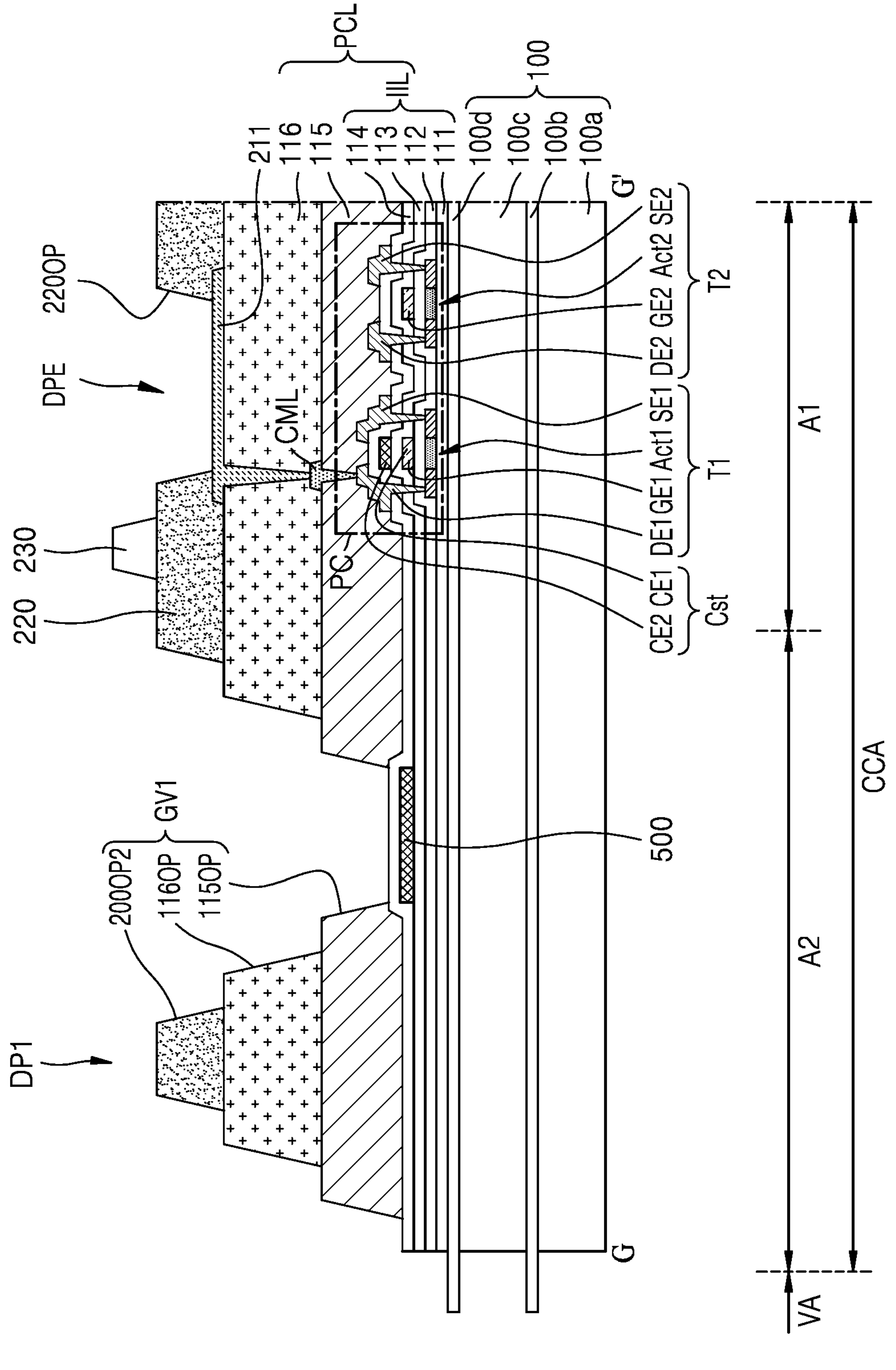

Referring to FIG. 12, the first insulating layer 115, the second insulating layer 116, and the pixel-defining layer 220 may be provided on the interlayer insulating layer 114. In detail, the first insulating layer 115 may be provided to cover the interlayer insulating layer 114, the second insulating layer 116 may be provided on the first insulating layer 115, and the pixel-defining layer 220 may be provided on the second insulating layer 116.

In such an embodiment, the first opening 1150P and the second opening 1160P may be formed through the first insulating layer 115 and the second insulating layer 116, respectively, to form the first groove GV1. In detail, the first opening 1150P and the second opening 1160P may be formed to overlap the heating electrode 500 in a plan view. Accordingly, the first opening 1150P, the second opening 1160P, and the first groove GV1 including the first opening 1150P and the second opening 1160P may be formed to surround the first area A1. In addition, the pixel-defining layer 220 may include the third opening 2200P2 overlapping the first opening 1150P and the second opening 1160P.

In an embodiment, the width (for example, the length in a direction from the first area A1 to the second area A2) of the first opening 1150P may be smaller than the width of the heating electrode 500. In addition, the width of the second opening 1160P may be greater than the width of the first opening 1150P and the width of the heating electrode 500. The first opening 1150P may be formed to expose a portion of the interlayer insulating layer 114 in an area where the first opening 1150P overlaps the heating electrode 500. The second opening 1160P may expose an upper surface of a portion of the first insulating layer 115 defining a boundary of the first opening 1150P, and may be continuously arranged with the first opening 1150P to form one opening exposing an upper surface of the interlayer insulating layer 114.

Figure 13:
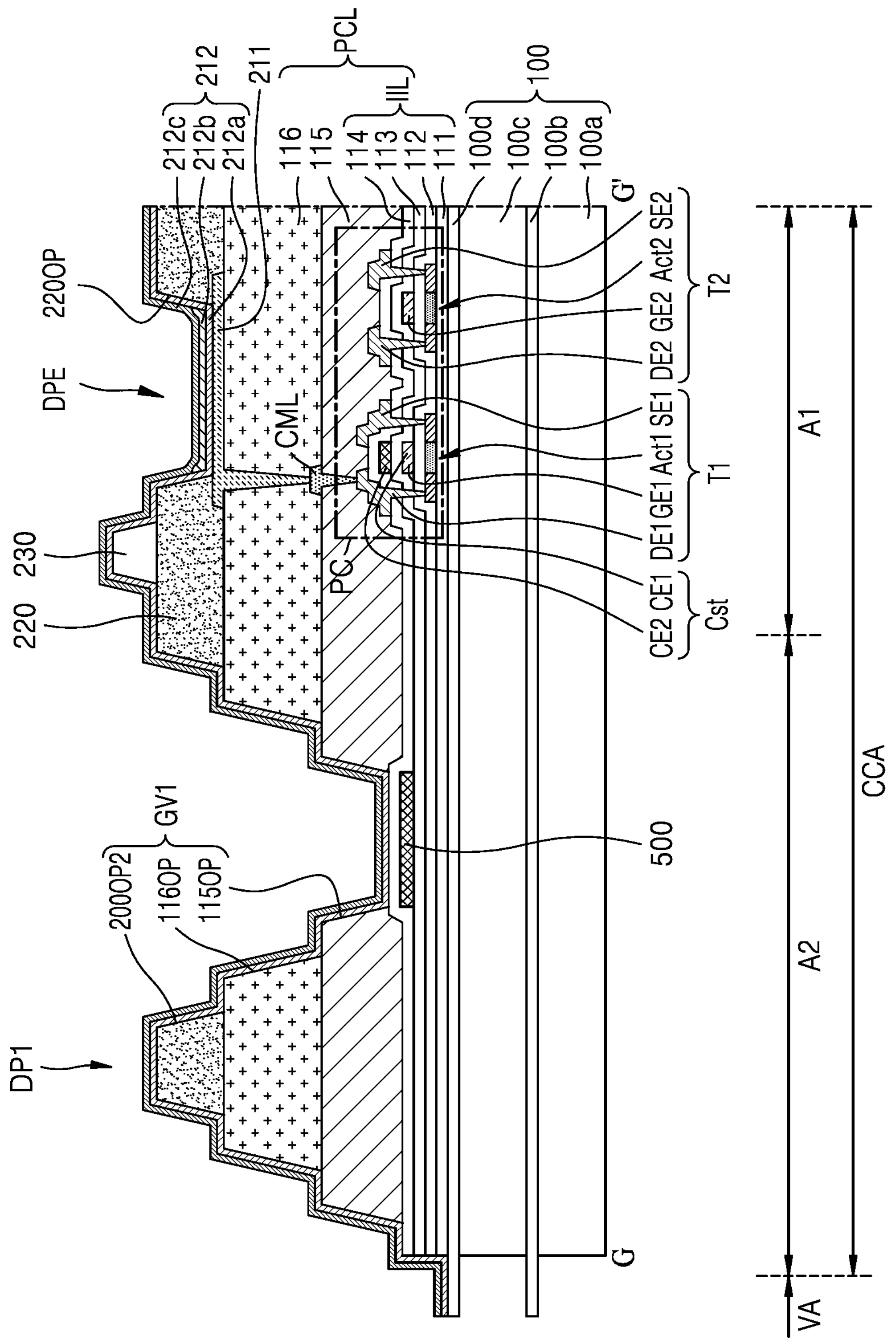

Referring to FIG. 13, the intermediate layer 212 may be provided to cover the first area A1 and the second area A2. In detail, the emission layer 212*b* may be formed in each pixel in correspondence with the pixel electrode 211, and the first functional layer 212*a* and the second functional layer 212*c* may be formed over the first area A1 and the second area A2. In such an embodiment, as described above, each of the first functional layer 212*a* and the second functional layer 212*c* may be an organic material layer including an organic material.

Figure 14:
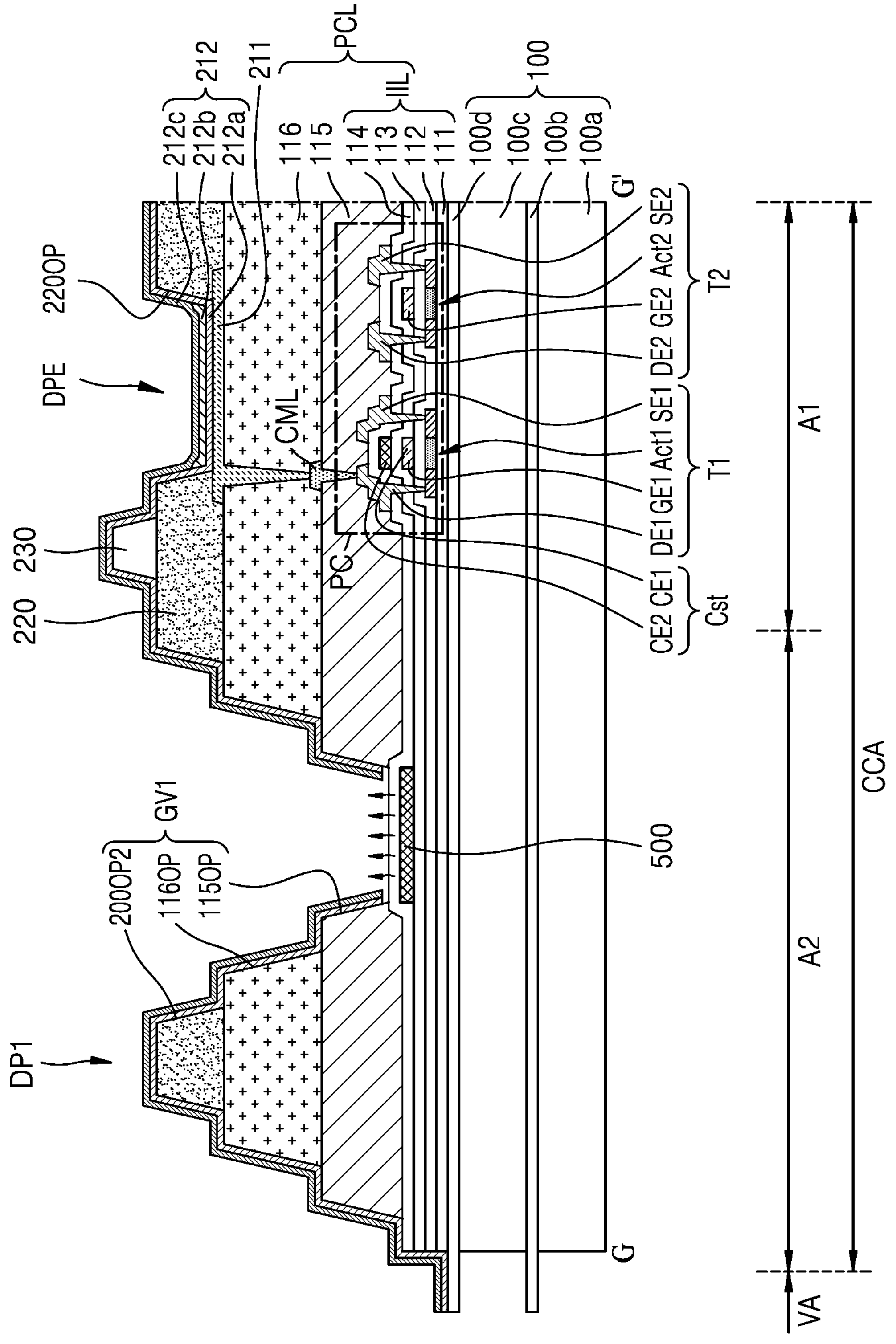

Referring to FIG. 14, a voltage is applied to the heating electrode 500 to generate heat, and accordingly, a portion of the first functional layer 212*a* and the second functional layer 212*c*, which are organic material layers, may be removed. In detail, the first functional layer 212*a* and the second functional layer 212*c* may be decomposed and removed from an upper portion of the interlayer insulating layer 114 overlapping the heating electrode 500 in the first groove GV1 by high heat, for example, high heat of about 350° C. or higher. Accordingly, the first functional layer 212*a* and the second functional layer 212*c* may be disconnected from the first groove GV1.

Figure 15:
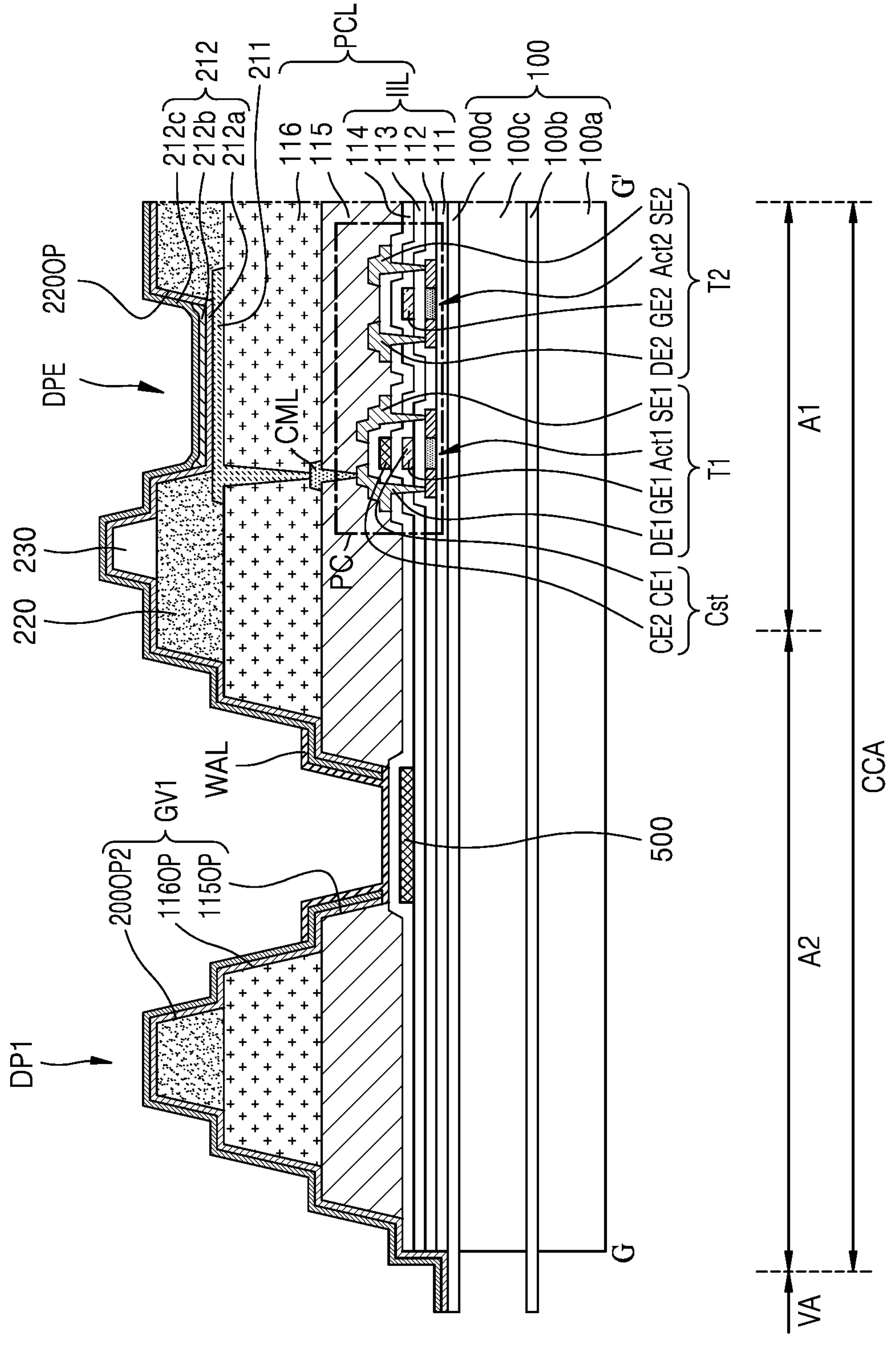

Referring to FIG. 15, the first functional layer 212*a* and the second functional layer 212*c* may be removed, and the low-adhesion layer WAL may be provided on the first groove GV1. In detail, the low-adhesion layer WAL may be formed by a mask patterned to be formed on an upper portion of the first insulating layer 115 exposed by the first opening 1150P and the second opening 1160P. In an embodiment, the low-adhesion layer WAL may be an organic material layer including an organic material.

Figure 16:
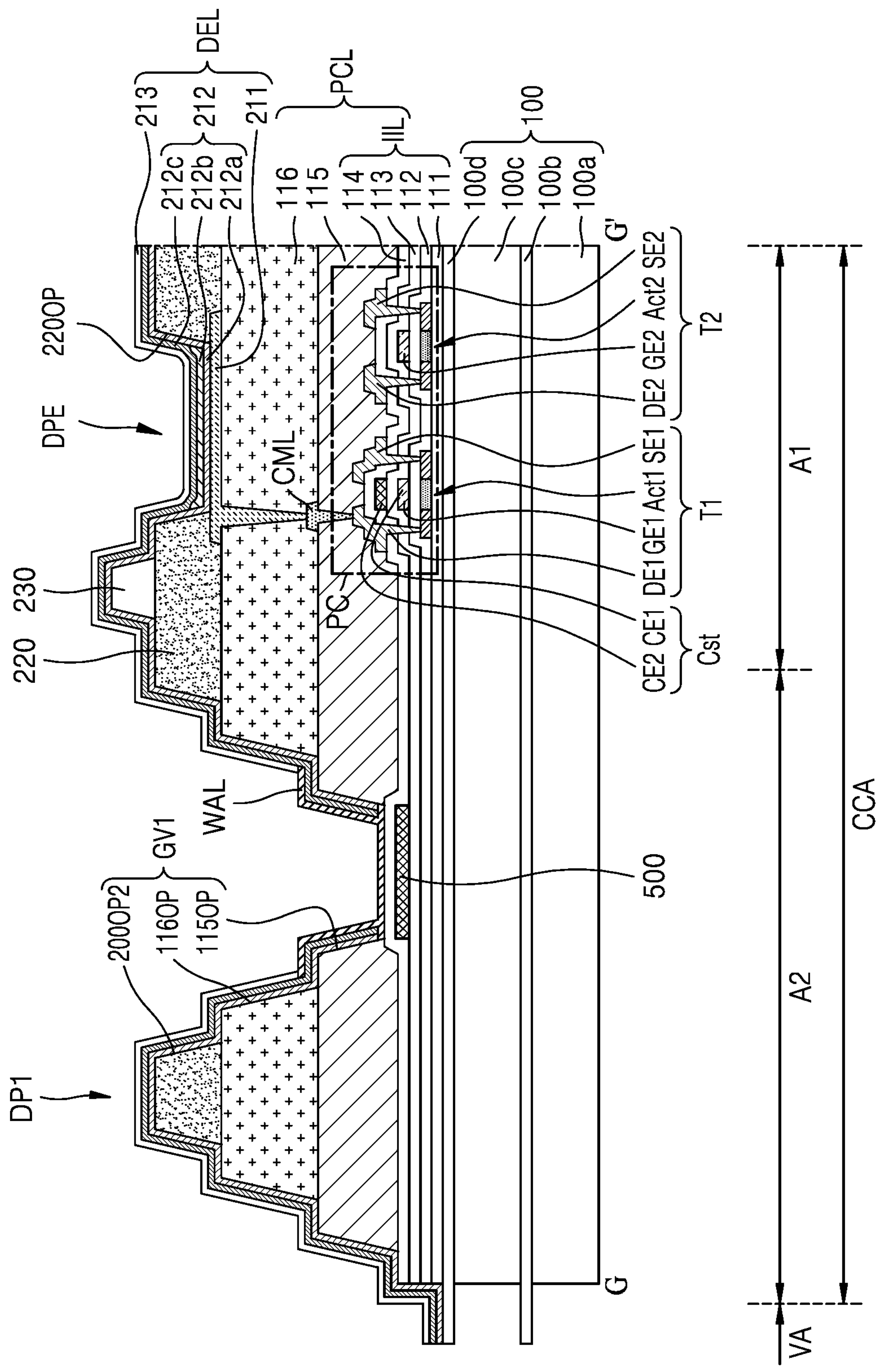

Referring to FIG. 16, the opposite electrode 213 may be provided to cover the first area A1 and the second area A2. In detail, the opposite electrode 213 may be formed by using an open mask, and has weak adhesion to the low-adhesion layer WAL, and thus, the opposite electrode 213 may not be formed on the upper surface of the low-adhesion layer WAL. Accordingly, similar to the first functional layer 212*a* and the second functional layer 212*c*, the opposite electrode 213 may also be disconnected or separated from the first groove GV1 of the second area A2. In an embodiment, for example, the opposite electrode 213 may not be disposed on an upper portion of the interlayer insulating layer 114 exposed by the first opening 1150P. In addition, the opposite electrode 213 may not be disposed on an upper surface of the first insulating layer 115 exposed by the second opening 1160P and on an inner surface of the first insulating layer 115 defining the first opening 1150P in the first groove GV1. In such an embodiment, the opposite electrode 213 may be continuously arranged from the first area A1, and thus, may be disposed on the pixel-defining layer 220, over the second insulating layer 116, and on an inner surface of the second insulating layer 116 defining the second opening 1160P.

Figure 17:
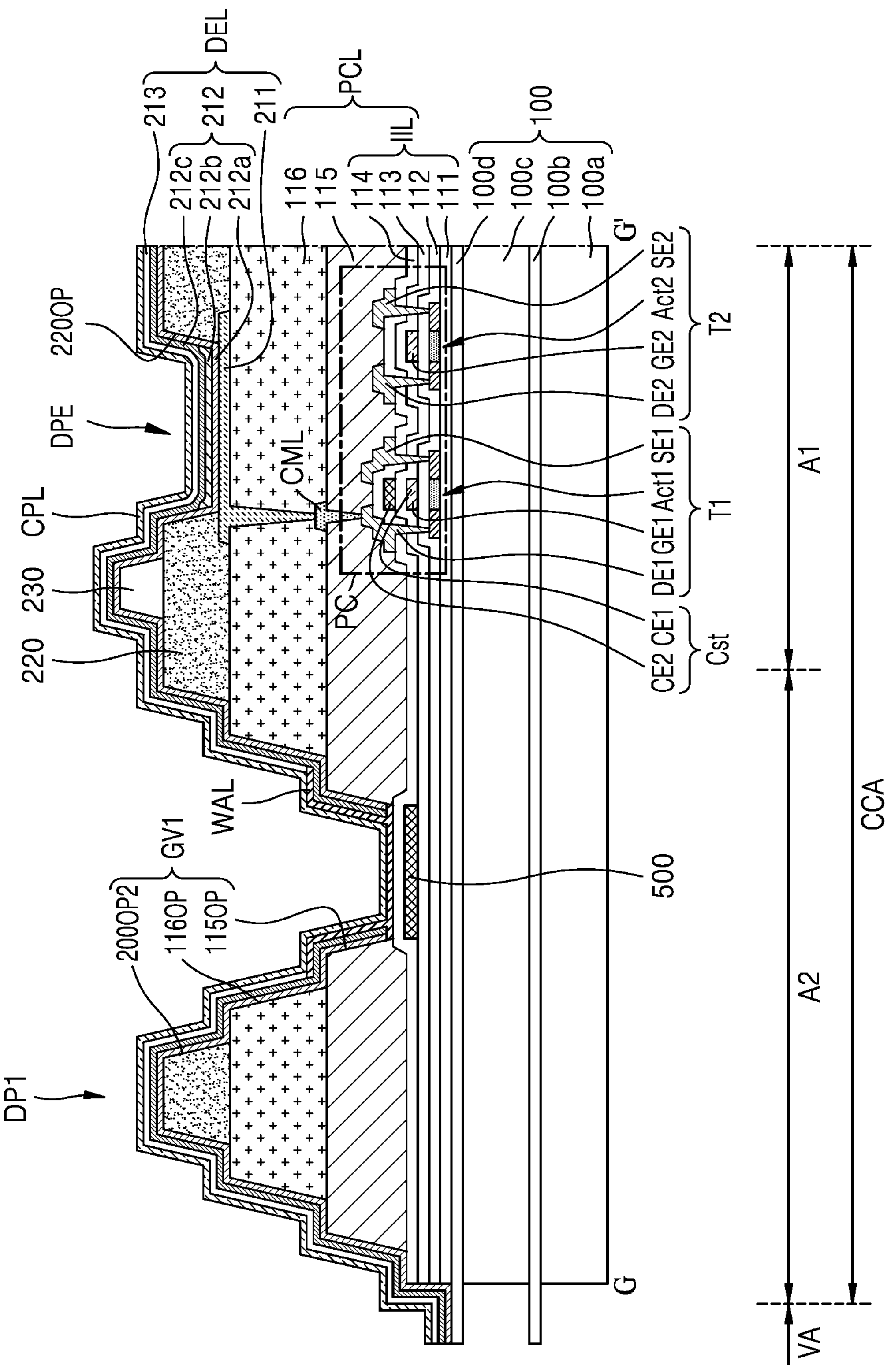
Figure 18:
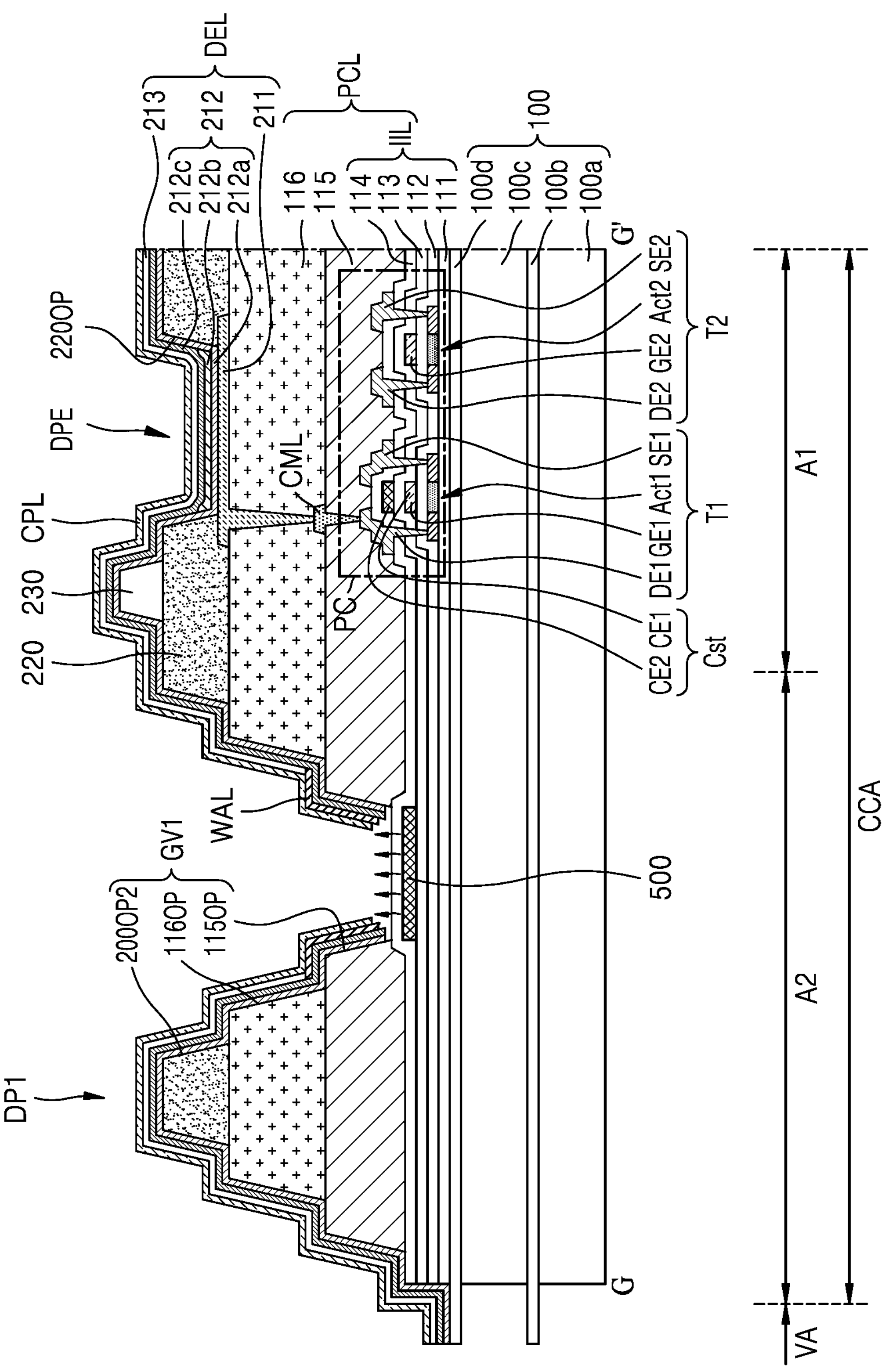

Referring to FIGS. 17 and 18, the capping layer CPL may be provided to cover the first area A1 and the second area A2. In an embodiment, the capping layer CPL may be an organic material layer including an organic material. After the capping layer CPL is provided, a voltage is applied to the heating electrode 500 again to generate heat. Accordingly, a portion of the low-adhesion layer WAL and the capping layer CPL, which are organic material layers, may be removed. In detail, the low-adhesion layer WAL and the capping layer CPL may be decomposed and removed from the upper portion of the interlayer insulating layer 114 overlapping the heating electrode 500 in the first groove GV1 by high heat, for example, high heat of about 350° C. or higher. Accordingly, the low-adhesion layer WAL and the capping layer CPL may be disconnected from the first groove GV1.

Figure 19:
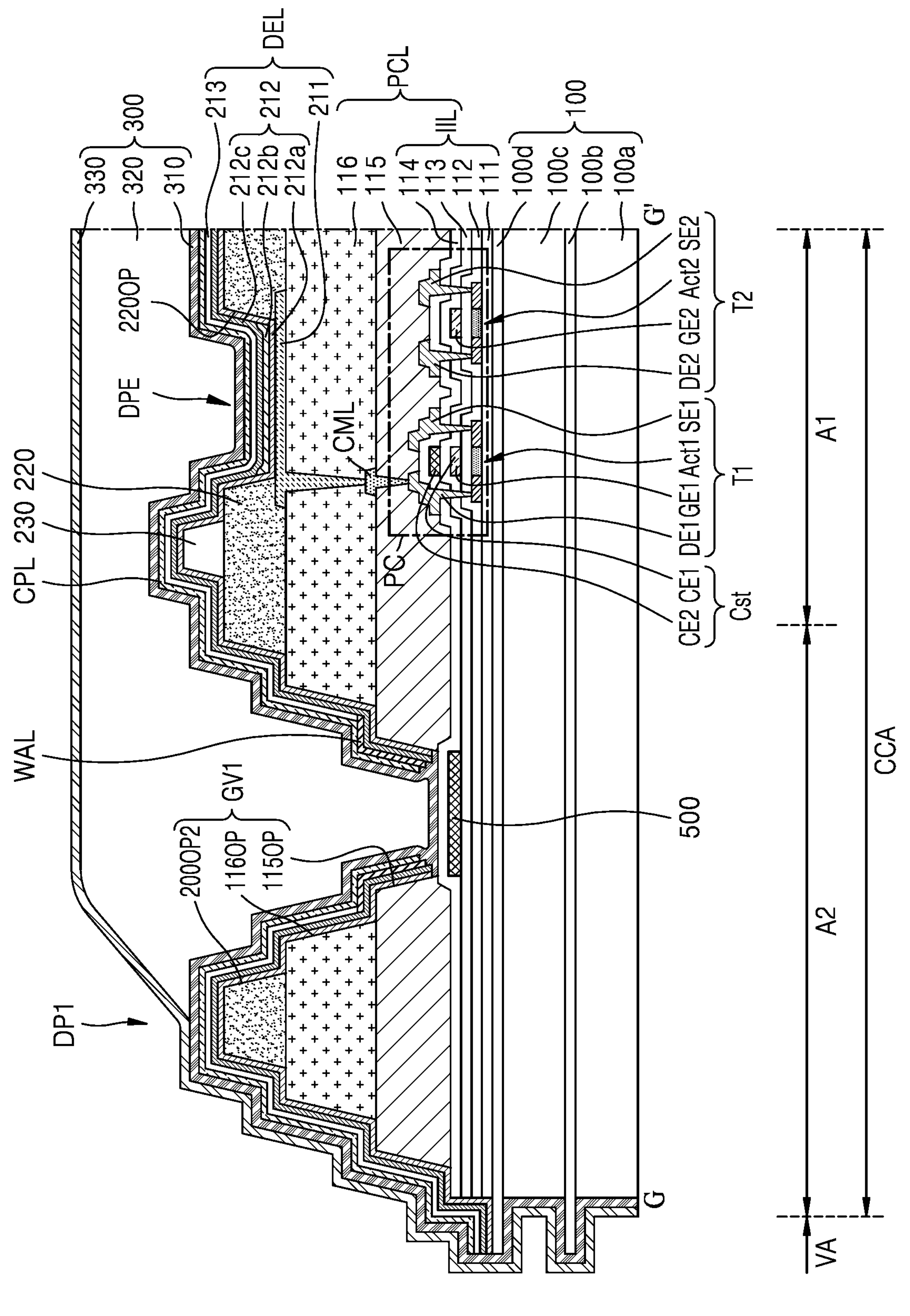

Referring to FIG. 19, the encapsulation layer 300 may be provided to cover the first area A1 and the second area A2. In detail, the first inorganic encapsulation layer 310 may be formed to cover the first area A1 and the second area A2. The first inorganic encapsulation layer 310 may be in direct contact with an area, in which the first inorganic encapsulation layer 310 overlaps the heating electrode 500 in the first groove GV1, that is, an upper surface of the interlayer insulating layer 114 exposed by the first opening 1150P, to form an inorganic contact area. The first inorganic encapsulation layer 310 may be formed to continuously extend from a boundary between the separation area VA and the second area A2 to cover side surfaces of the first insulating layer 115 and the second insulating layer 116 and a side surface of the substrate 100.

The organic encapsulation layer 320 may be provided over the first inorganic encapsulation layer 310. The organic encapsulation layer 320 may be formed to cover the first area A1 and fill the first groove GV1 of the second area A2. In an embodiment, the organic encapsulation layer 320 may be continuously formed from the first area A1 to the first dam unit DP1. In such an embodiment, the organic encapsulation layer 320 may be arranged from the first area A1 to the first dam unit DP1, and may not be arranged at the boundary between the separation area VA and the second area A2.

The second inorganic encapsulation layer 330 may be formed on the organic encapsulation layer 320. In detail, the second inorganic encapsulation layer 330 may be formed to cover the first area A1 and the second area A2. Like the first inorganic encapsulation layer 310, the second inorganic encapsulation layer 330 may continuously extend from the boundary between the separation area VA and the second area A2 to cover the side surfaces of the first insulating layer 115 and the second insulating layer 116 and the side surface of the substrate 100.

According to the manufacturing method according to an embodiment, organic layers may be easily disconnected or separated by using the heating electrode 500. A method of forming an inorganic pattern over the first insulating layer 115 in the first groove GV1 may be used to disconnect or separate the organic layers. According to an embodiment, because the organic layers are disconnected or separated by the heating electrode 500, a separate inorganic pattern may not be formed. Accordingly, a mask for forming an inorganic pattern may not be used, thereby reducing costs and shortening a manufacturing process.

Figure 20:
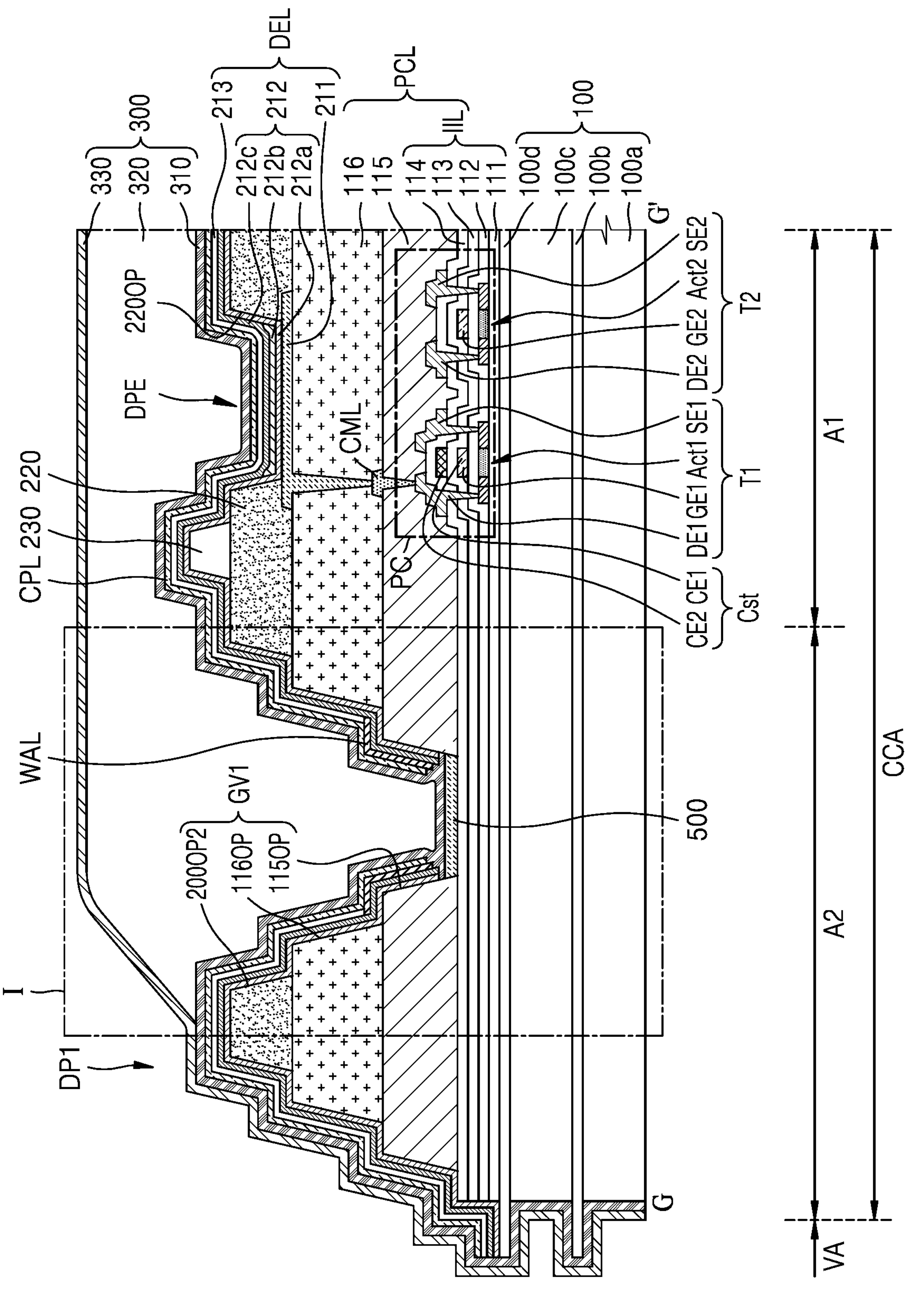
FIG. 20 is a schematic cross-sectional view of the display panel according to an alternative embodiment taken along line G-G' of FIG. 7.
Figure 21:
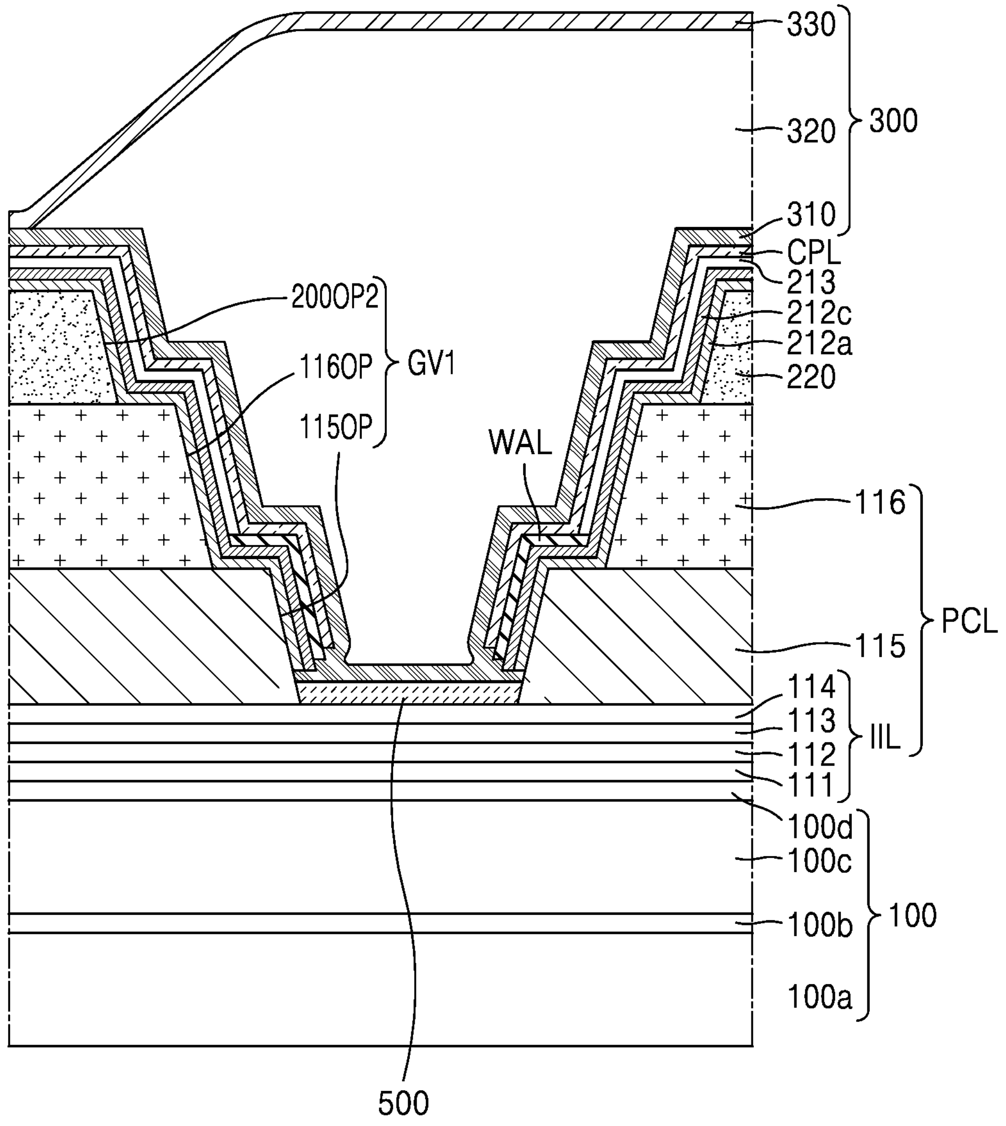
FIG. 21 is an enlarged view of portion I of FIG. 20.

FIG. 20 is a schematic cross-sectional view of the display panel according to an alternative embodiment taken along line G-G' of FIG. 7. FIG. 21 is an enlarged view of portion I of FIG. 20. In an embodiment of FIGS. 20 and 21, the display panel is similar to the above-described display panel, and thus, only differences will be mainly described hereinafter.

Referring to FIGS. 20 and 21, the heating electrode 500 may be arranged to overlap the first groove GV1 in a plan view. In an embodiment, the heating electrode 500 may overlap the first opening 1150P and the second opening 1160P. Like the first groove GV1, the heating electrode 500 may be arranged along the perimeter of the extended corner area CCA to surround the first area A1. The heating electrode 500 may be disposed over the inorganic insulating layer IIL, e.g., the interlayer insulating layer 114. In such an embodiment, the heating electrode 500 may be disposed on an upper portion of the interlayer insulating layer 114 exposed by the first opening 1150P.

In an embodiment, the heating electrode 500 may be connected to a heating line, and may generate heat when a current flows by a voltage applied through the heating line. The heating electrode 500 may volatilize or decompose organic layers by generating the heat.

In an embodiment, the heating electrode 500 may include a material identical to that of the pixel electrode 211. In an embodiment, for example, the heating electrode 500 may include a conductive oxide, such as ITO, IZO, ZnO, $In_2O_3$, IGO, or AZO. In an alternative embodiment, the heating electrode 500 may include a reflective film including Ag, Mg, Al, Pt, Pd, Au, Ni, Nd, Ir, Cr, or a compound thereof. In an alternative embodiment, the heating electrode 500 may further include a film including ITO, IZO, ZnO, or $In_2O_3$ over/under the above-described reflective film. In such an embodiment, the heating electrode 500 and the pixel electrode 211 may be formed by a same process. In such an embodiment, when the pixel electrode 211 is patterned, the heating electrode 500 may be formed to be patterned on the interlayer insulating layer 114 exposed by the first opening 1150P.

In an embodiment, where the heating electrode 500 is arranged to be accommodated in the first opening 1150P, the width of the heating electrode 500 in the first groove GV1 may be substantially the same as the width of the first opening 1150P. However, the disclosure is not limited thereto, and in an alternative embodiment, the width of the heating electrode 500 may be greater than the width of the first opening 1150P. In such an embodiment, it will be understood that the heating electrode 500 may be arranged to extend to an inner surface of the first insulating layer 115 defining the first opening 1150P. Hereinafter, for convenience of description, as shown in FIG. 20, an embodiment where the heating electrode 500 is not disposed on the inner surface of the first insulating layer 115 will be described.

In an embodiment, the width of the heating electrode 500 may be smaller than a width of the second opening 1160P in the first groove GV1. In such an embodiment, the width of the heating electrode 500 may have a value between the width of the first opening 1150P and the width of the second opening 1160P.

The first functional layer 212*a* and the second functional layer 212*c* may be disconnected or separated from the first groove GV1 of the second area A2. In an embodiment, for example, the first functional layer 212*a* and the second functional layer 212*c* may not be disposed on the upper portion of the interlayer insulating layer 114 exposed by the first opening 1150P. In such an embodiment, the first functional layer 212*a* and the second functional layer 212*c* are continuously arranged from the first area A1, and thus, may be disposed on the pixel-defining layer 220, over the second insulating layer 116, on an inner surface of the second insulating layer 116 forming the second opening 1160P, on an upper portion of the first insulating layer 115 exposed by the second opening 1160P, and on an inner surface of the first insulating layer 115 forming the first opening 1150P. This may be realized by removing the first functional layer 212*a* and the second functional layer 212*c* from the first groove GV1 by Joule heating of the heating electrode 500. Therefore, the first functional layer 212*a* and the second functional layer 212*c* may be disconnected from the first groove GV1, e.g., an upper portion of the interlayer insulating layer 114.

The low-adhesion layer WAL may be disposed on an upper surface of the first insulating layer 115 exposed by the second opening 1160P and on the inner surface of the first insulating layer 115 forming the first opening 1150P in the first groove GV1. In an embodiment, the low-adhesion layer WAL may not be disposed on the upper portion of the interlayer insulating layer 114 exposed by the first opening 1150P. This may be realized by removing the low-adhesion layer WAL including an organic material from the first groove GV1 by Joule heating of the heating electrode 500.

Similar to the first functional layer 212*a* and the second functional layer 212*c*, the opposite electrode 213 may also be disconnected or separated from the first groove GV1 of the second area A2. In an embodiment, for example, the opposite electrode 213 may not be disposed on the upper portion of the interlayer insulating layer 114 exposed by the first opening 1150P. In addition, the opposite electrode 213 may not be disposed on the low-adhesion layer WAL disposed on the upper surface of the first insulating layer 115 exposed by the second opening 1160P and on the inner surface of the first insulating layer 115 forming the first opening 1150P in the first groove GV1. In such an embodiment, the opposite electrode 213 may be continuously arranged from the first area A1, and thus, may be disposed on the pixel-defining layer 220, over the second insulating layer 116, and on the inner surface of the second insulating layer 116 defining the second opening 1160P.

The capping layer CPL may be disposed on the opposite electrode 213. Similar to the first functional layer 212*a* and the second functional layer 212*c*, the capping layer CPL may be disconnected or separated from the first groove GV1 of the second area A2. In an embodiment, for example, the capping layer CPL may not be disposed on the upper portion of the interlayer insulating layer 114 exposed by the first opening 1150P. In such an embodiment, similar to the first functional layer 212*a* and the second functional layer 212*c*, the capping layer CPL is continuously arranged from the first area A1, and thus, may be disposed on the pixel-defining layer 220, over the second insulating layer 116, on the inner surface of the second insulating layer 116 forming the second opening 1160P, on the upper portion of the first insulating layer 115 exposed by the second opening 1160P, and on the inner surface of the first insulating layer 115 forming the first opening 1150P. This may be realized by removing the capping layer CPL from the first groove GV1 by Joule heating of the heating electrode 500.

The encapsulation layer 300 may be disposed on the capping layer CPL. At least one inorganic encapsulation layer of the encapsulation layer 300, for example, the first inorganic encapsulation layer 310, may be in direct contact with the heating electrode 500 in the first groove GV1. In detail, the first inorganic encapsulation layer 310 may be continuously arranged from the first area A1, and may cover the entire surface of the second area A2, for example, the pixel-defining layer 220, the upper portion of the second insulating layer 116, the inner surface of the second insulating layer 116 defining the second opening 1160P, the upper portion of the first insulating layer 115 exposed by the second opening 1160P, the inner surface of the first insulating layer 115 defining the first opening 1150P, and an upper portion of the heating electrode 500 disposed on the interlayer insulating layer 114 exposed by the first opening 1150P.

The first inorganic encapsulation layer 310 may continuously extend from the boundary between the separation area VA and the second area A2 to cover side surfaces of the first insulating layer 115 and the second insulating layer 116 and a side surface of the substrate 100.

The organic encapsulation layer 320 may be disposed over the first inorganic encapsulation layer 310. The organic encapsulation layer 320 may be arranged to cover the first area A1 and fill the first groove GV1 of the second area A2. In an embodiment, the organic encapsulation layer 320 may be continuously arranged from the first area A1 to the first dam unit DP1. The organic encapsulation layer 320 may not be arranged beyond an upper portion of the pixel-defining layer 220 of the first dam unit DP1, by the first dam unit DP1. In such an embodiment, the organic encapsulation layer 320 may be arranged from the first area A1 to the first dam unit DP1, and may not be arranged at the boundary between the separation area VA and the second area A2.

The second inorganic encapsulation layer 330 may be disposed on the organic encapsulation layer 320. Like the first inorganic encapsulation layer 310, the second inorganic encapsulation layer 330 may continuously extend from the boundary between the separation area VA and the second area A2 to cover the side surfaces of the first insulating layer 115 and the second insulating layer 116 and the side surface of the substrate 100.

FIGS. 22 to 29 are schematic views showing a method of manufacturing a display panel, according to another embodiment. The method of manufacturing the display panel according to an embodiment shown in FIGS. 22 to 29 may be used for manufacturing an embodiment of the display panel described above with reference to FIGS. 20 and 21, but the disclosure is not limited thereto. In addition, the method of manufacturing the display panel according to an embodiment shown in FIGS. 22 to 29 is similar to the method of manufacturing the display panel described above with reference to FIGS. 10 to 19, and thus, only differences are mainly described hereinafter.

Figure 22:
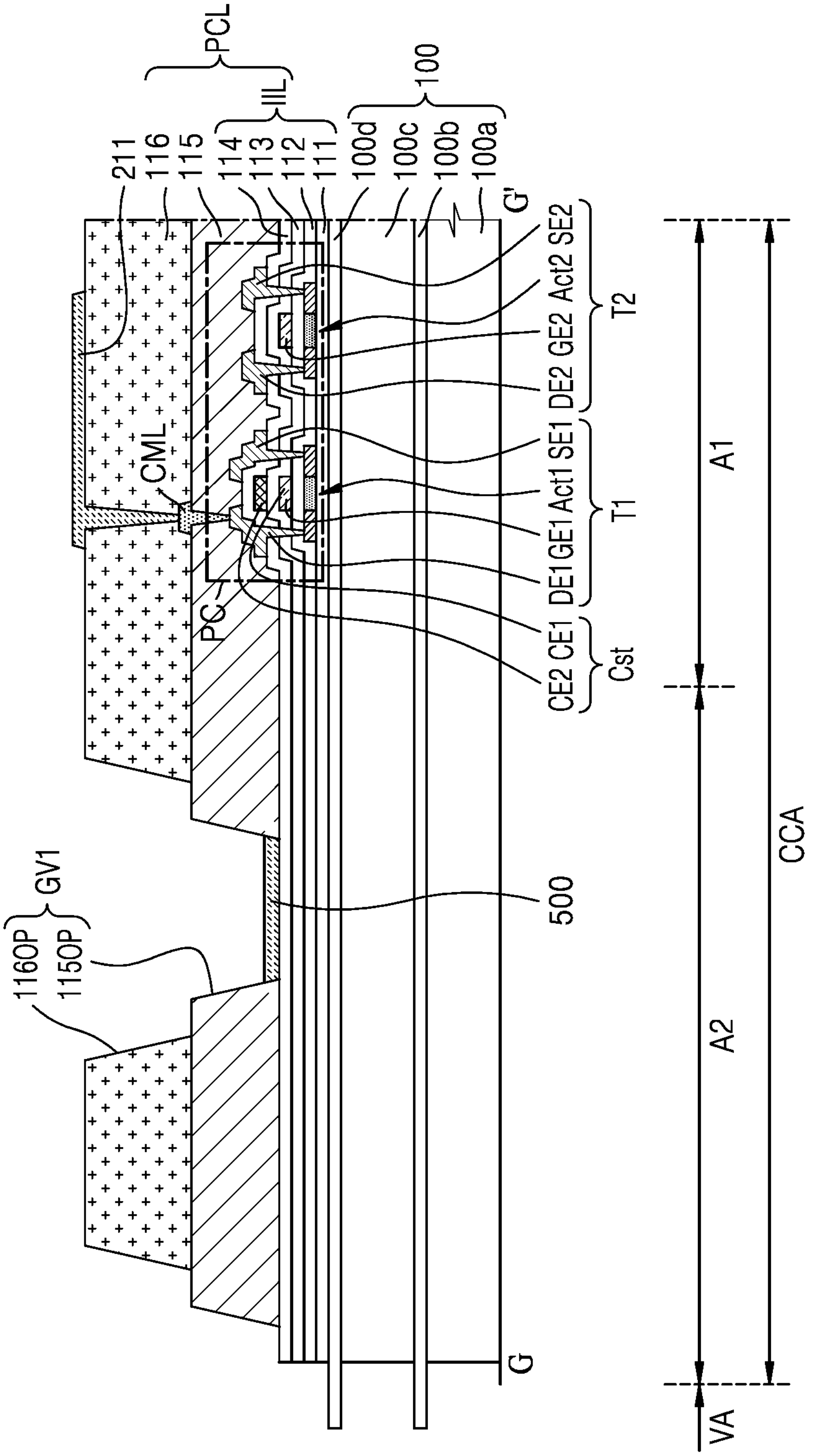
FIGS. 22 to 29 are schematic views showing a method of manufacturing a display panel, according to an alternative embodiment.

Referring to FIG. 22, the first insulating layer 115 and the second insulating layer 116 may be provided on the inorganic insulating layer IIL, for example, the interlayer insulating layer 114. In detail, the first insulating layer 115 may be arranged to cover the interlayer insulating layer 114, and the second insulating layer 116 may be disposed on the first insulating layer 115.

In such an embodiment, the first opening 1150P and the second opening 1160P may be formed through the first insulating layer 115 and the second insulating layer 116, respectively, to form the first groove GV1 in the second area A2. Accordingly, the first opening 1150P, the second opening 1160P, and the first groove GV1 including the first opening 1150P and the second opening 1160P may be formed to surround the first area A1. In addition, a contact hole may be formed through the second insulating layer 116 to expose at least a portion of the connection electrode CML in the first area A1.

Next, the pixel electrode 211 and the heating electrode 500 may be the second insulating layer 116 may include. In such an embodiment, the heating electrode 500 may include a material identical to that of the pixel electrode 211 as described above. In an embodiment, for example, the heating electrode 500 may include a conductive oxide, such as ITO, IZO, ZnO, $In_2O_3$, IGO, or AZO. In an alternative embodiment, the heating electrode 500 may include a reflective film including Ag, Mg, Al, Pt, Pd, Au, Ni, Nd, Ir, Cr, or a compound thereof. In an alternative embodiment, the heating electrode 500 may further include a film including ITO, IZO, ZnO, or $In_2O_3$ over/under the above-described reflective film.

In an embodiment, the heating electrode 500 and the pixel electrode 211 may be patterned in a same process as each other. The heating electrode 500 may be patterned to be accommodated in the second area A2, for example, the first opening 1150P of the first groove GV1, to surround the first area A1 in which the pixel circuit PC is arranged. The heating electrode 500 may be in contact with the interlayer insulating layer 114.

The pixel electrode 211 may be patterned on the second insulating layer 116. The pixel electrode 211 may be electrically connected to the contact hole formed in the second insulating layer 116 to expose at least a portion of the connection electrode CML in the first area A1.

Figure 23:
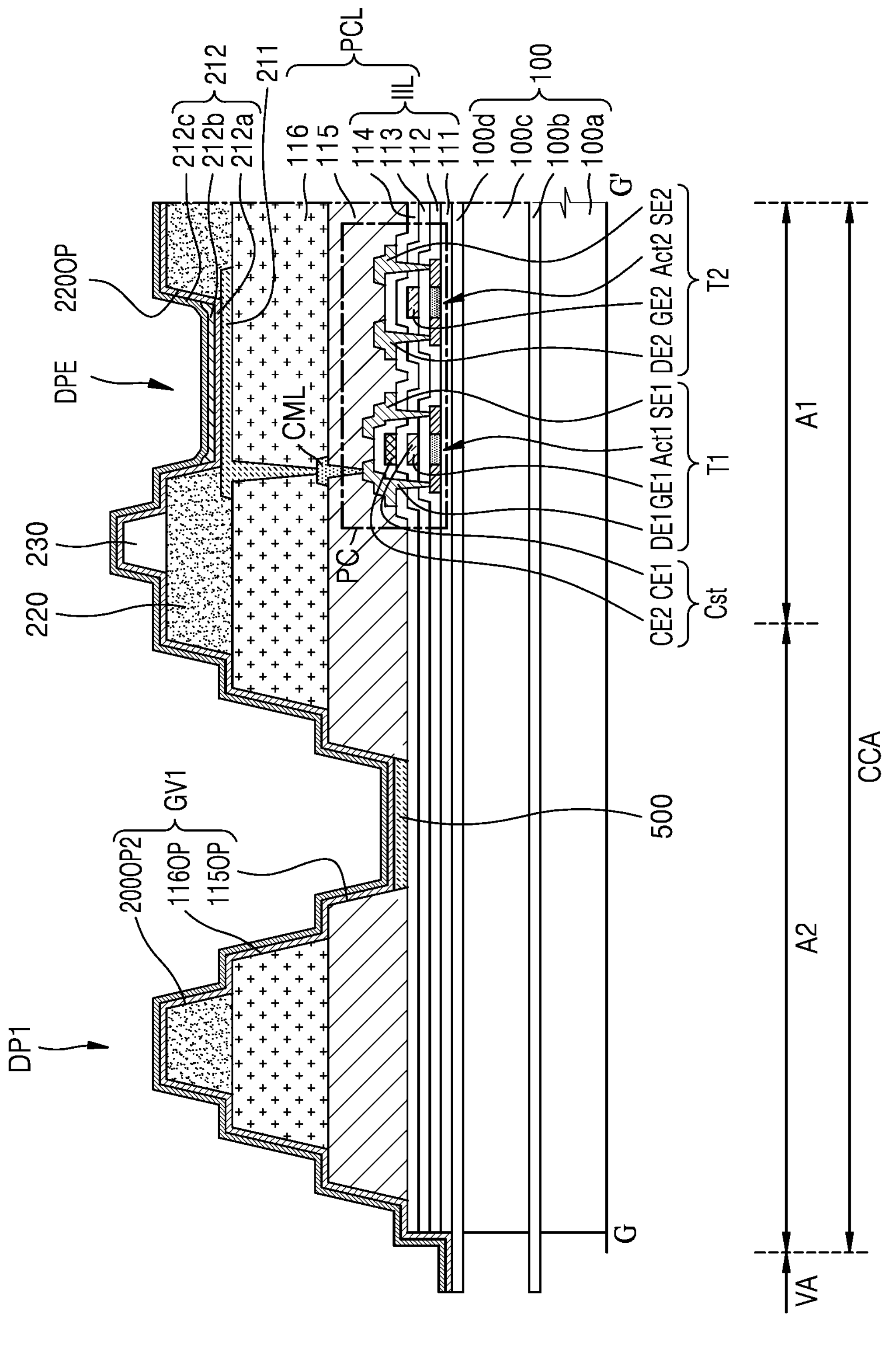

Referring to FIG. 23, the pixel-defining layer 220 may be provided on the second insulating layer 116. The pixel-defining layer 220 may be arranged to have the opening 2200P exposing the center portion of the pixel electrode 211. In addition, the pixel-defining layer 220 may form the first dam unit DP1 in the second area A2. The spacer 230 may be optionally disposed on the pixel-defining layer 220.

Next, the intermediate layer 212 may be provided to cover the first area A1 and the second area A2. In detail, the emission layer 212*b* may be formed in each pixel in correspondence with the pixel electrode 211, and the first functional layer 212*a* and the second functional layer 212*c* may be formed over the first area A1 and the second area A2. In such an embodiment, as described above, each of the first functional layer 212*a* and the second functional layer 212*c* may be an organic material layer including an organic material.

Figure 24:
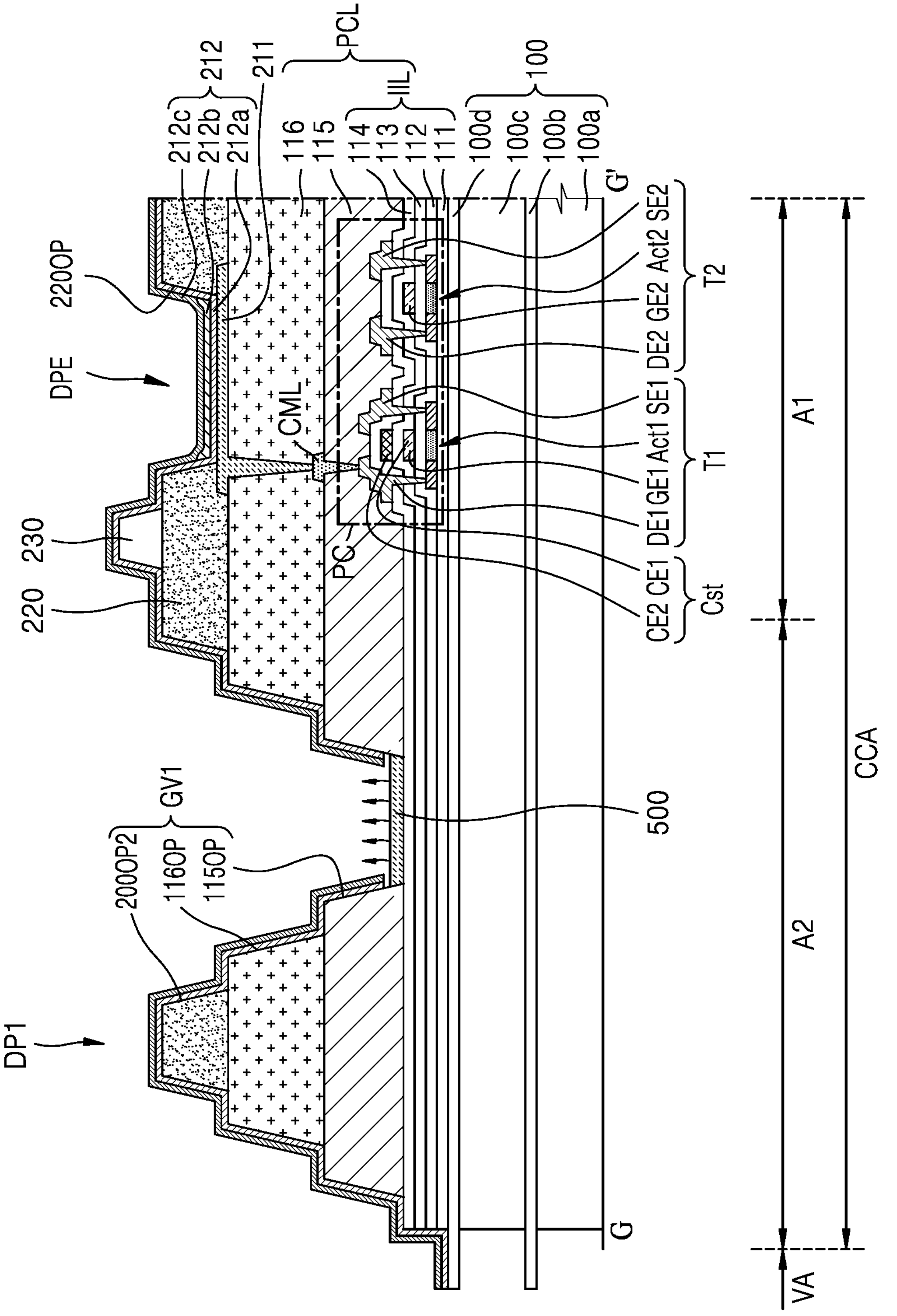

Referring to FIG. 24, a voltage is applied to the heating electrode 500 to generate heat, and accordingly, a portion of the first functional layer 212*a* and the second functional layer 212*c*, which are organic material layers, may be removed. In detail, the first functional layer 212*a* and the second functional layer 212*c* may be decomposed and removed from an upper portion of the heating electrode 500 disposed on the first groove GV1 by high heat, for example, high heat of about 350° C. or higher. Accordingly, the first functional layer 212*a* and the second functional layer 212*c* may be disconnected from the first groove GV1.

Figure 25:
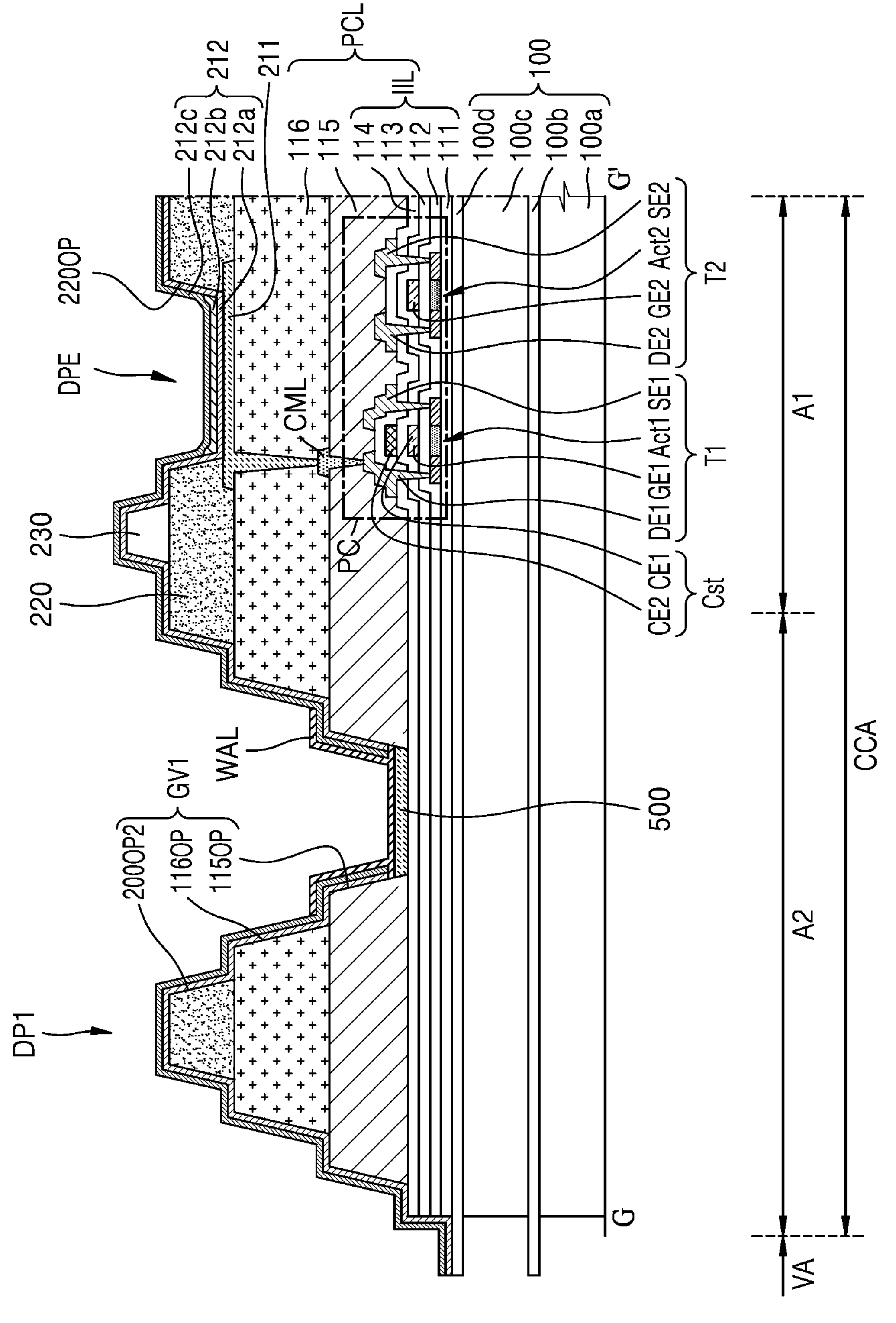

Referring to FIG. 25, the first functional layer 212*a* and the second functional layer 212*c* may be removed, and the low-adhesion layer WAL may be provided on the first groove GV1. In detail, the low-adhesion layer WAL may be formed by a mask patterned to be formed on an upper portion of the first insulating layer 115 exposed by the first opening 1150P and the second opening 1160P. In an embodiment, the low-adhesion layer WAL may be an organic material layer including an organic material.

Figure 26:
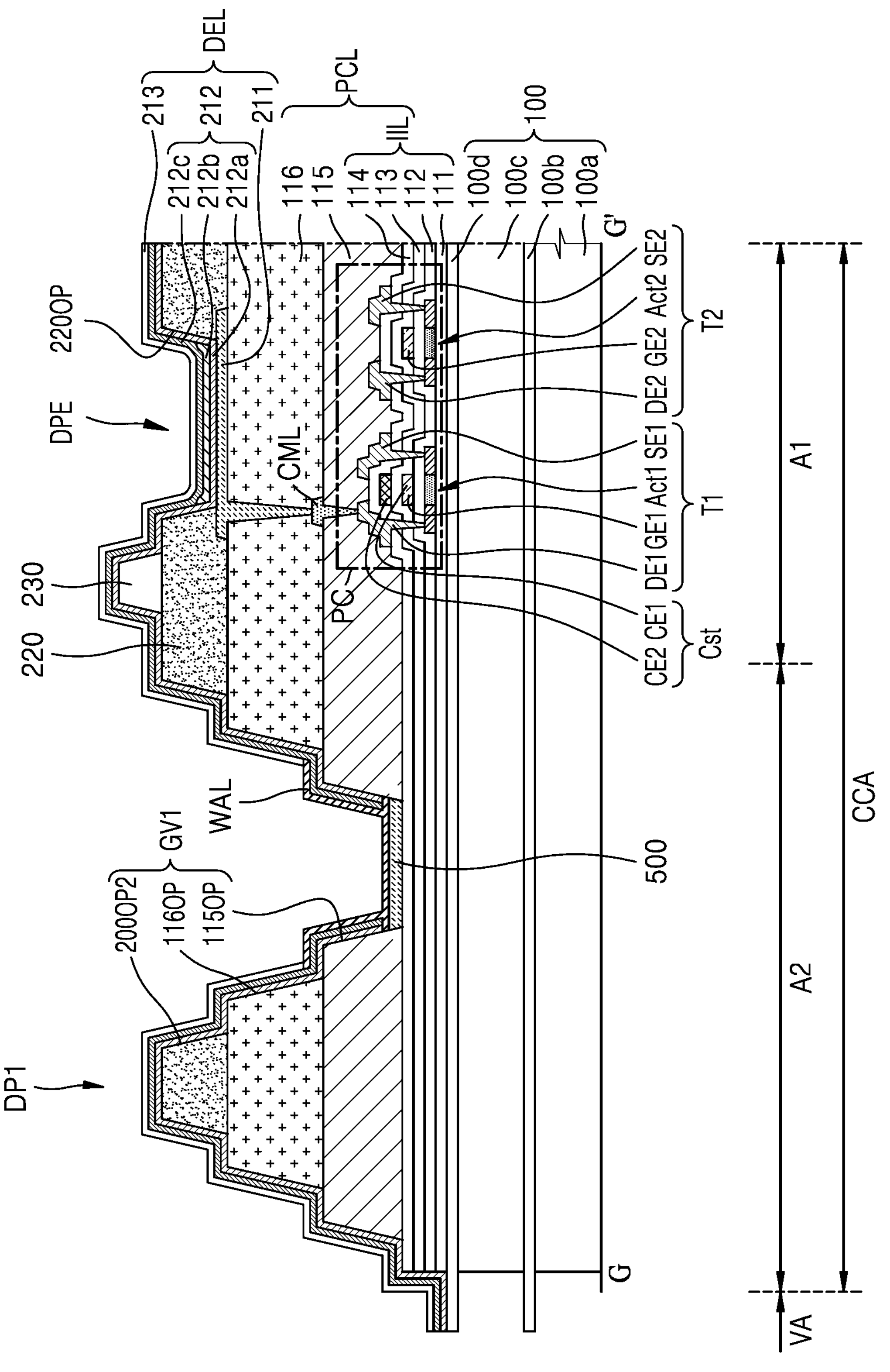

Referring to FIG. 26, the opposite electrode 213 may be provided to cover the first area A1 and the second area A2. In detail, the opposite electrode 213 may be formed by using an open mask, and has weak adhesion to the low-adhesion layer WAL, and thus, the opposite electrode 213 may not be formed on an upper surface of the low-adhesion layer WAL. Accordingly, similar to the first functional layer 212*a* and the second functional layer 212*c*, the opposite electrode 213 may also be disconnected or separated from the first groove GV1 of the second area A2. In an embodiment, for example, the opposite electrode 213 may not be disposed over the heating electrode 500 disposed on the first opening 1150P. In addition, the opposite electrode 213 may not be disposed on an upper surface of the first insulating layer 115 exposed by the second opening 1160P and on an inner surface of the first insulating layer 115 defining the first opening 1150P in the first groove GV1. In other words, the opposite electrode 213 may be continuously arranged from the first area A1, and thus, may be disposed on the pixel-defining layer 220, over the second insulating layer 116, and on an inner surface of the second insulating layer 116 defining the second opening 1160P.

Figure 27:
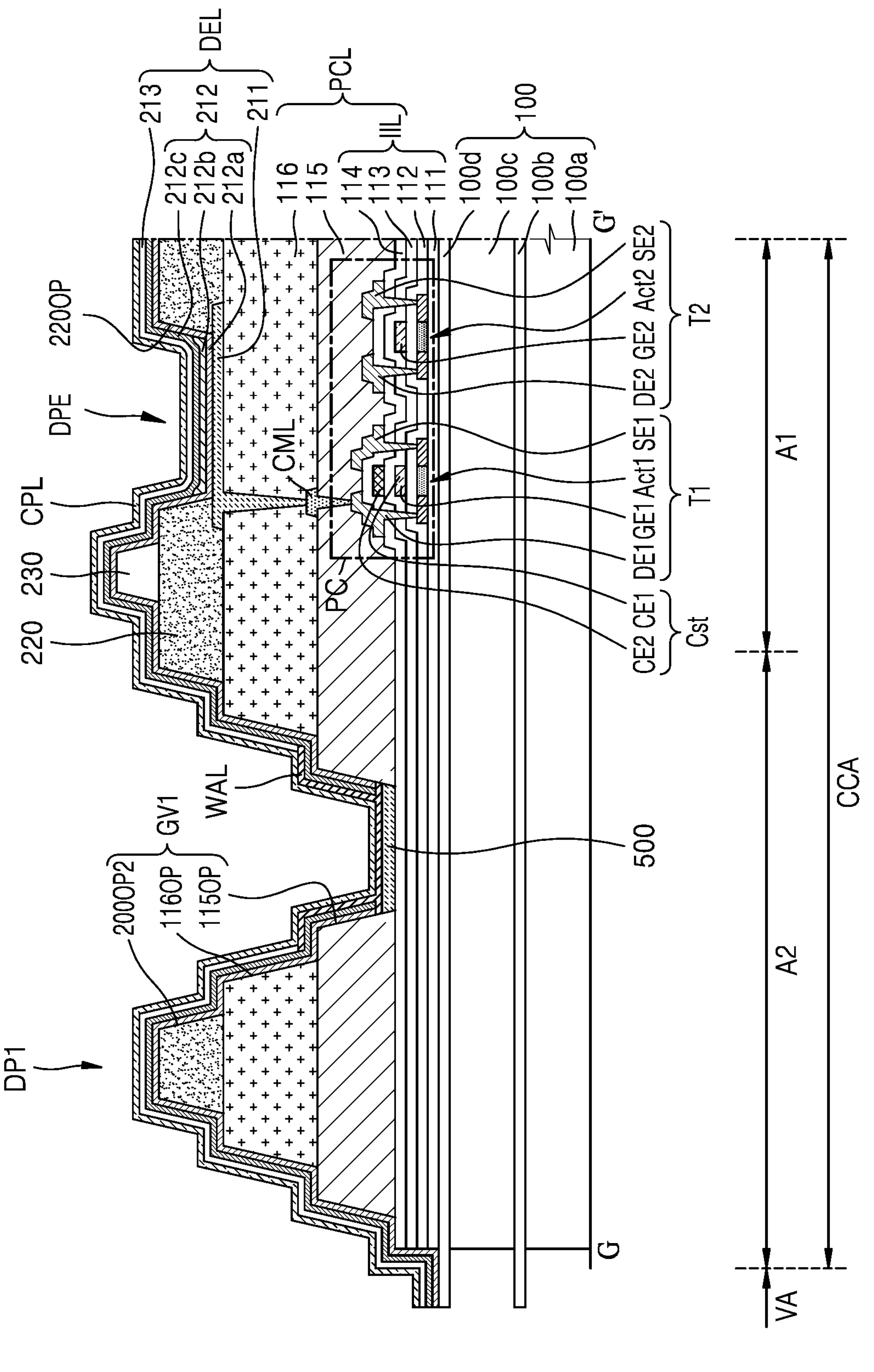
Figure 28:
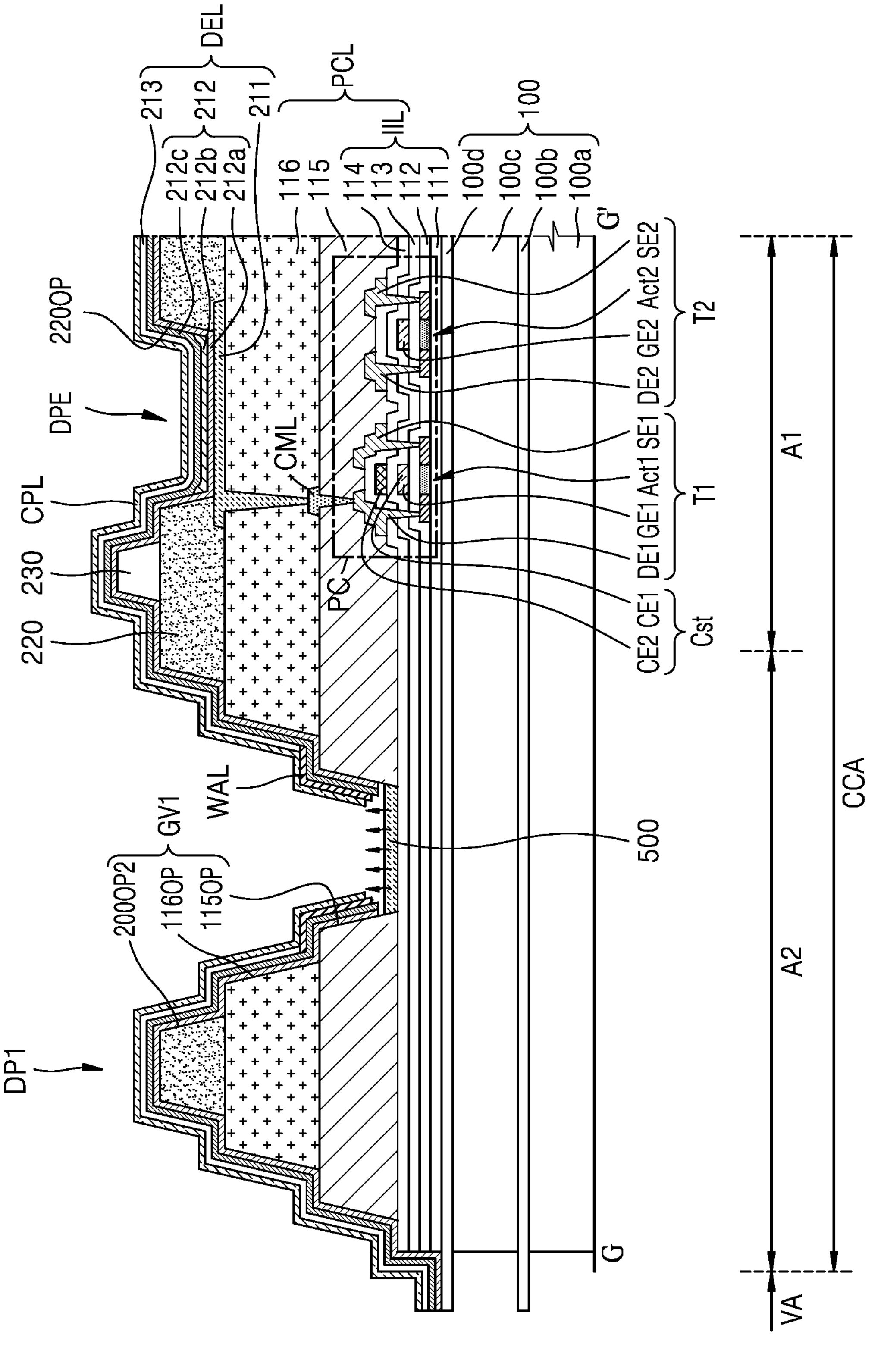

Referring to FIGS. 27 and 28, the capping layer CPL may be provided to cover the first area A1 and the second area A2. In an embodiment, the capping layer CPL may be an organic material layer including an organic material. After the capping layer CPL is formed, a voltage is applied to the heating electrode 500 again to generate heat. Accordingly, a portion of the low-adhesion layer WAL and the capping layer CPL, which are organic material layers, may be removed. In detail, the low-adhesion layer WAL and the capping layer CPL may be decomposed and removed from the upper portion of the heating electrode 500 disposed on the first groove GV1 by high heat, for example, high heat of about 350° C. or higher. Accordingly, the low-adhesion layer WAL and the capping layer CPL may be disconnected from the first groove GV1.

Figure 29:
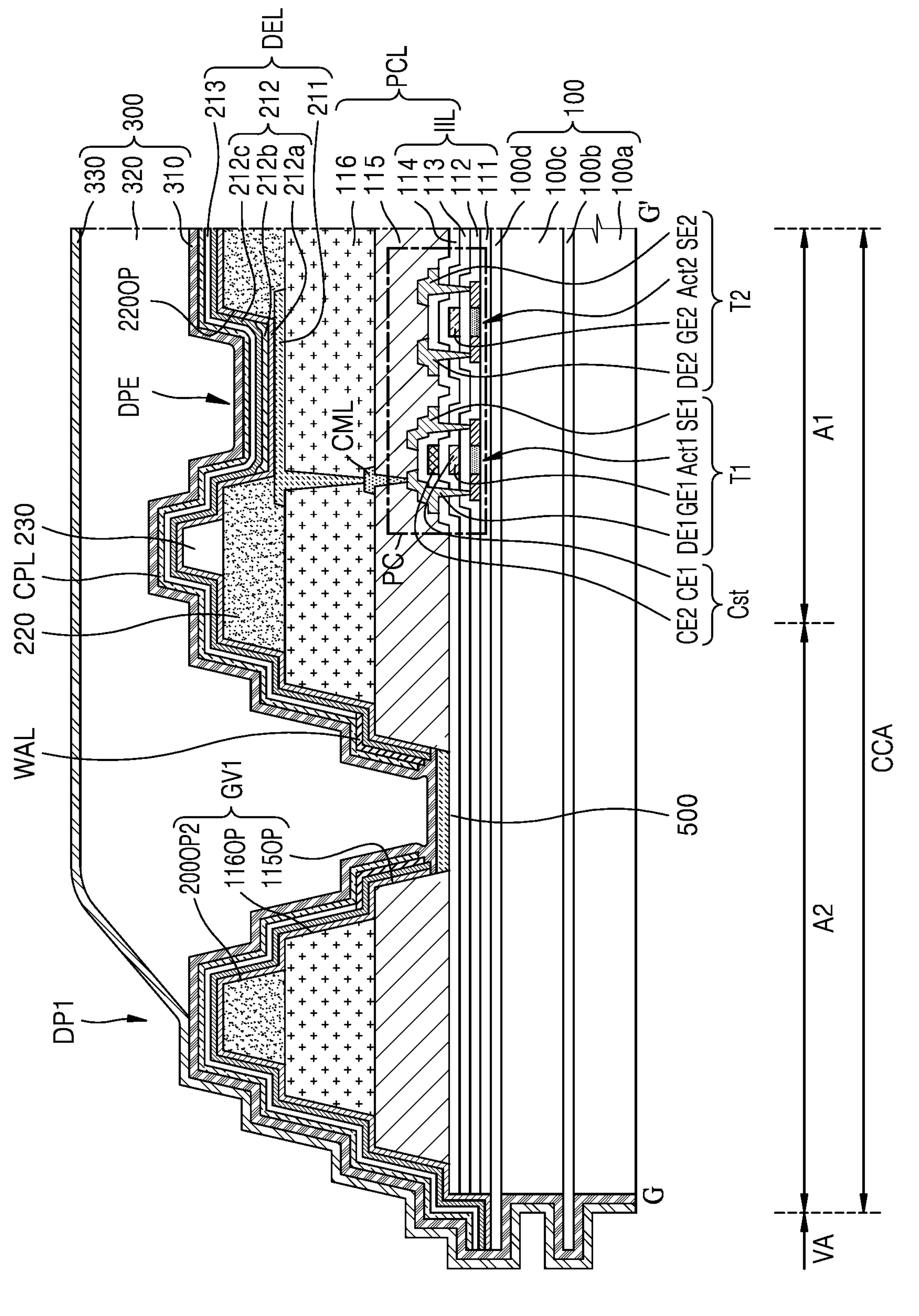

Referring to FIG. 29, the encapsulation layer 300 may be provided to cover the first area A1 and the second area A2. In detail, the first inorganic encapsulation layer 310 may be formed to cover the first area A1 and the second area A2. The first inorganic encapsulation layer 310 may be arranged to be in direct contact with the heating electrode 500 disposed on the first groove GV1. The first inorganic encapsulation layer 310 may be formed to continuously extend from a boundary between the separation area VA and the second area A2 to cover side surfaces of the first insulating layer 115 and the second insulating layer 116 and a side surface of the substrate 100.

The organic encapsulation layer 320 may be provided over the first inorganic encapsulation layer 310. The organic encapsulation layer 320 may be formed to cover the first area A1 and fill the first groove GV1 of the second area A2. In an embodiment, the organic encapsulation layer 320 may be continuously formed from the first area A1 to the first dam unit DP1. In such an embodiment, the organic encapsulation layer 320 may be arranged from the first area A1 to the first dam unit DP1, and may not be arranged at the boundary between the separation area VA and the second area A2.

The second inorganic encapsulation layer 330 may be provided on the organic encapsulation layer 320. In detail, the second inorganic encapsulation layer 330 may be formed to cover the first area A1 and the second area A2. Like the first inorganic encapsulation layer 310, the second inorganic encapsulation layer 330 may continuously extend from the boundary between the separation area VA and the second area A2 to cover the side surfaces of the first insulating layer 115 and the second insulating layer 116 and the side surface of the substrate 100.

Figure 30:
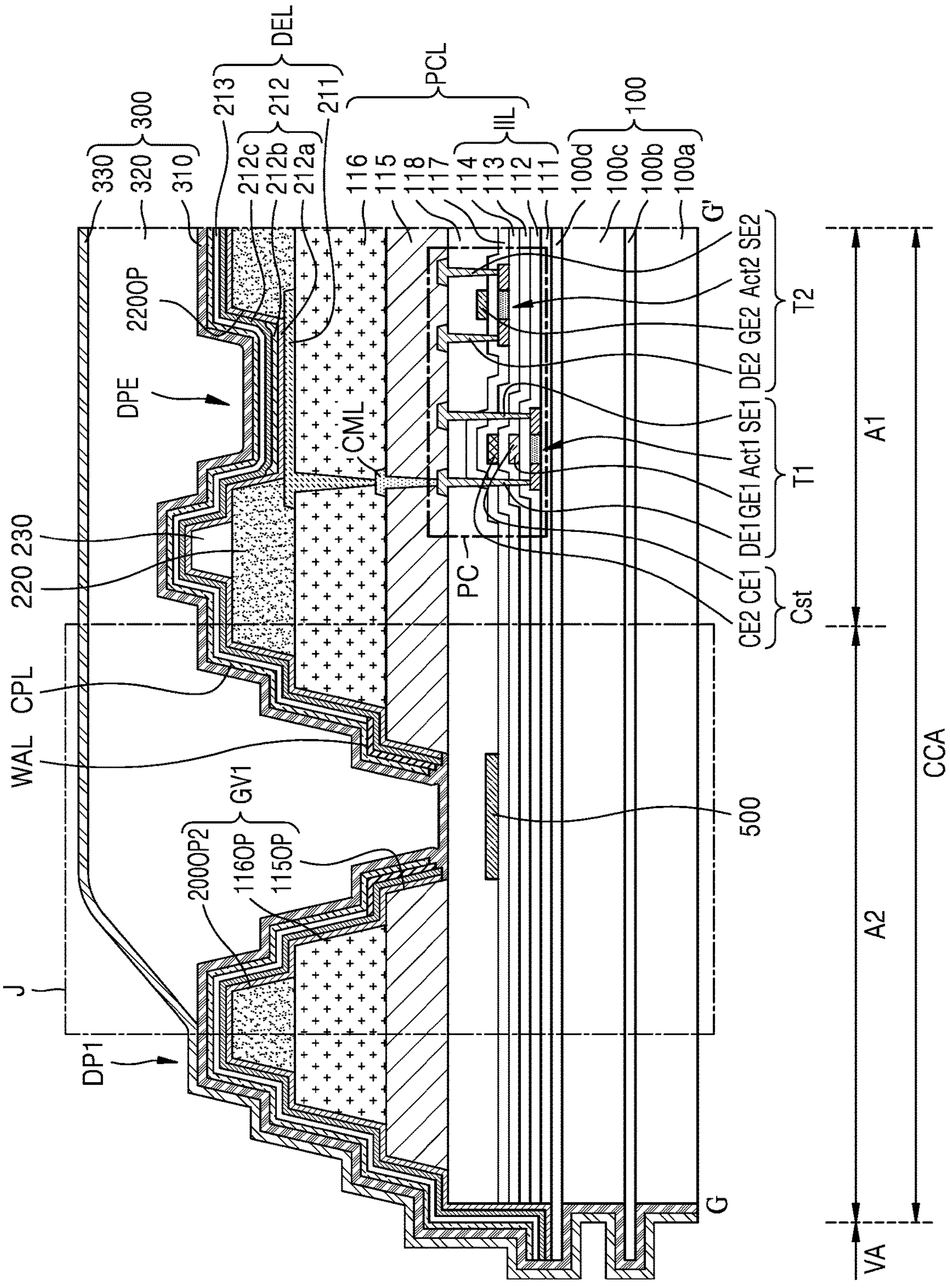
FIG. 30 is a schematic cross-sectional view of the display panel according to another embodiment taken long line G-G' of FIG. 7.
Figure 31:
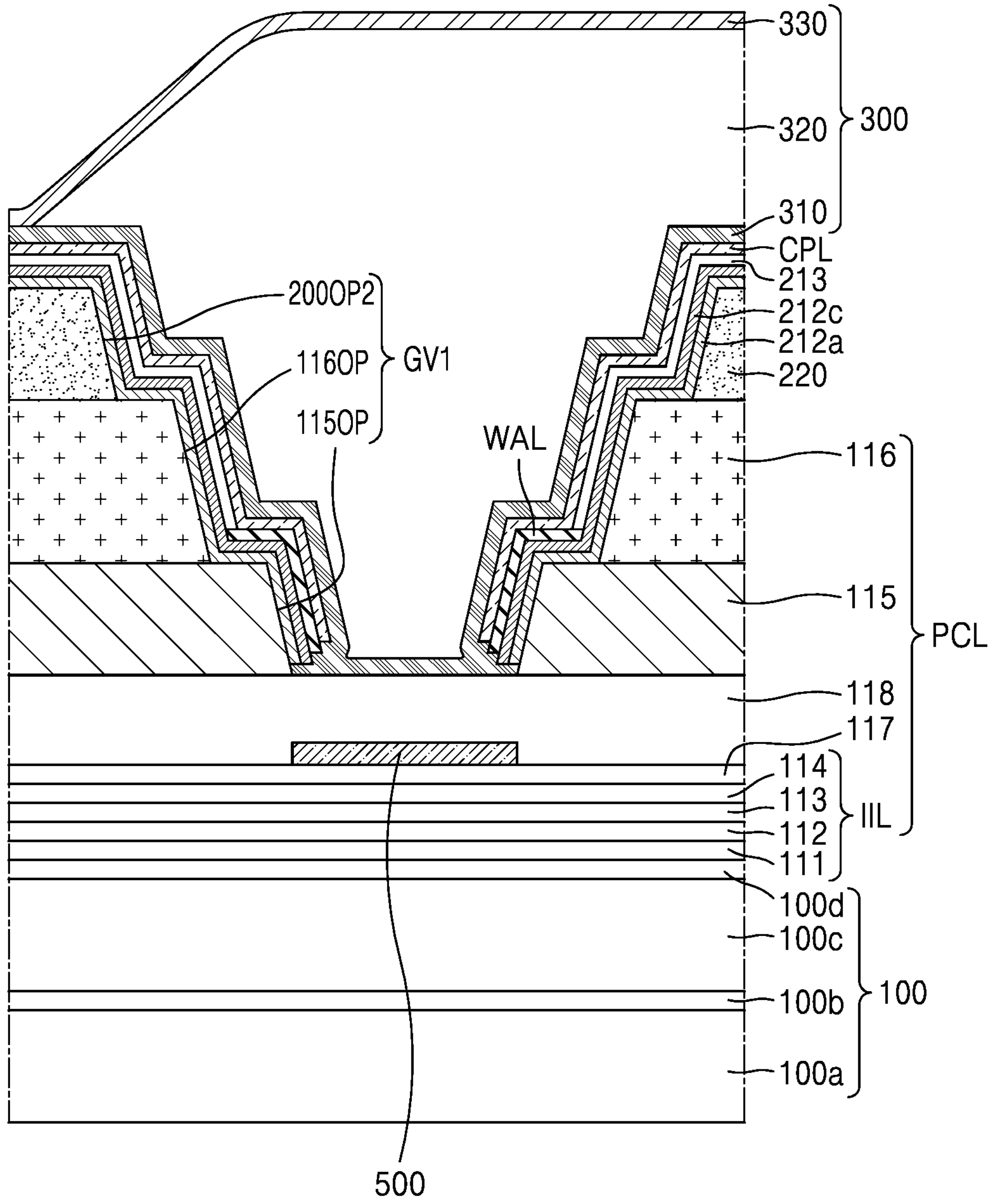
FIG. 31 is an enlarged view of portion J of FIG. 30.

FIG. 30 is a schematic cross-sectional view of the display panel according to an alternative embodiment taken long line G-G' of FIG. 7. FIG. 31 is an enlarged view of portion J of FIG. 30. The display panel according to an embodiment shown in FIGS. 30 and 31 is similar to an embodiment of the display panel described above, and thus, only difference are mainly described hereinafter.

Referring to FIG. 30, an embodiment of the display panel 10 may include the pixel circuit layer PCL, the display element layer DEL, and the encapsulation layer 300 on the substrate 100.

The pixel circuit layer PCL may be disposed on the substrate 100. The pixel circuit layer PCL may include the inorganic insulating layer IIL, the pixel circuit PC, the first insulating layer 115, the connection electrode CML, and the second insulating layer 116.

The inorganic insulating layer IIL may be disposed on the substrate 100. In an embodiment, the inorganic insulating layer IIL may include the buffer layer 111, the lower gate insulating layer 112, the upper gate insulating layer 113, the interlayer insulating layer 114, a middle insulating layer 117, and an upper interlayer insulating layer 118.

The pixel circuit PC may include the first thin-film transistor T1, the second thin-film transistor T2, and the storage capacitor Cst.

The first thin-film transistor T1 may include the first semiconductor layer Act1, the first gate electrode GE1, the first source electrode SE1, and the first drain electrode DE1. The second thin-film transistor T2 may include the second semiconductor layer Act2, the second gate electrode GE2, the second source electrode SE2, and the second drain electrode DE2. The storage capacitor Cst may include the lower electrode CE1 and the upper electrode CE2.

The buffer layer 111 may be disposed on the substrate 100.

The first semiconductor layer Act1 may be disposed on the buffer layer 111. The first semiconductor layer Act1 may include a silicon semiconductor. The first semiconductor layer Act1 may include polysilicon. Alternatively, the first semiconductor layer Act1 may include amorphous silicon. In some embodiments, the first semiconductor layer Act1 may include an oxide semiconductor or an organic semiconductor. The first semiconductor layer Act1 may include a channel region, and a drain region and a source region respectively at opposing sides of the channel region.

The first gate electrode GE1 may overlap the first semiconductor layer Act1. The first gate electrode GE1 may include a low-resistance metal material. The first gate electrode GE1 may include a conductive material including Mo, Al, Cu, Ti, and the like, and may be a multilayer or single layer, each including at least one selected from the above materials.

The lower gate insulating layer 112 may be disposed between the first semiconductor layer Act1 and the first gate electrode GE1. Therefore, the first semiconductor layer Act1 may be insulated from the first gate electrode GE1.

The upper gate insulating layer 113 may cover the first gate electrode GE1. The upper gate insulating layer 113 may be disposed on the first gate electrode GE1.

The upper electrode CE2 may be disposed on the upper gate insulating layer 113. The upper electrode CE2 may overlap the first gate electrode GE1 thereunder. In such an embodiment, the upper electrode CE2 and the first gate electrode GE1 may overlap each other with the upper gate insulating layer 113 therebetween, thereby forming the storage capacitor Cst. In other words, the first gate electrode GE1 of the first thin-film transistor T1 may function as the lower electrode CE1 of the storage capacitor Cst.

As such, the storage capacitor Cst and the first thin-film transistor T1 may overlap each other. In some embodiments, the storage capacitor Cst may not overlap the first thin-film transistor T1.

The interlayer insulating layer 114 may cover the upper electrode CE2. The second semiconductor layer Act2 may be disposed on the interlayer insulating layer 114. In an embodiment, the second semiconductor layer Act2 may include a channel region, and a source region and a drain region respectively at opposing sides of the channel region. The second semiconductor layer Act2 may include an oxide semiconductor. In an embodiment, for example, the second semiconductor layer Act2 may include a Zn oxide, an In—Zn oxide, or a Ga—In—Zn oxide, as a Zn-oxide-based material. Alternatively, the second semiconductor layer Act2 may be a In—Ga—Zn—O (IGZO), In—Sn—Zn—O (ITZO), or In—Ga—Sn—Zn—O (IGTZO) semiconductor containing a metal such as In, Ga, or Sn in $ZnO_x$.

The source region and the drain region of the second semiconductor layer Act2 may be formed by adjusting carrier concentration of the oxide semiconductor to make the oxide semiconductor conductive. In an embodiment, for example, the source region and the drain region of the second semiconductor layer Act2 may be formed by increasing carrier concentration via plasma treatment using hydrogen-based gas, fluorine-based gas, or a combination thereof on the oxide semiconductor.

The middle insulating layer 117 may cover the second semiconductor layer Act2. In an embodiment, the middle insulating layer 117 may be entirely disposed over the first area A1 and the second area A2. In an alternative embodiment, the middle insulating layer 117 may be patterned according to the shape of the second gate electrode GE2. The middle insulating layer 117 may include $SiO_2$, $SiN_x$, SiON, $Al_2O_3$, $TiO_2$, $Ta_2O_5$, $HfO_2$, or $ZnO_x$. The middle insulating layer 117 may be a single layer or multilayer, each layer including at least one selected from the above-described inorganic insulating materials.

The second gate electrode GE2 may be disposed on the middle insulating layer 117. The second gate electrode GE2 may overlap the second semiconductor layer Act2. The second gate electrode GE2 may overlap the channel region of the second semiconductor layer Act2. The second gate electrode GE2 may include a conductive material including Mo, Al, Cu, Ti, or the like, and may be a multilayer or single layer, each including at least one selected from the above materials.

In some embodiments, a third gate electrode may be disposed under the second semiconductor layer Act2 to overlap the second semiconductor layer Act2.

The upper interlayer insulating layer 118 may cover the second gate electrode GE2. The upper interlayer insulating layer 118 may include $SiO_2$, $SiN_x$, SiON, $Al_2O_3$, $TiO_2$, $Ta_2O_5$, $HfO_2$, or $ZnO_x$. The upper interlayer insulating layer 118 may be a single layer or multilayer, each layer including at least one selected from the above-described inorganic insulating materials.

The first source electrode SE1 and the first drain electrode DE1 may be disposed on the upper interlayer insulating layer 118. The first source electrode SE1 and the first drain electrode DE1 may be connected to the first semiconductor layer Act1. The first source electrode SE1 and the first drain electrode DE1 may be connected to the first semiconductor layer Act1 via a contact hole of an insulating layer.

The second source electrode SE2 and the second drain electrode DE2 may be disposed on the upper interlayer insulating layer 118. The second source electrode SE2 and the second drain electrode DE2 may be electrically connected to the second semiconductor layer Act2. The second source electrode SE2 and the second drain electrode DE2 may be electrically connected to the second semiconductor layer Act2 via a contact hole of the middle insulating layer 117 and a contact hole of the upper interlayer insulating layer 118.

The first source electrode SE1, the first drain electrode DE1, the second source electrode SE2, and the second drain electrode DE2 may include a material exhibiting high conductivity. The first source electrode SE1, the first drain electrode DE1, the second source electrode SE2, and the second drain electrode DE2 may include a conductive material including Mo, Al, Cu, or Ti, and may be formed as a single layer or multilayer, each layer including at least one selected from the above-described materials. In an embodiment, the first source electrode SE1, the first drain electrode DE1, the second source electrode SE2, and the second drain electrode DE2 may have a multilayer structure of Ti/Al/Ti.

The first thin-film transistor T1 including the first semiconductor layer Act1 including a silicon semiconductor has high reliability, and thus, may be employed as a driving thin-film transistor to realize the high-quality display panel 10.

Because the oxide semiconductor has high carrier mobility and low leakage current, a voltage drop may not be large even when a driving time is long. In other words, because a change in color of an image according to a voltage drop is not large even during low-frequency driving, the low-frequency driving is possible. As such, the oxide semiconductor has low leakage current, and thus, leakage current may be prevented and power consumption may be reduced at the same time, by employing the oxide semiconductor in at least one of other thin-film transistors other than the driving thin-film transistor. In an embodiment, for example, the second thin-film transistor T2 may include the second semiconductor layer Act2 including the oxide semiconductor.

The first insulating layer 115 and the second insulating layer 116 may be disposed on the upper interlayer insulating layer 118. The first insulating layer 115 may cover and be disposed on the first source electrode SE1, the first drain electrode DE1, the second source electrode SE2, and the second drain electrode DE2.

The connection electrode CML may be disposed on the first insulating layer 115. In an embodiment, the connection electrode CML may be connected to the first drain electrode DE1 or the first source electrode SE1 through a contact hole of the first insulating layer 115.

The second insulating layer 116 may cover and be disposed on the connection electrode CML and the first insulating layer 115.

The display element layer DEL may be disposed on the pixel circuit layer PCL. The display element layer DEL may include the display element DPE, the pixel-defining layer 220, and the spacer 230. The display element DPE may be electrically connected to the connection electrode CML via a contact hole of the second insulating layer 116. The display element DPE may include the pixel electrode 211, the intermediate layer 212, and the opposite electrode 213.

The pixel electrode 211 may be disposed on the second insulating layer 116. The pixel electrode 211 may be electrically connected to the connection electrode CML via the contact hole of the second insulating layer 116.

The pixel-defining layer 220 with the opening 2200P exposing a center portion of the pixel electrode 211 may be disposed on the pixel electrode 211. The opening 2200P of the pixel-defining layer 220 may define an emission area of light emitted from the OLED (hereinafter, referred to as an emission area).

The spacer 230 may be disposed on the pixel-defining layer 220. The spacer 230 may be used to prevent damage to the substrate 100 and/or a multilayer film on the substrate 100 in a method of manufacturing a display apparatus.

The intermediate layer 212 may be disposed on the pixel-defining layer 220. The intermediate layer 212 may include the emission layer 212*b* arranged in correspondence with the opening 2200P of the pixel-defining layer 220.

The intermediate layer 212 may include at least one selected from the first functional layer 212*a* between the pixel electrode 211 and the emission layer 212*b*, and the second functional layer 212*c* between the emission layer 212*b* and the opposite electrode 213. In an embodiment, the first functional layer 212*a* and the second functional layer 212*c* may be disposed under and over the emission layer 212*b*, respectively.

The opposite electrode 213 may be disposed on the intermediate layer 212. In some embodiments, the capping layer CPL for improving a light extraction rate of light emitted from the display element DPE may be further disposed on the opposite electrode 213.

The encapsulation layer 300 may be disposed on the opposite electrode 213. In addition, when the capping layer CPL is arranged, the encapsulation layer 300 may be disposed on the capping layer CPL. In an embodiment, the encapsulation layer 300 may include at least one inorganic encapsulation layer and at least one organic encapsulation layer. In an embodiment, the encapsulation layer 300 may include the first inorganic encapsulation layer 310, the organic encapsulation layer 320, and the second inorganic encapsulation layer 330, which are sequentially stacked one on another.

Referring to FIG. 31, the first insulating layer 115 may be disposed on the inorganic insulating layer K. In an embodiment, the first insulating layer 115 may be disposed between the substrate 100 and the second insulating layer 116. The first insulating layer 115 may be arranged to overlap the second area A2 and the first opening 1150P may be defined through the first insulating layer 115 to expose the inorganic insulating layer IIL, e.g., an upper surface of the upper interlayer insulating layer 118. The first insulating layer 115 is separated with respect to the first opening 1150P to block a penetration path of oxygen and/or moisture through the first insulating layer 115.

The second insulating layer 116 may be disposed on the first insulating layer 115. The second opening 1160P may be defined through the second insulating layer 116 to overlap the second area A2 and to expose a portion of an upper surface of the first insulating layer 115. In an embodiment, the second opening 1160P may be arranged to overlap the first opening 1150P. In addition, in an embodiment, a width of the second opening 1160P may be greater than a width of the first opening 1150P. Accordingly, the second opening 1160P may expose an upper surface of a portion of the first insulating layer 115 defining a boundary of the first opening 1150P, and the first opening 1150P and the second opening 1160P may be continuously arranged to form one opening exposing the inorganic insulating layer IIL, e.g., the upper surface of the upper interlayer insulating layer 118. In such an embodiment, the first opening 1150P and the second opening 1160P may form the first groove GV1.

In an embodiment, the heating electrode 500 may be arranged to overlap the first groove GV1. In an embodiment, the heating electrode 500 may overlap the first opening 1150P and the second opening 1160P. Like the first groove GV1, the heating electrode 500 may be arranged along the perimeter of the extended corner area CCA to surround the first area A1. The heating electrode 500 may be disposed under the upper interlayer insulating layer 118 to be covered by the inorganic insulating layer IIL, e.g., the upper interlayer insulating layer 118. In an embodiment, the heating electrode 500 may be disposed between the middle insulating layer 117 and the upper interlayer insulating layer 118.

In an embodiment, the heating electrode 500 may be connected to a heating line, and may generate heat when a current flows by a voltage applied through the heating line. The heating electrode 500 may volatilize or decompose organic layers by generating the heat.

In an embodiment, the heating electrode 500 may include a material identical to that of the second gate electrode GE2. In an embodiment, for example, the heating electrode 500 may include at least one selected from Mo, Al, Cu, and Ti, for example, Mo, and may be formed as a single layer or multilayer, each layer including at least one selected from the above-described materials. In an embodiment, the heating electrode 500 and the second gate electrode GE2 may be formed by a same process. In such an embodiment, the second gate electrode GE2 and the heating electrode 500 may be patterned and formed on the middle insulating layer 117, and the upper interlayer insulating layer 118 may be arranged to cover the second gate electrode GE2 and the heating electrode 500.

In an embodiment, a heat transfer rate to an upper portion of the heating electrode 500 and a heat transfer rate to a lower portion of the heating electrode 500 may be different from each other. Specifically, a heat transfer rate of the middle insulating layer 117 disposed under the heating electrode 500 may be smaller than a heat transfer rate of the upper interlayer insulating layer 118 disposed over the heating electrode 500. Accordingly, heat generated from the heating electrode 500 is not directed to the lower portion of the heating electrode 500, but may be more efficiently transferred toward the upper portion thereof, and may efficiently remove organic layers disposed over the heating electrode 500.

As described above, the first functional layer 212*a* and the second functional layer 212*c* may be disconnected or separated from the first groove GV1 of the second area A2. In an embodiment, for example, the first functional layer 212*a* and the second functional layer 212*c* may not be disposed on the upper surface of the upper interlayer insulating layer 118 exposed by the first opening 1150P. In such an embodiment, the first functional layer 212*a* and the second functional layer 212*c* are continuously arranged from the first area A1, and thus, may be disposed on the pixel-defining layer 220, over the second insulating layer 116, on an inner surface of the second insulating layer 116 defining the second opening 1160P, on an upper portion of the first insulating layer 115 exposed by the second opening 1160P, and on an inner surface of the first insulating layer 115 defining the first opening 1150P. This may be realized by removing the first functional layer 212*a* and the second functional layer 212*c* from the first groove GV1 by Joule heating of the heating electrode 500. Therefore, the first functional layer 212*a* and the second functional layer 212*c* may be disconnected from the first groove GV1, e.g., the upper surface of the upper interlayer insulating layer 118.

The low-adhesion layer WAL may be disposed on the upper surface of the first insulating layer 115 exposed by the second opening 1160P and on the inner surface of the first insulating layer 115 defining the first opening 1150P in the first groove GV1. In an embodiment, the low-adhesion layer WAL may not be disposed on the upper surface of the upper interlayer insulating layer 118 exposed by the first opening 1150P. This may be realized by removing the low-adhesion layer WAL including an organic material from the first groove GV1 by Joule heating of the heating electrode 500.

Similar to the first functional layer 212*a* and the second functional layer 212*c*, the opposite electrode 213 may also be disconnected or separated from the first groove GV1 of the second area A2. In an embodiment, for example, the opposite electrode 213 may not be disposed on an upper portion of the upper interlayer insulating layer 118 exposed by the first opening 1150P. In addition, the opposite electrode 213 may not be disposed on the low-adhesion layer WAL disposed on the upper surface of the first insulating layer 115 exposed by the second opening 1160P and on the inner surface of the first insulating layer 115 defining the first opening 1150P in the first groove GV1. In such an embodiment, the opposite electrode 213 may be continuously arranged from the first area A1, and thus, may be disposed on the pixel-defining layer 220, over the second insulating layer 116, and on the inner surface of the second insulating layer 116 defining the second opening 1160P.

The capping layer CPL may be disposed on the opposite electrode 213. Similar to the first functional layer 212*a* and the second functional layer 212*c*, the capping layer CPL may be disconnected or separated from the first groove GV1 of the second area A2. In an embodiment, for example, the capping layer CPL may not be disposed on the upper portion of the upper interlayer insulating layer 118 exposed by the first opening 1150P. In such an embodiment, similar to the first functional layer 212*a* and the second functional layer 212*c*, the capping layer CPL is continuously arranged from the first area A1, and thus, may be disposed on the pixel-defining layer 220, over the second insulating layer 116, on the inner surface of the second insulating layer 116 defining the second opening 1160P, on the upper portion of the first insulating layer 115 exposed by the second opening 1160P, and on the inner surface of the first insulating layer 115 defining the first opening 1150P. This may be realized by removing the capping layer CPL from the first groove GV1 by Joule heating of the heating electrode 500.

The first functional layer 212*a* and the second functional layer 212*c* may include an organic material, and through at least one selected from the first functional layer 212*a* and the second functional layer 212*c*, external oxygen or moisture may be introduced to the first area A1 through the second area A2. The oxygen or moisture may damage the display element. According to an embodiment, the first functional layer 212*a* and the second functional layer 212*c* may be completely removed from the first groove GV1, e.g., an upper portion of the upper interlayer insulating layer 118, thereby preventing introduction of external oxygen or moisture and improving reliability of the display panel 10.

The encapsulation layer 300 may be disposed on the capping layer CPL. The encapsulation layer 300 may include at least one inorganic encapsulation layer and at least one organic encapsulation layer. In an embodiment, the encapsulation layer 300 may include the first inorganic encapsulation layer 310, the organic encapsulation layer 320, and the second inorganic encapsulation layer 330, which are sequentially stacked.

At least one inorganic encapsulation layer of the encapsulation layer 300, for example, the first inorganic encapsulation layer 310, may be in direct contact with the upper interlayer insulating layer 118 in the first groove GV1. In detail, the first inorganic encapsulation layer 310 may be continuously arranged from the first area A1, and may cover an entire surface of the second area A2, for example, the pixel-defining layer 220, an upper portion of the second insulating layer 116, the inner surface of the second insulating layer 116 defining the second opening 1160P, the upper portion of the first insulating layer 115 exposed by the second opening 1160P, the inner surface of the first insulating layer 115 defining the first opening 1150P, and the upper portion of the upper interlayer insulating layer 118 exposed by the first opening 1150P. Accordingly, an inorganic contact area, in which an inorganic layer and an inorganic layer are in contact with each other to form a seal, may be formed over the first groove GV1, e.g., the upper interlayer insulating layer 118.

The first inorganic encapsulation layer 310 may continuously extend from a boundary between the separation area VA and the second area A2 to cover side surfaces of the first insulating layer 115 and the second insulating layer 116 and a side surface of the substrate 100.

The organic encapsulation layer 320 may be disposed over the first inorganic encapsulation layer 310. The organic encapsulation layer 320 may be arranged to cover the first area A1 and fill the first groove GV1 of the second area A2. In an embodiment, the organic encapsulation layer 320 may be continuously arranged from the first area A1 to the first dam unit DP1. The organic encapsulation layer 320 may not be arranged beyond an upper portion of the pixel-defining layer 220 of the first dam unit DP1, by the first dam unit DP1. In such an embodiment, the organic encapsulation layer 320 may be arranged from the first area A1 to the first dam unit DP1, and may not be arranged at the boundary between the separation area VA and the second area A2.

The second inorganic encapsulation layer 330 may be disposed on the organic encapsulation layer 320. Like the first inorganic encapsulation layer 310, the second inorganic encapsulation layer 330 may continuously extend from the boundary between the separation area VA and the second area A2 to cover the side surfaces of the first insulating layer 115 and the second insulating layer 116 and the side surface of the substrate 100. Therefore, the first inorganic encapsulation layer 310 and the second inorganic encapsulation layer 330 may prevent moisture from flowing in a lateral direction of the display panel 10, for example, through side surfaces of the first functional layer 212*a*, the second functional layer 212*c*, the first insulating layer 115, and the second insulating layer 116.

Although not shown in the drawings, in an embodiment, a second groove (not shown) similar to the first groove GV1 and a second dam unit (not shown) similar to the first dam unit DP1 may be optionally further arranged sequentially on one side of the first dam unit DP1, for example, on a side thereof facing the separation area VA. In such an embodiment, the heating electrode 500 may be disposed on the second groove as described above, and the first functional layer 212*a* and the second functional layer 212*c* may be disconnected or separated from the second groove.

Figure 32:
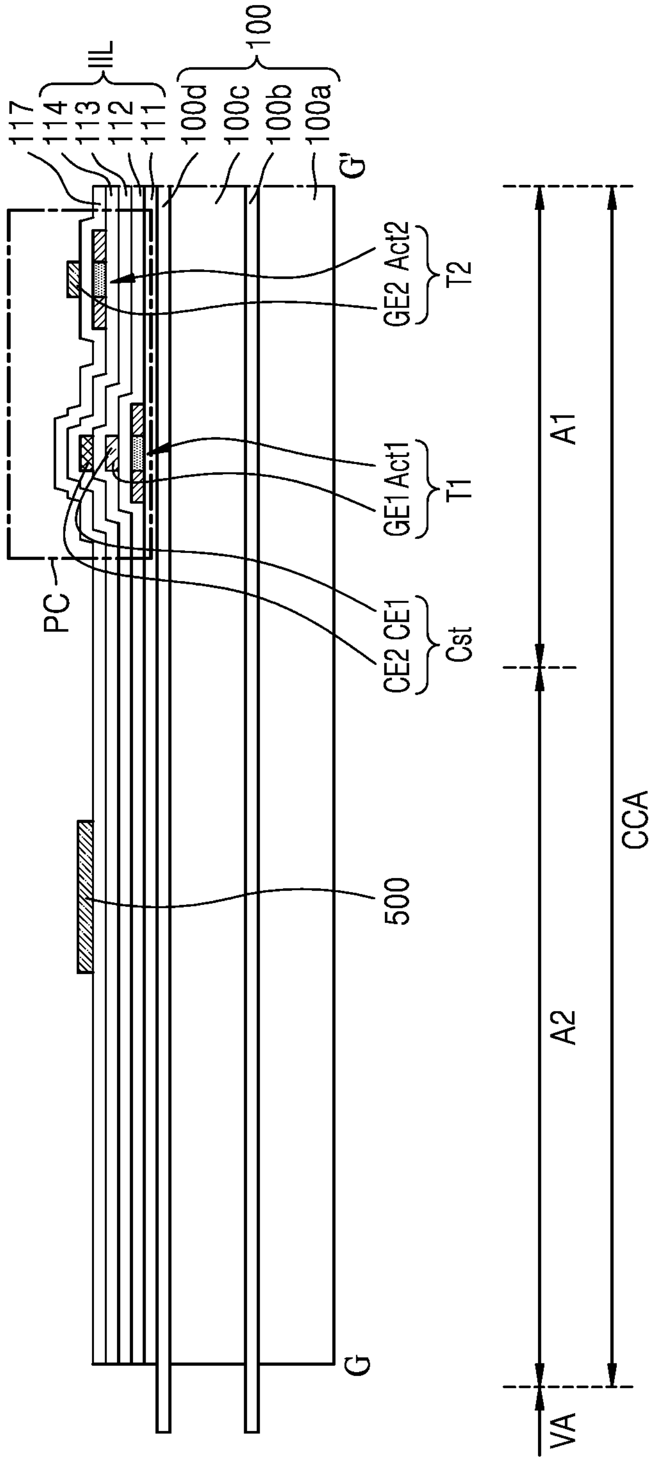
FIGS. 32 and 33 are schematic views showing a method of manufacturing a display panel, according to an alternative embodiment.
Figure 33:
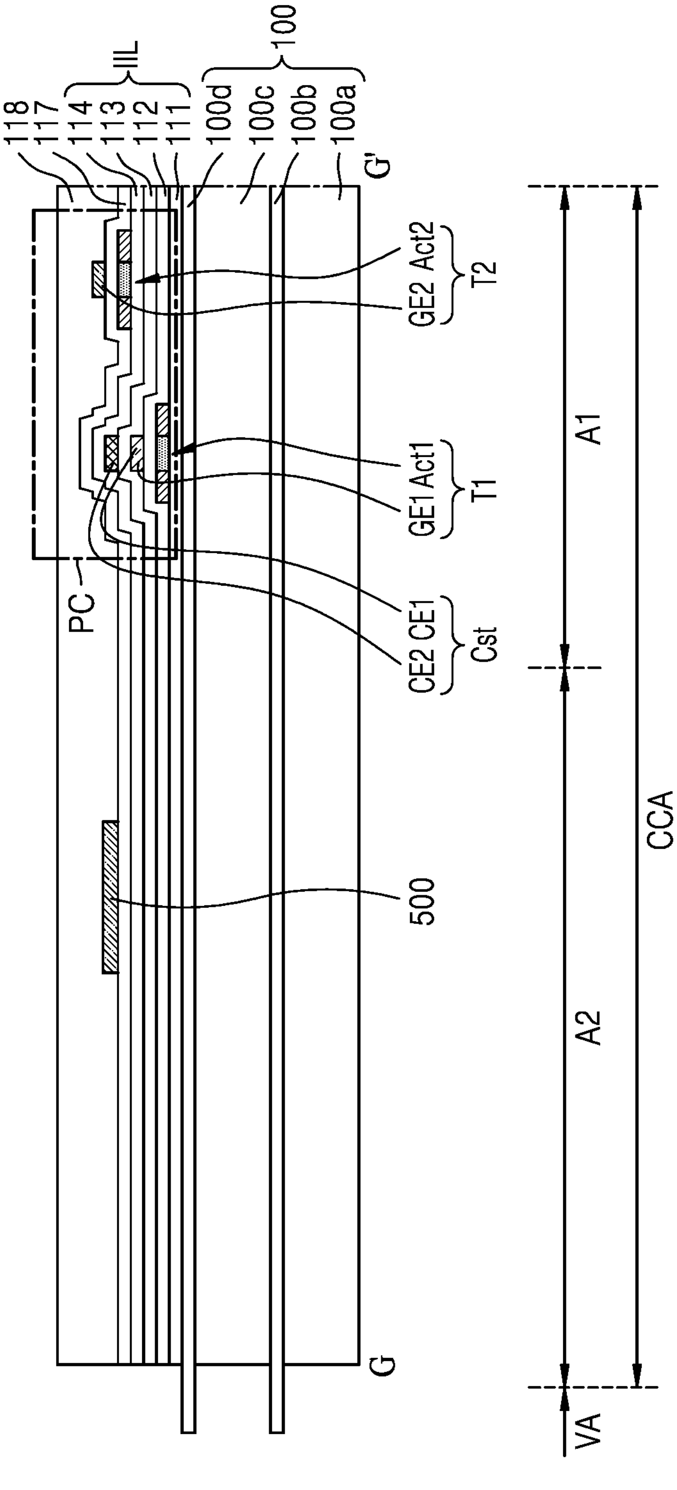

FIGS. 32 and 33 are schematic views showing a method of manufacturing a display panel, according to another embodiment. The method of manufacturing the display panel according to an embodiment shown in FIGS. 32 and 33 may be used for manufacturing an embodiment of the display panel described above, but the disclosure is not limited thereto. In addition, the method of manufacturing the display panel according to an embodiment shown in FIGS. 32 and 33 is similar to the method of manufacturing the display panel described with reference to FIGS. 10 to 19, and thus, only differences are mainly described hereinafter.

Referring to FIG. 33, the second gate electrode GE2 and the heating electrode 500 may be provided on the middle insulating layer 117. In such an embodiment, as described above, the heating electrode 500 may include a material identical to the second gate electrode GE2. In an embodiment, for example, the heating electrode 500 may include at least one selected from Mo, Al, Cu, and Ti, for example, Mo, and may be formed as a single layer or multilayer, each layer including at least one selected from the above-described materials.

In addition, in an embodiment, the heating electrode 500 and the second gate electrode GE2 may be patterned on the same layer in a same process. The heating electrode 500 may be patterned in the second area A2 to surround the first area A1 in which the pixel circuit PC is arranged. In other words, the heating electrode 500 may be patterned along a perimeter of the extended corner area CCA. Accordingly, the heating electrode 500 may be formed to be apart from the second gate electrode GE2 in one direction.

Referring to FIG. 33, the upper interlayer insulating layer 118 may be provided to cover the second gate electrode GE2 and the heating electrode 500. In an embodiment, a thermal conductivity of the upper interlayer insulating layer 118 may be greater than a thermal conductivity of the middle insulating layer 117. Accordingly, when the heating electrode 500 generates heat, the generated heat may be more conducted upward through the upper interlayer insulating layer 118 having the greater thermal conductivity.

Next, the first insulating layer 115, the second insulating layer 116, and the pixel-defining layer 220 may be disposed on the upper interlayer insulating layer 118. In detail, the first insulating layer 115 may be provided to cover the upper interlayer insulating layer 118, the second insulating layer 116 may be disposed on the first insulating layer 115, and the pixel-defining layer 220 may be disposed on the second insulating layer 116.

Next, similar to FIGS. 13 to 19, layers from the intermediate layer 212 to the encapsulation layer 300 may be provided. The process for providing such layers is similar to that described above with reference to FIGS. 13 to 19, and thus, any repetitive detailed descriptions thereof will be omitted hereinafter.

Figure 34:
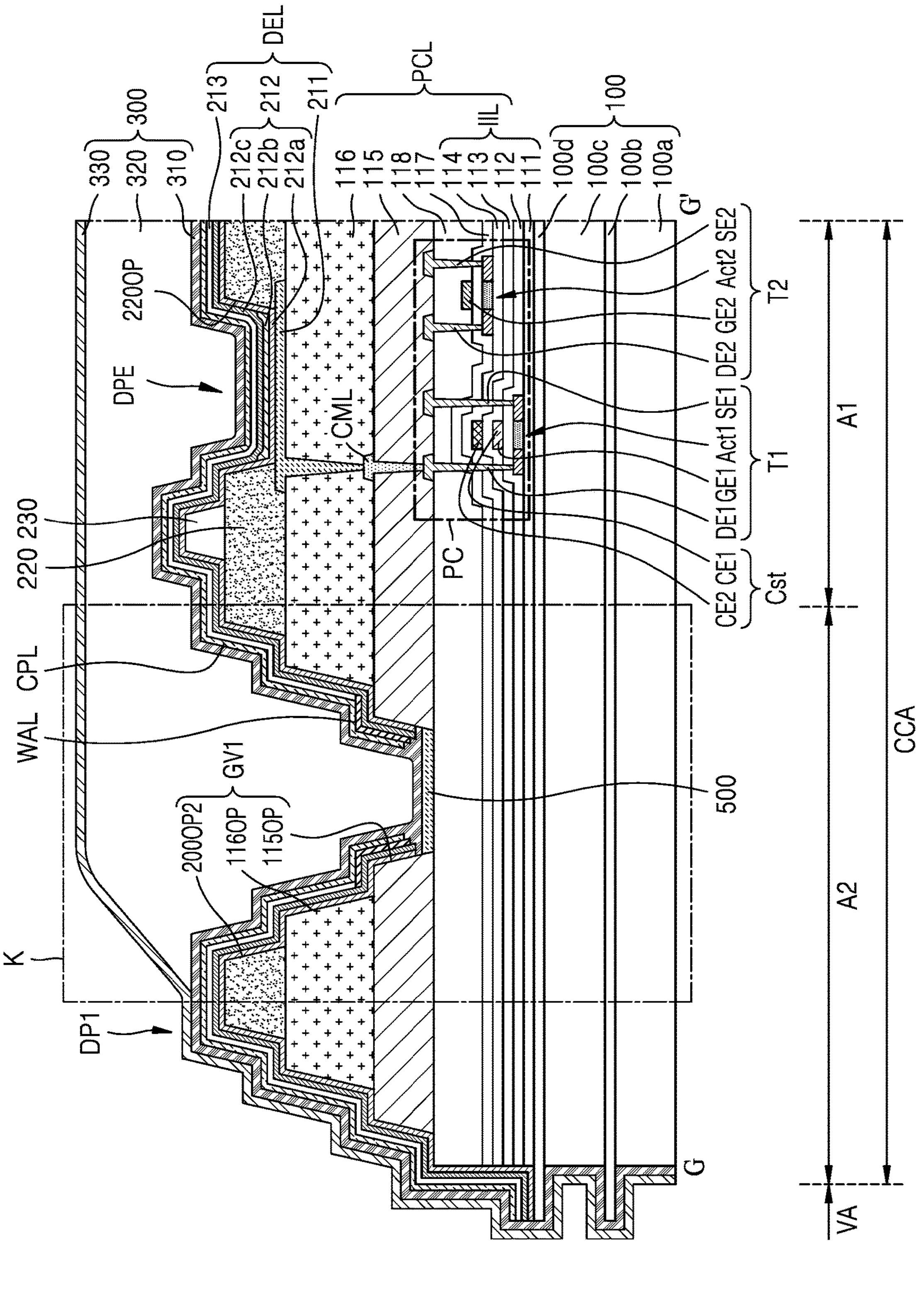
FIG. 34 is a schematic cross-sectional view of the display panel according to an alternative embodiment taken long line G-G' of FIG. 7.
Figure 35:
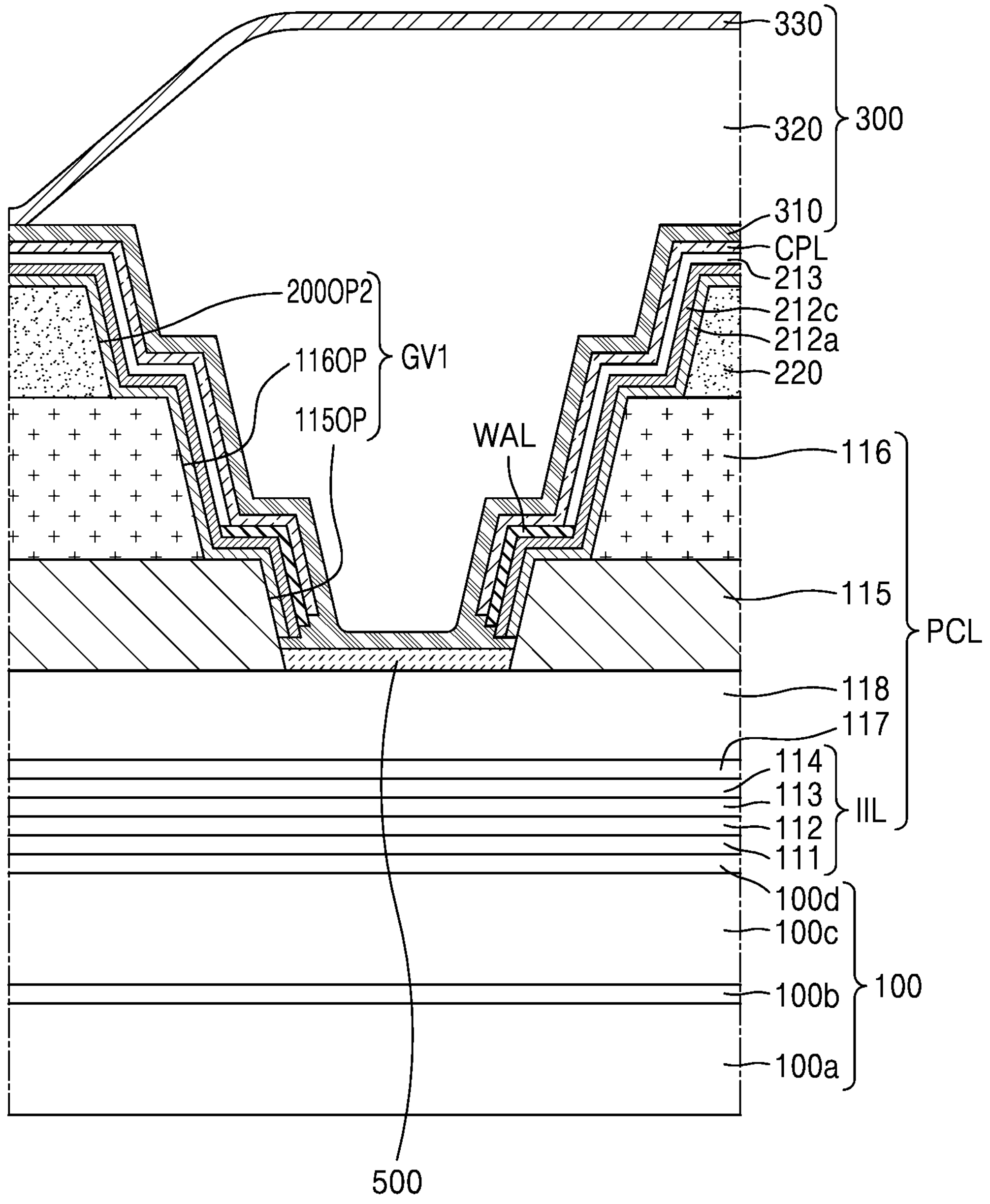
FIG. 35 is an enlarged view of portion K of FIG. 34.

FIG. 34 is a schematic cross-sectional view of the display panel according to an alternative embodiment taken long line G-G' of FIG. 7. FIG. 35 is an enlarged view of portion K of FIG. 34. In an embodiment of FIGS. 34 and 35, the display panel is similar to an embodiment of the display panel described above, and thus, only differences are mainly described hereinafter.

Referring to FIGS. 34 and 35, in an embodiment, the heating electrode 500 may be arranged to overlap the first groove GV1 in a plan view. In an embodiment, the heating electrode 500 may overlap the first opening 1150P and the second opening 1160P. Like the first groove GV1, the heating electrode 500 may be arranged along a perimeter of the extended corner area CCA to surround the first area A1. The heating electrode 500 may be disposed over the inorganic insulating layer IIL, e.g., the upper interlayer insulating layer 118. In such an embodiment, the heating electrode 500 may be disposed on an upper portion of the upper interlayer insulating layer 118 exposed by the first opening 1150P.

In an embodiment, the heating electrode 500 may be connected to a heating line, and may generate heat when a current flows by a voltage applied through the heating line. The heating electrode 500 may volatilize or decompose organic layers by generating the heat.

In an embodiment, the heating electrode 500 may include a material identical to that of the pixel electrode 211. In an embodiment, for example, the heating electrode 500 may include a conductive oxide, such as ITO, IZO, ZnO, $In_2O_3$, IGO, or AZO. In another embodiment, the heating electrode 500 may include a reflective film including Ag, Mg, Al, Pt, Pd, Au, Ni, Nd, Ir, Cr, or a compound thereof. In an alternative embodiment, the heating electrode 500 may further include a film including ITO, IZO, ZnO, or $In_2O_3$ over/under the above-described reflective film. In an embodiment, the heating electrode 500 and the pixel electrode 211 may be formed by a same process. In such an embodiment, when the pixel electrode 211 is patterned, the heating electrode 500 may be formed to be patterned on the upper interlayer insulating layer 118 exposed by the first opening 1150P.

In an embodiment, where the heating electrode 500 is arranged to be accommodated in the first opening 1150P, the width of the heating electrode 500 in the first groove GV1 may be substantially the same as the width of the first opening 1150P. However, the disclosure is not limited thereto, and in an alternative embodiment, the width of the heating electrode 500 may be greater than the width of the first opening 1150P. In an embodiment, it will be understood that the heating electrode 500 may be arranged to extend to an inner surface of the first insulating layer 115 defining the first opening 1150P. Hereinafter, for convenience of description, as shown in FIG. 34, an embodiment where the heating electrode 500 is not disposed on the inner surface of the first insulating layer 115 will be described.

In an embodiment, the width of the heating electrode 500 may be smaller than the width of the second opening 1160P in the first groove GV1. In such an embodiment, the width of the heating electrode 500 may have a value between the width of the first opening 1150P and the width of the second opening 1160P.

The first functional layer 212*a* and the second functional layer 212*c* may be disconnected or separated from the first groove GV1 of the second area A2. In an embodiment, for example, the first functional layer 212*a* and the second functional layer 212*c* may not be disposed on the upper portion of the upper interlayer insulating layer 118 exposed by the first opening 1150P. In such an embodiment, the first functional layer 212*a* and the second functional layer 212*c* are continuously arranged from the first area A1, and thus, may be disposed on the pixel-defining layer 220, over the second insulating layer 116, on an inner surface of the second insulating layer 116 defining the second opening 1160P, on an upper portion of the first insulating layer 115 exposed by the second opening 1160P, and on an inner surface of the first insulating layer 115 defining the first opening 1150P. This may be realized by removing the first functional layer 212*a* and the second functional layer 212*c* from the first groove GV1 by Joule heating of the heating electrode 500. Therefore, the first functional layer 212*a* and the second functional layer 212*c* may be disconnected from the first groove GV1, e.g., an upper portion of the upper interlayer insulating layer 118.

The low-adhesion layer WAL may be disposed on an upper surface of the first insulating layer 115 exposed by the second opening 1160P and on the inner surface of the first insulating layer 115 defining the first opening 1150P in the first groove GV1. In an embodiment, the low-adhesion layer WAL may not be disposed on the upper portion of the upper interlayer insulating layer 118 exposed by the first opening 1150P. This may be realized by removing the low-adhesion layer WAL including an organic material from the first groove GV1 by Joule heating of the heating electrode 500.

Similar to the first functional layer 212*a* and the second functional layer 212*c*, the opposite electrode 213 may also be disconnected or separated from the first groove GV1 of the second area A2. In an embodiment, for example, the opposite electrode 213 may not be disposed on the upper portion of the upper interlayer insulating layer 118 exposed by the first opening 1150P. In addition, the opposite electrode 213 may not be disposed on the low-adhesion layer WAL disposed on the upper surface of the first insulating layer 115 exposed by the second opening 1160P and on the inner surface of the first insulating layer 115 defining the first opening 1150P in the first groove GV1. In such an embodiment, the opposite electrode 213 may be continuously arranged from the first area A1, and thus, may be disposed on the pixel-defining layer 220, over the second insulating layer 116, and on the inner surface of the second insulating layer 116 defining the second opening 1160P.

The capping layer CPL may be disposed on the opposite electrode 213. Similar to the first functional layer 212*a* and the second functional layer 212*c*, the capping layer CPL may be disconnected or separated from the first groove GV1 of the second area A2. In an embodiment, for example, the capping layer CPL may not be disposed on the upper portion of the upper interlayer insulating layer 118 exposed by the first opening 1150P. In such an embodiment, similar to the first functional layer 212*a* and the second functional layer 212*c*, the capping layer CPL is continuously arranged from the first area A1, and thus, may be disposed on the pixel-defining layer 220, over the second insulating layer 116, on the inner surface of the second insulating layer 116 defining the second opening 1160P, on the upper portion of the first insulating layer 115 exposed by the second opening 1160P, and on the inner surface of the first insulating layer 115 defining the first opening 1150P. This may be realized by removing the capping layer CPL from the first groove GV1 by Joule heating of the heating electrode 500.

The encapsulation layer 300 may be disposed on the capping layer CPL. At least one inorganic encapsulation layer of the encapsulation layer 300, for example, the first inorganic encapsulation layer 310, may be in direct contact with the heating electrode 500 in the first groove GV1. In detail, the first inorganic encapsulation layer 310 may be continuously arranged from the first area A1, and may cover the entire surface of the second area A2, for example, the pixel-defining layer 220, the upper portion of the second insulating layer 116, the inner surface of the second insulating layer 116 defining the second opening 1160P, the upper portion of the first insulating layer 115 exposed by the second opening 1160P, the inner surface of the first insulating layer 115 defining the first opening 1150P, and the upper portion of the heating electrode 500 disposed on the interlayer insulating layer 114 exposed by the first opening 1150P.

The first inorganic encapsulation layer 310 may continuously extend from the boundary between the separation area VA and the second area A2 to cover side surfaces of the first insulating layer 115 and the second insulating layer 116 and a side surface of the substrate 100.

The organic encapsulation layer 320 may be disposed over the first inorganic encapsulation layer 310. The organic encapsulation layer 320 may be arranged to cover the first area A1 and fill the first groove GV1 of the second area A2. In an embodiment, the organic encapsulation layer 320 may be continuously arranged from the first area A1 to the first dam unit DP1. The organic encapsulation layer 320 may not be arranged beyond an upper portion of the pixel-defining layer 220 of the first dam unit DP1, by the first dam unit DP1. In other words, the organic encapsulation layer 320 may be arranged from the first area A1 to the first dam unit DP1, and may not be arranged at the boundary between the separation area VA and the second area A2.

The second inorganic encapsulation layer 330 may be disposed on the organic encapsulation layer 320. Like the first inorganic encapsulation layer 310, the second inorganic encapsulation layer 330 may continuously extend from the boundary between the separation area VA and the second area A2 to cover the side surfaces of the first insulating layer 115 and the second insulating layer 116 and the side surface of the substrate 100.

Figure 36:
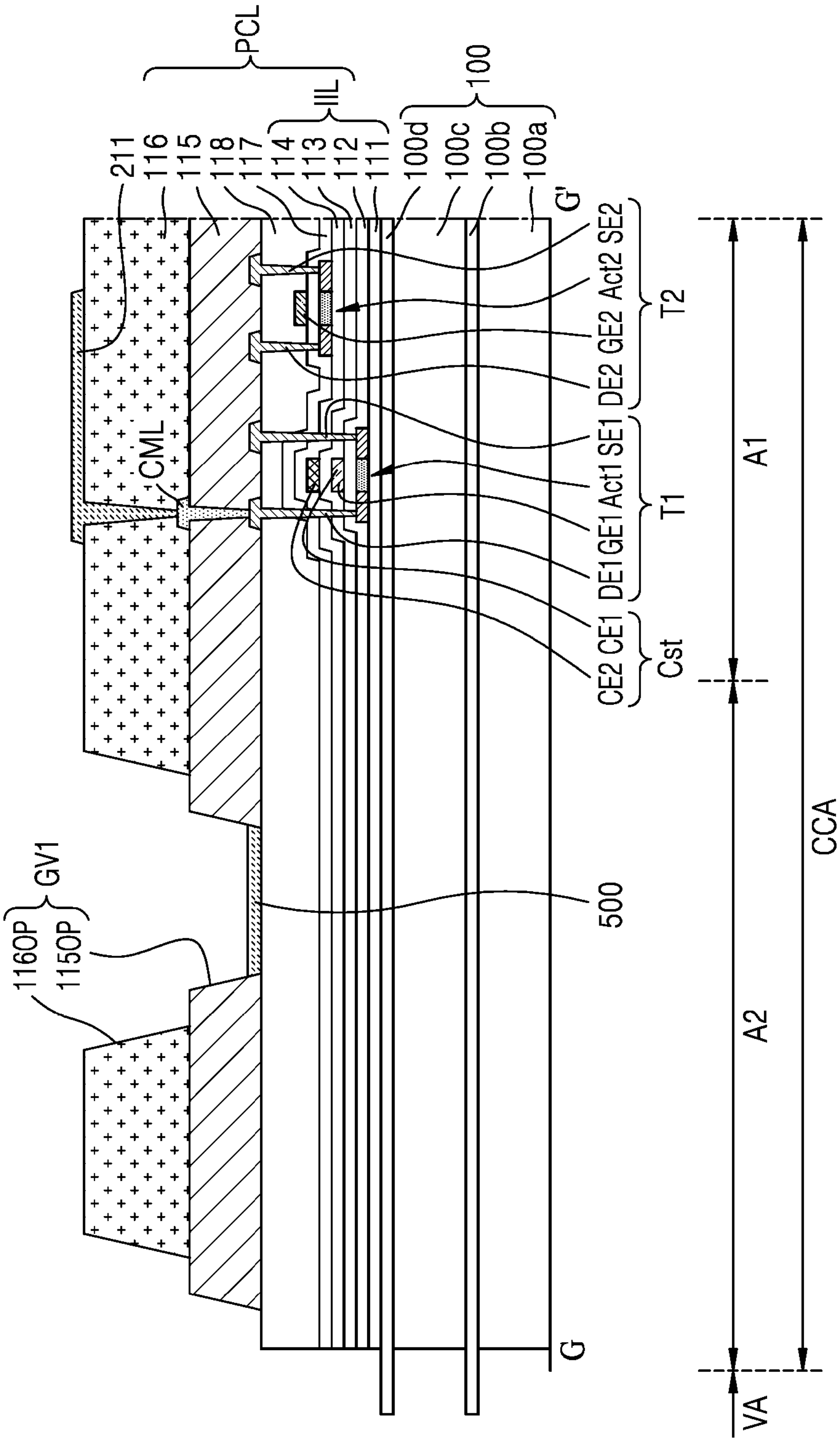
FIG. 36 is a schematic view showing a method of manufacturing a display panel, according to an alternative embodiment.

FIG. 36 is a schematic view showing a method of manufacturing a display panel, according to an alternative embodiment. The method of manufacturing the display panel according to an embodiment shown in FIG. 36 may be used for manufacturing an embodiment of the display panel shown in FIGS. 34 and 35, but the disclosure is not limited thereto. In addition, the method of manufacturing the display panel according to an embodiment shown in FIG. 36 is similar to an embodiment of the method of manufacturing the display panel described above with reference to FIGS. 10 to 19, 32, and 33, and thus, only differences are mainly described hereinafter.

Referring to FIG. 36, the first insulating layer 115 and the second insulating layer 116 may be provided on the inorganic insulating layer IIL, for example, the upper interlayer insulating layer 118. In detail, the first insulating layer 115 may be provided to cover the upper interlayer insulating layer 118, and the second insulating layer 116 may be disposed on the first insulating layer 115.

In such an embodiment, the first opening 1150P and the second opening 1160P may be formed through the first insulating layer 115 and the second insulating layer 116, respectively, to form the first groove GV1 in the second area A2. Accordingly, the first opening 1150P, the second opening 1160P, and the first groove GV1 including the first opening 1150P and the second opening 1160P may be formed to surround the first area A1. In addition, a contact hole is formed through the second insulating layer 116 to expose at least a portion of the connection electrode CML in the first area A1.

Next, the pixel electrode 211 and the heating electrode 500 may be provided. In such an embodiment, the heating electrode 500 may include a material identical to that of the pixel electrode 211 as described above. In an embodiment, for example, the heating electrode 500 may include a conductive oxide, such as ITO, IZO, ZnO, $In_2O_3$, IGO, or AZO. In an alternative embodiment, the heating electrode 500 may include a reflective film including Ag, Mg, Al, Pt, Pd, Au, Ni, Nd, Ir, Cr, or a compound thereof. In an alternative embodiment, the heating electrode 500 may further include a film including ITO, IZO, ZnO, or $In_2O_3$ over/under the above-described reflective film.

In an embodiment, the heating electrode 500 and the pixel electrode 211 may be patterned in a same process. The heating electrode 500 may be patterned to be accommodated in the second area A2, for example, the first opening 1150P of the first groove GV1, to surround the first area A1 in which the pixel circuit PC is arranged. The heating electrode 500 may be in contact with the upper interlayer insulating layer 118.

The pixel electrode 211 may be patterned on the second insulating layer 116. The pixel electrode 211 may be electrically connected to the contact hole formed in the second insulating layer 116 to expose at least a portion of the connection electrode CML in the first area A1.

Next, similar to FIGS. 23 to 29, layers from the intermediate layer 212 to the encapsulation layer 300 may be formed. Such a process is similar to that described above with reference to FIGS. 23 to 29, and thus, any repetitive detailed descriptions thereof are omitted hereinafter.

According to embodiments, a display panel having improved reliability by minimizing penetration of oxygen or moisture from the outside, and a method of manufacturing a display panel may be realized.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display panel comprising:
- a substrate comprising a corner area comprising a central area and an extended corner area extending in a direction away from the central area;
- an inorganic insulating layer disposed on the substrate;
- an insulating layer disposed on the inorganic insulating layer, wherein a first groove exposing a portion of the inorganic insulating layer is defined in the insulating layer along a perimeter of the extended corner area;
- an intermediate layer disposed over the insulating layer;
- an encapsulation layer disposed on the intermediate layer and comprising an inorganic encapsulation layer; and
- a heating electrode overlapping the first groove and arranged along the perimeter of the extended corner area in a plan view.

2. The display panel of claim 1, wherein
- the inorganic insulating layer comprises an interlayer insulating layer covering the heating electrode, and
- an upper surface of the interlayer insulating layer is exposed by the first groove and is in direct contact with the inorganic encapsulation layer.

3. The display panel of claim 1, wherein
- the insulating layer comprises a first insulating layer and a second insulating layer disposed over the first insulating layer,
- the first groove is defined by a first opening defined in the first insulating layer and exposing the portion of the inorganic insulating layer; and a second opening defined in the second insulating layer and exposing a portion of the first insulating layer, and
- a width of the first opening is smaller than a width of the second opening.

4. The display panel of claim 3, wherein a width of the heating electrode is greater than or equal to the width of the first opening and smaller than the width of the second opening.

5. The display panel of claim 3, wherein the intermediate layer is arranged to be in direct contact with an upper portion of the first insulating layer exposed by the second opening in the first groove.

6. The display panel of claim 3, wherein the intermediate layer, a low- adhesion layer, a capping layer, and the encapsulation layer are sequentially disposed to be in contact with each other on an upper portion of the first insulating layer exposed by the second opening in the first groove.

7. The display panel of claim 2, further comprising:
- an upper electrode of a storage capacitor, wherein the upper electrode is covered by the interlayer insulating layer,
- wherein the upper electrode and the heating electrode are disposed in a same layer as each other.

8. The display panel of claim 7, wherein the upper electrode and the heating electrode comprise a same material as each other.

9. The display panel of claim 2, wherein
the inorganic insulating layer further comprises an upper gate insulating layer on which the heating electrode is disposed, and
a thermal conductivity of the interlayer insulating layer is greater than a thermal conductivity of the upper gate insulating layer.

10. The display panel of claim 1, wherein the heating electrode is disposed on the portion of the inorganic insulating layer exposed by the first groove.

11. The display panel of claim 10, wherein the heating electrode is in direct contact with the inorganic encapsulation layer in the first groove.

12. The display panel of claim 10, further comprising:
a pixel electrode arranged between the intermediate layer and the insulating layer,
wherein the heating electrode comprises a same material as the pixel electrode.

13. The display panel of claim 1, further comprising:
a first semiconductor layer disposed on the substrate;
a second semiconductor layer disposed above the first semiconductor layer; and
a gate electrode arranged to overlap the second semiconductor layer,
wherein the inorganic insulating layer comprises an upper interlayer insulating layer covering the gate electrode and the heating electrode.

14. The display panel of claim 13, wherein an upper surface of the upper interlayer insulating layer is exposed by the first groove and is in direct contact with the inorganic encapsulation layer.

15. The display panel of claim 13, wherein the first semiconductor layer comprises a silicon semiconductor, and the second semiconductor layer comprises an oxide semiconductor.

16. The display panel of claim 13, wherein the gate electrode and the heating electrode are disposed in a same layer as each other.

17. The display panel of claim 16, wherein the gate electrode and the heating electrode comprise a same material as each other.

18. The display panel of claim 13, wherein
the inorganic insulating layer further comprises a middle insulating layer on which the heating electrode is disposed, and
thermal conductivity of the upper interlayer insulating layer is greater than a thermal conductivity of the middle insulating layer.

* * * * *